(12) United States Patent  
Deliwala

(10) Patent No.: US 6,690,863 B2  
(45) Date of Patent: Feb. 10, 2004

(54) WAVEGUIDE COUPLER AND METHOD FOR MAKING SAME

(75) Inventor: Shrenik Deliwala, Orefield, PA (US)

(73) Assignee: Si Optical, Inc., Allentown, PA (US)

( * ) Notice: Subject to any disclaimer, the term of this patent is extended or adjusted under 35 U.S.C. 154(b) by 28 days.

(21) Appl. No.: 10/146,346

(22) Filed: May 15, 2002

(65) Prior Publication Data

US 2003/0003734 A1 Jan. 2, 2003

Related U.S. Application Data

(63) Continuation-in-part of application No. 09/991,542, filed on Nov. 10, 2001, which is a continuation-in-part of application No. 09/859,693, filed on May 17, 2001.

(51) Int. Cl.[7] .............................. G02B 6/26; G02B 6/10
(52) U.S. Cl. ........................................ 385/50; 385/129
(58) Field of Search ................................ 385/50, 15, 9, 385/10, 31, 32, 36, 39, 129, 147

(56) References Cited

U.S. PATENT DOCUMENTS

| | | | |
|---|---|---|---|
| 5,285,131 A | * | 2/1994 | Muller et al. ................ 313/578 |
| 5,459,799 A | | 10/1995 | Weber |
| 5,514,885 A | | 5/1996 | Myrick |
| 5,650,346 A | * | 7/1997 | Pan et al. .................... 438/201 |
| 5,757,755 A | * | 5/1998 | Nagano .................... 369/44.12 |
| 5,878,175 A | | 3/1999 | Sonoda et al. |
| 5,895,945 A | * | 4/1999 | Pan et al. .................... 257/300 |
| 6,016,374 A | | 1/2000 | Adams et al. |
| 6,208,773 B1 | | 3/2001 | Wickham et al. |
| 6,221,565 B1 | | 4/2001 | Jain et al. |
| 6,238,979 B1 | * | 5/2001 | Bergemont .................. 438/264 |
| 6,242,324 B1 | | 6/2001 | Kub et al. |
| 6,246,100 B1 | * | 6/2001 | Strnad ......................... 257/467 |
| 6,268,953 B1 | | 7/2001 | Maloney |
| 6,316,281 B1 | | 11/2001 | Lee et al. |
| 6,367,251 B1 | * | 4/2002 | Wood ............................ 60/528 |
| 6,399,872 B2 | * | 6/2002 | Strnad ......................... 136/201 |
| 6,507,516 B1 | * | 1/2003 | Bergemont ............ 365/185.18 |

* cited by examiner

Primary Examiner—Akm Enayet Ullah

(57) ABSTRACT

An optical device includes a semiconductor layer and a polysilicon coupler. The semiconductor layer includes at least one etched portion between first and second unetched portions. A first optical waveguide includes the first unetched portion and a first total internal reflection (TIR) boundary between the first unetched portion and the at least one etched portion. A second optical waveguide includes the second unetched portion and a second TIR boundary between the at least one unetched portion and the second etched portion. A polysilicon coupler at least partially overlaps the etched portion of the semiconductor layer. The polysilicon coupler optically couples the first optical waveguide and the second optical waveguide, wherein light can flow from the first optical waveguide via the polysilicon coupler portion to the second optical waveguide.

7 Claims, 40 Drawing Sheets

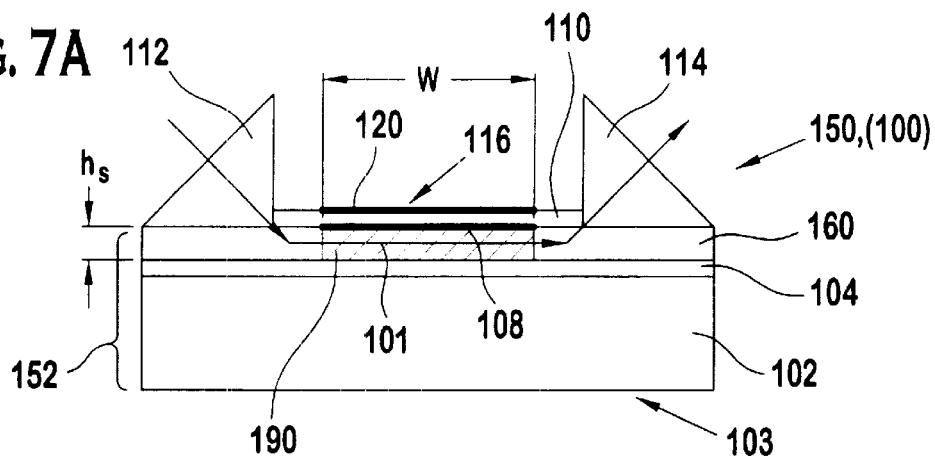
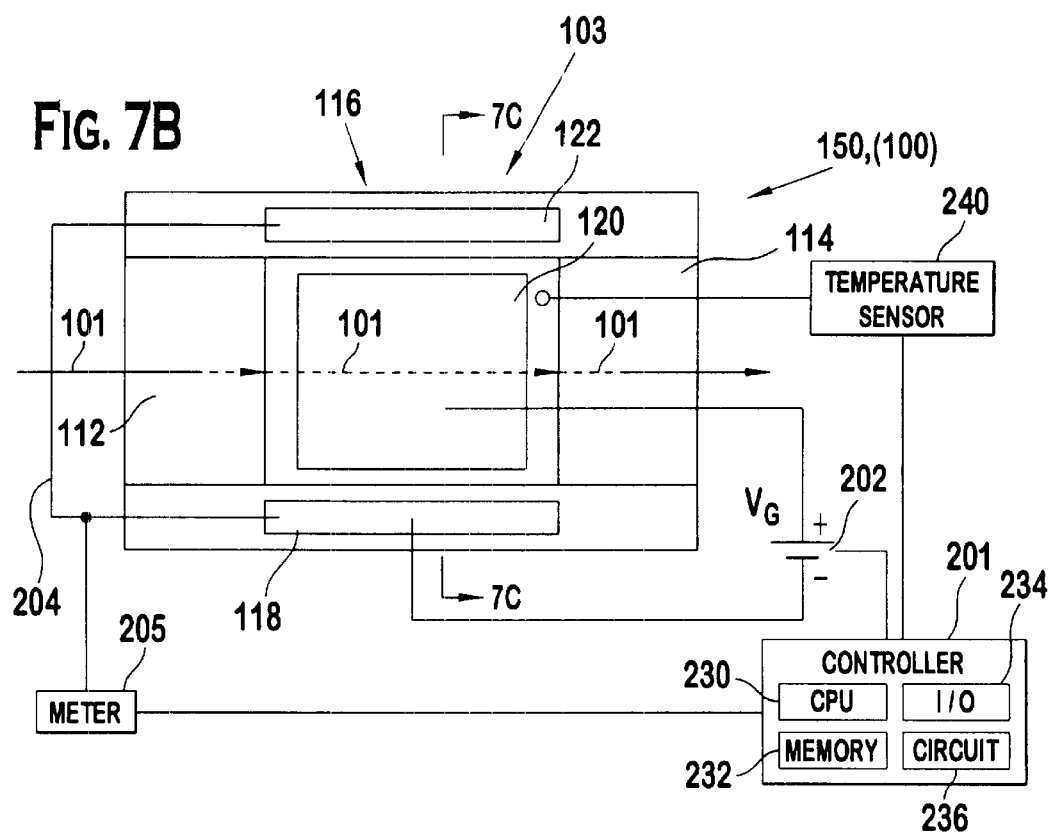

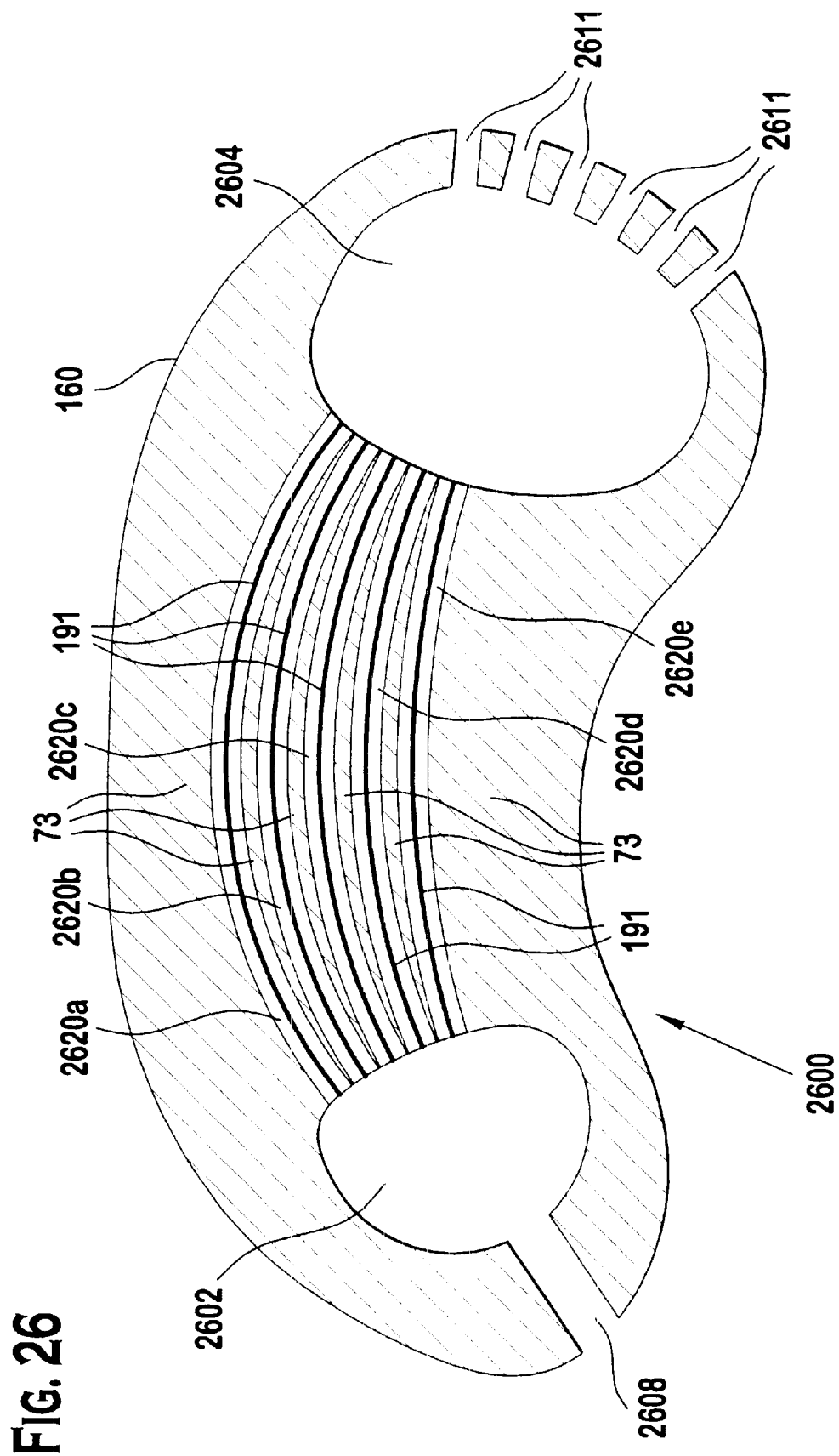

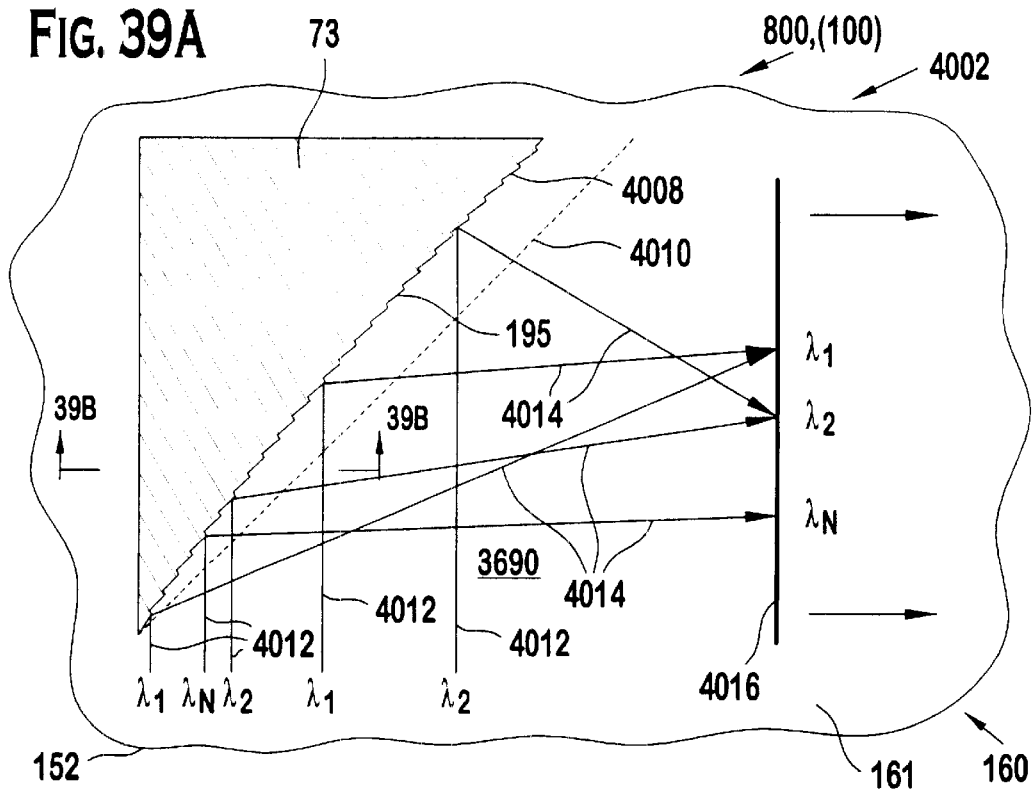
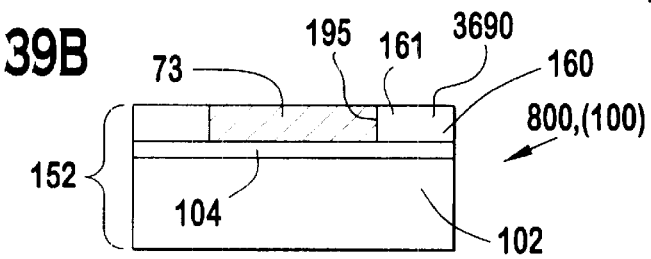
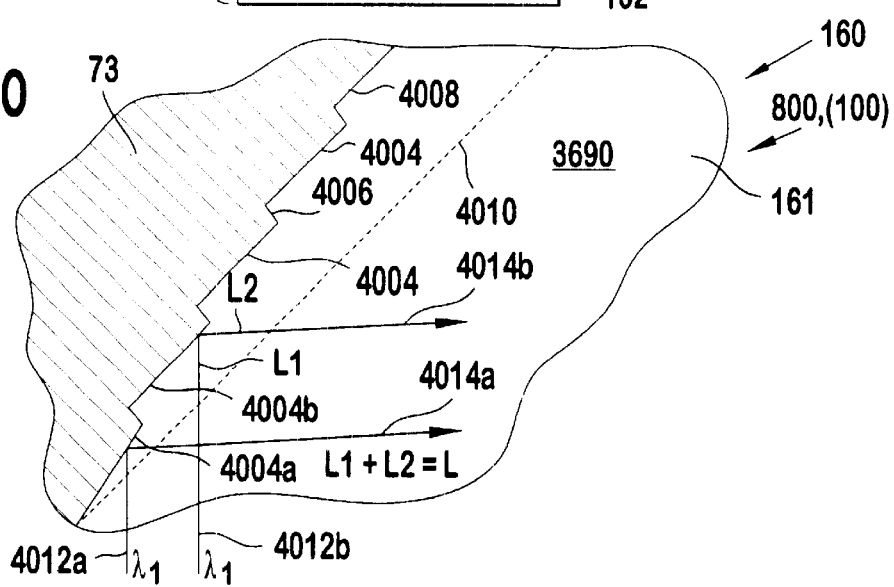

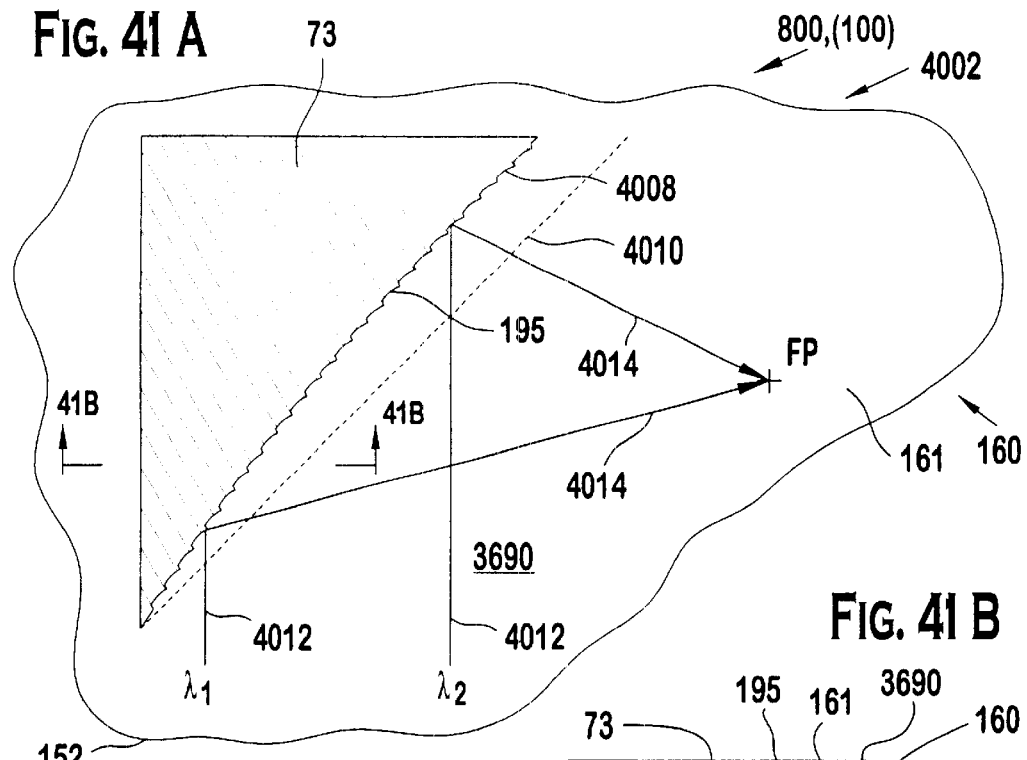
FIG. 41 A
FIG. 41 B
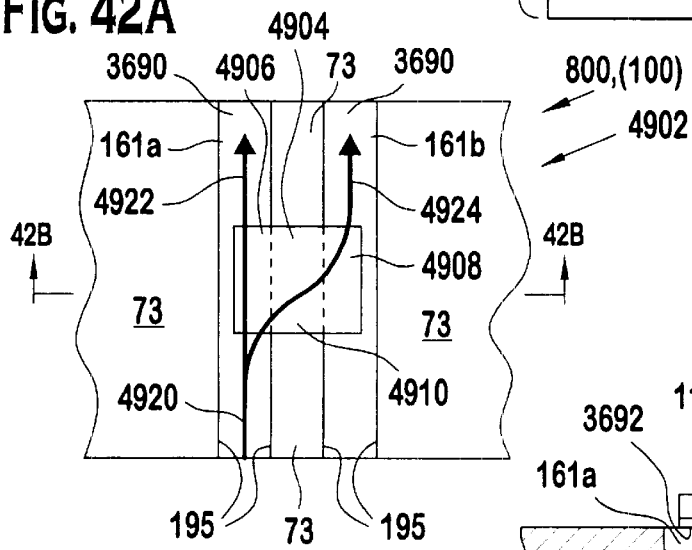
FIG. 42A
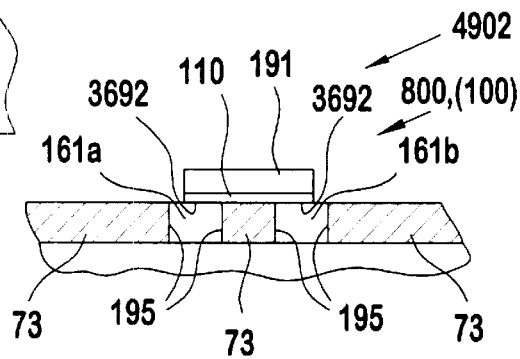
FIG. 42B

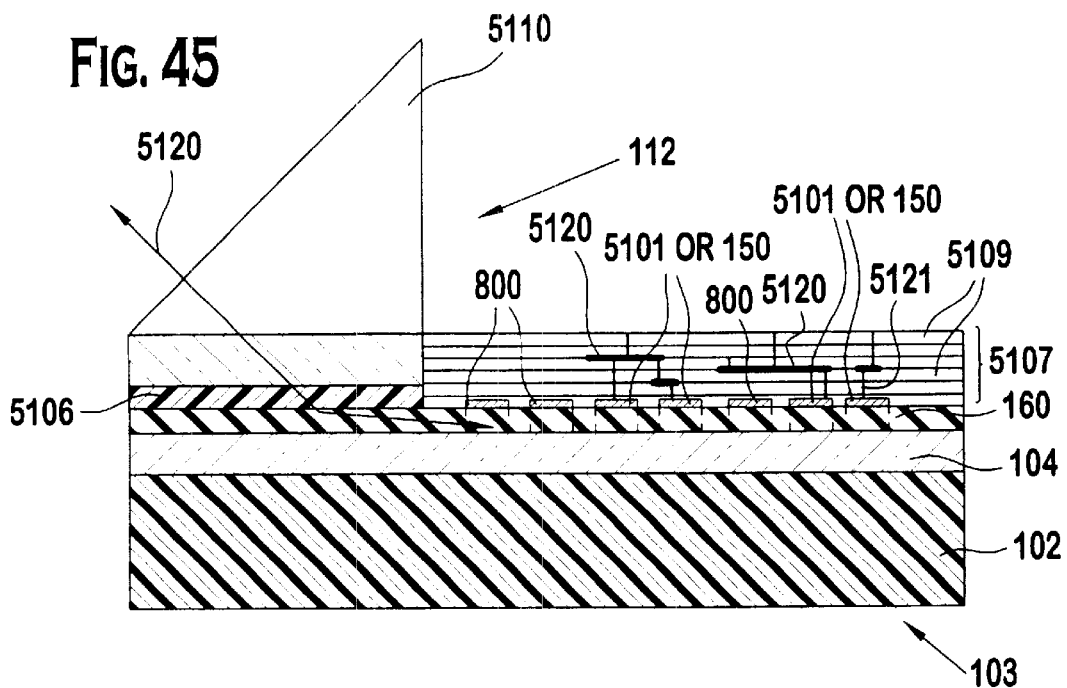
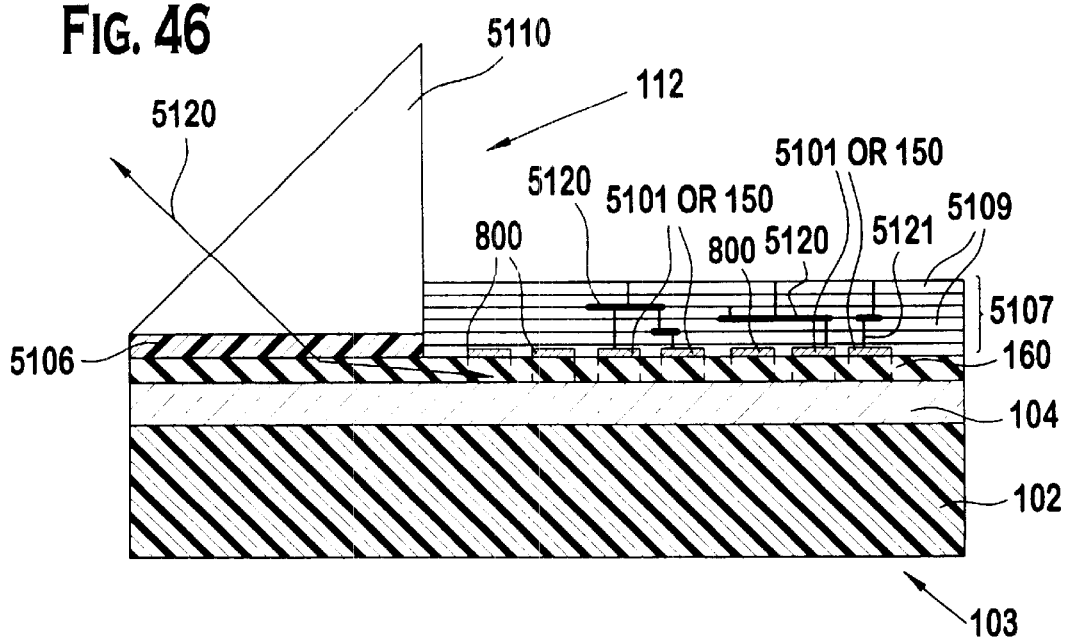

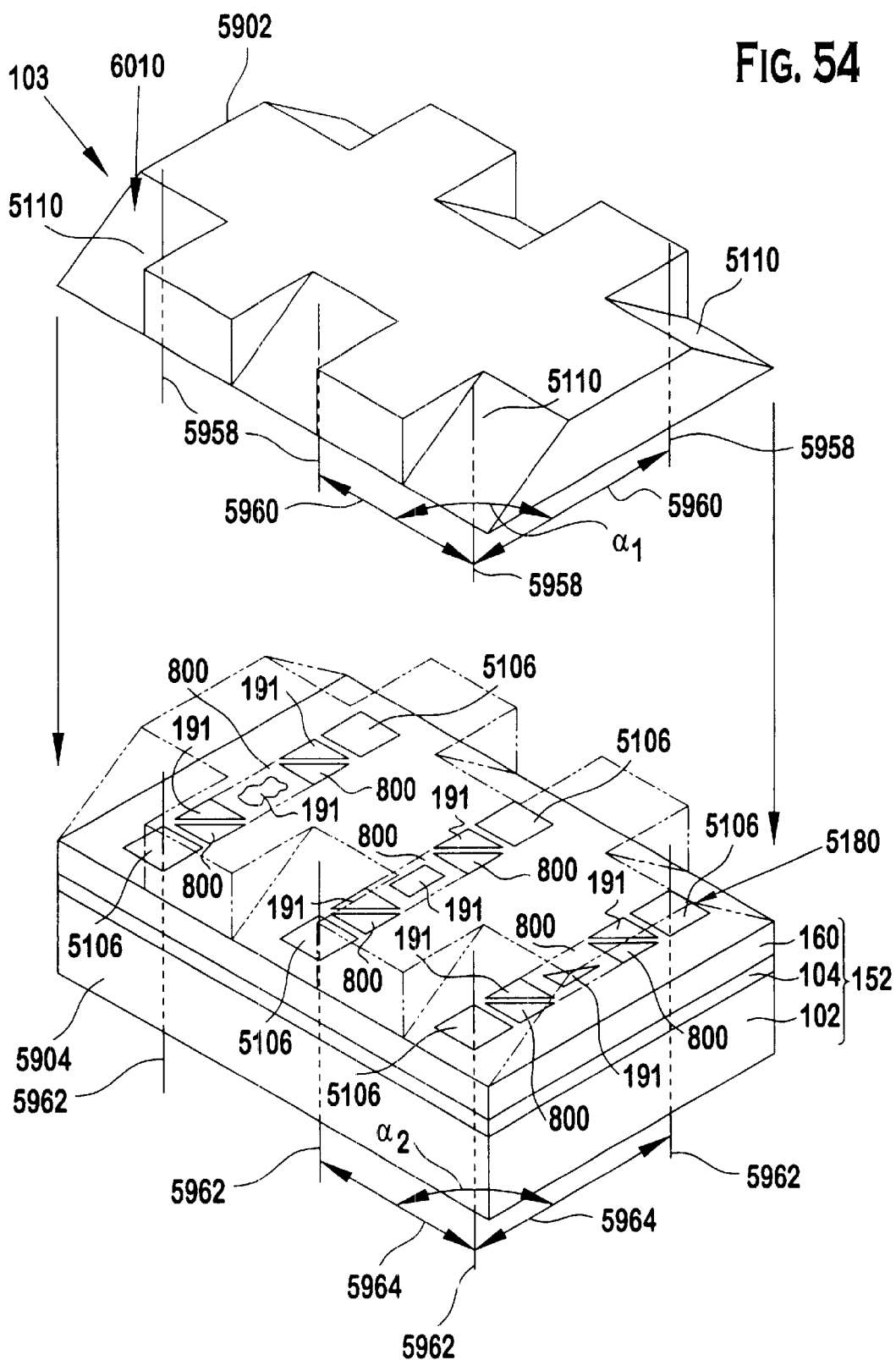

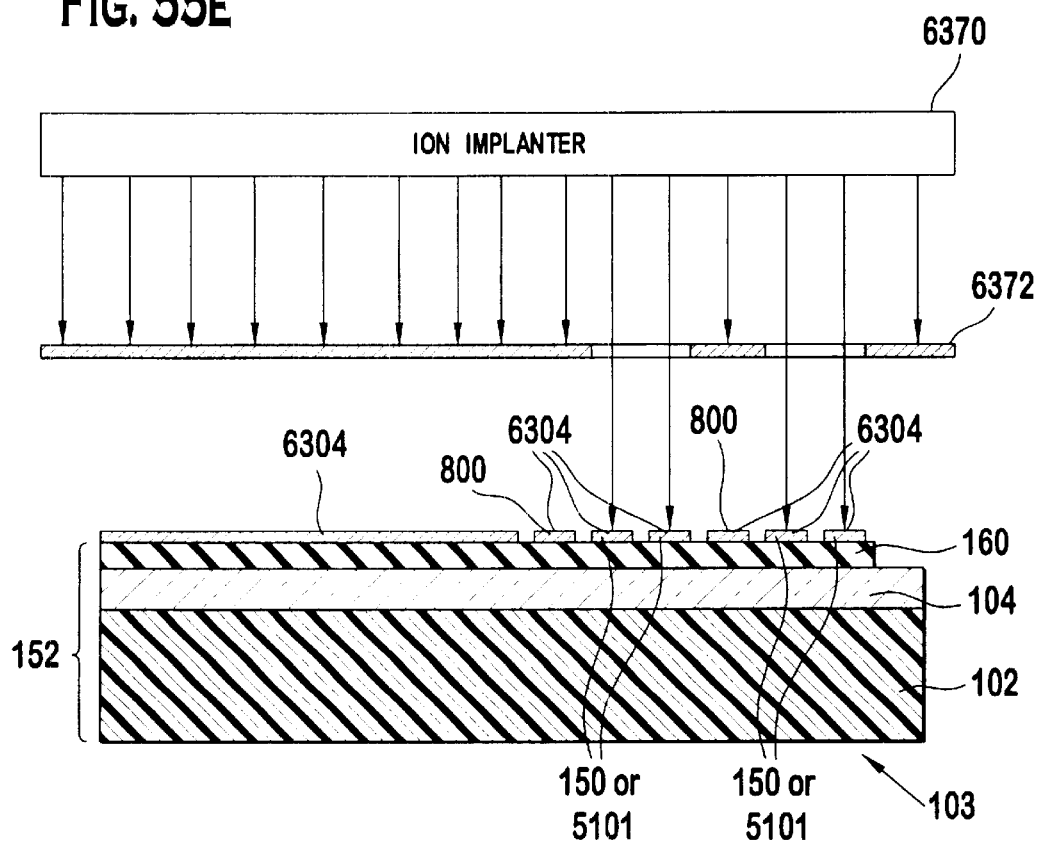

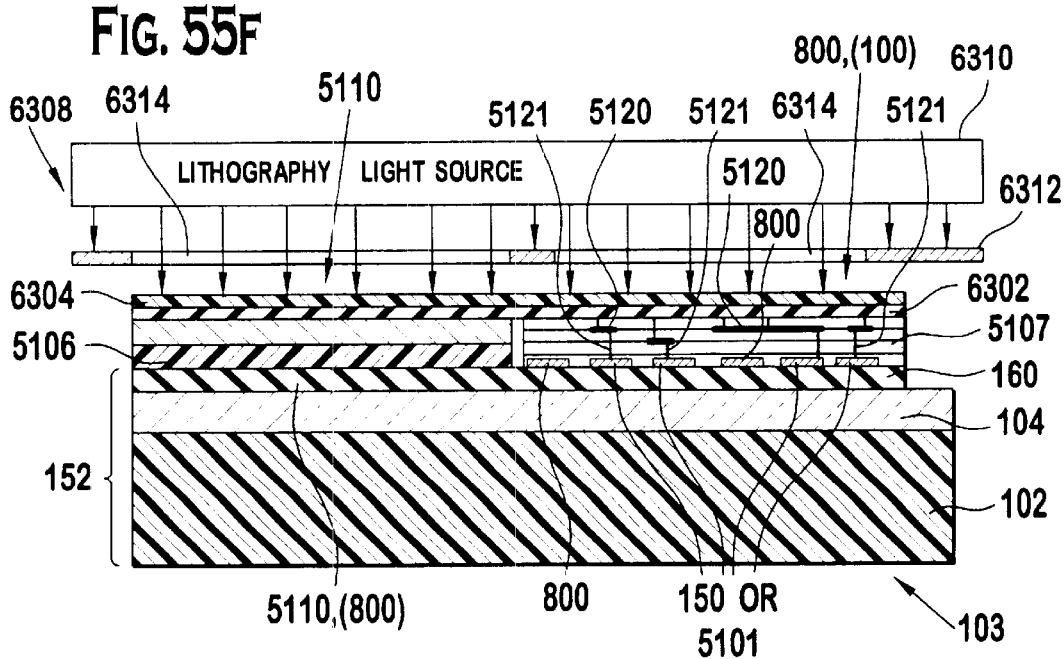
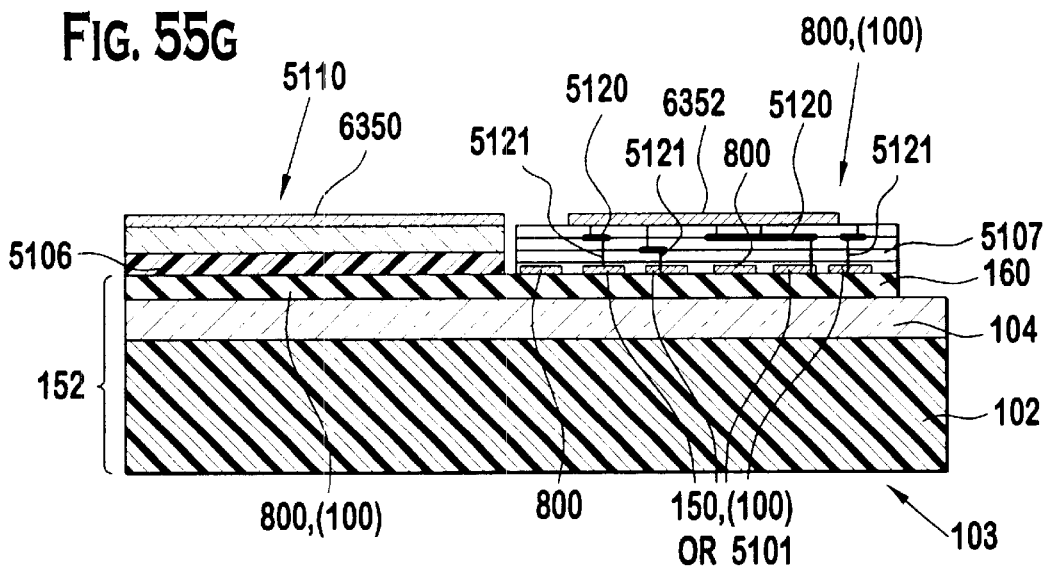

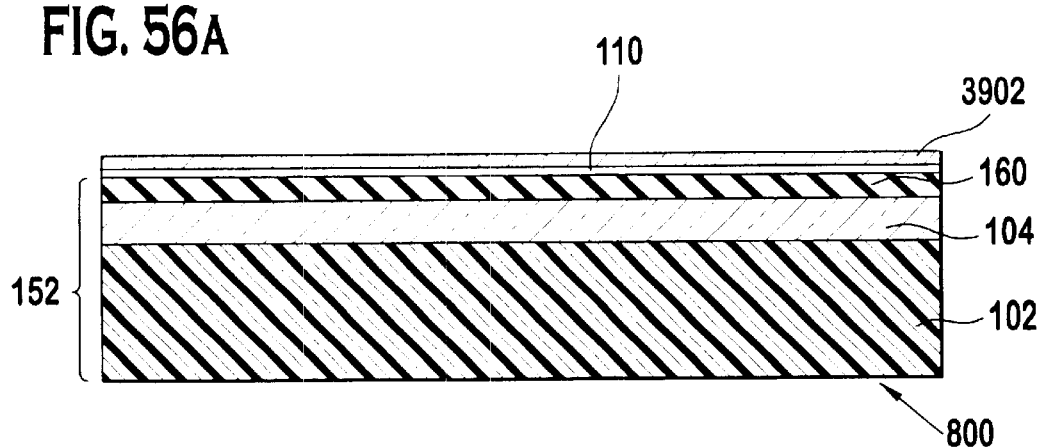
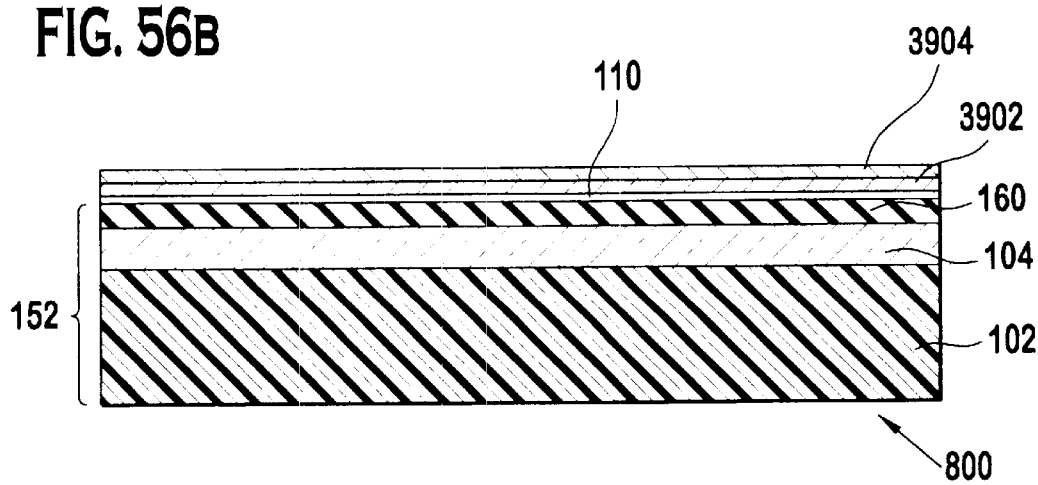
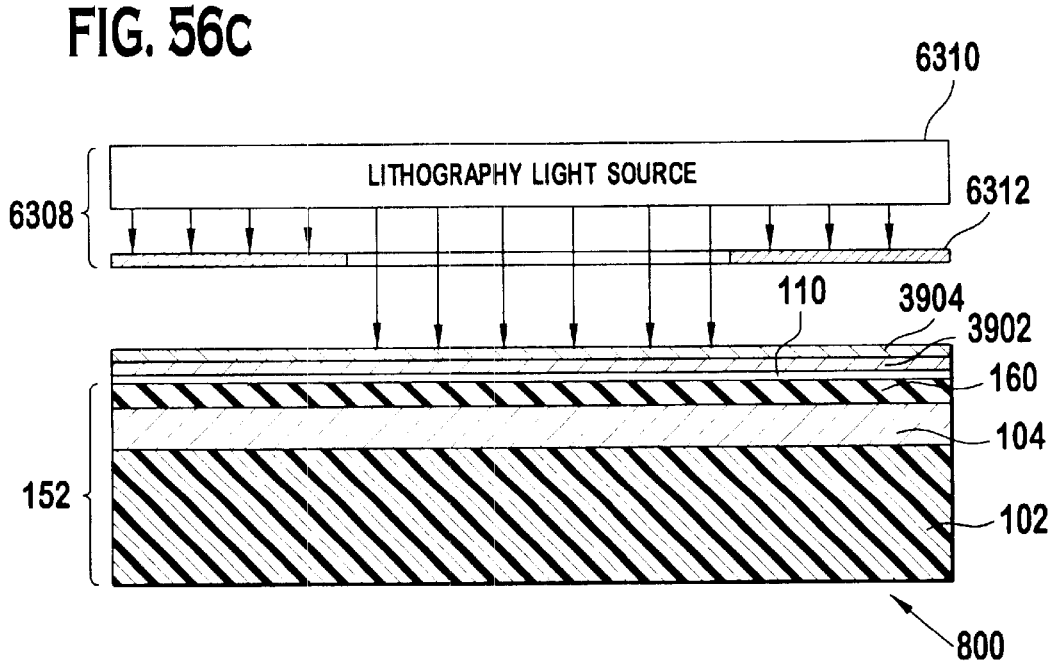

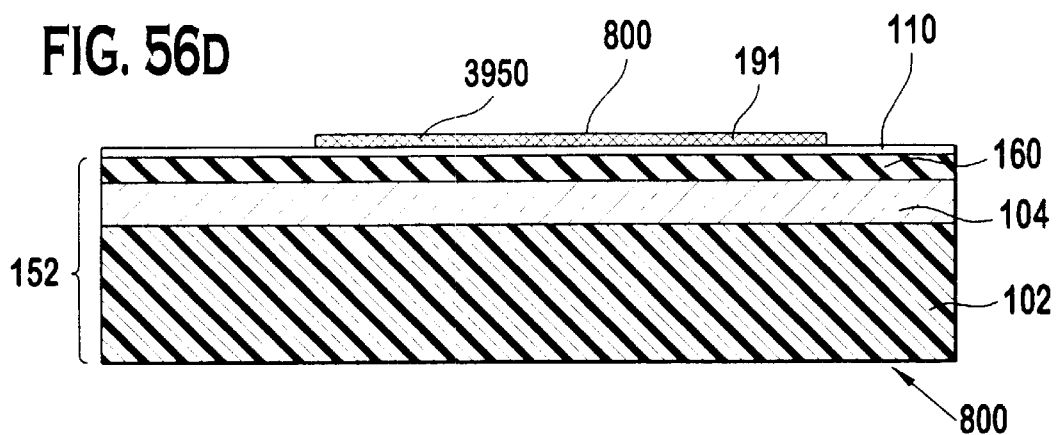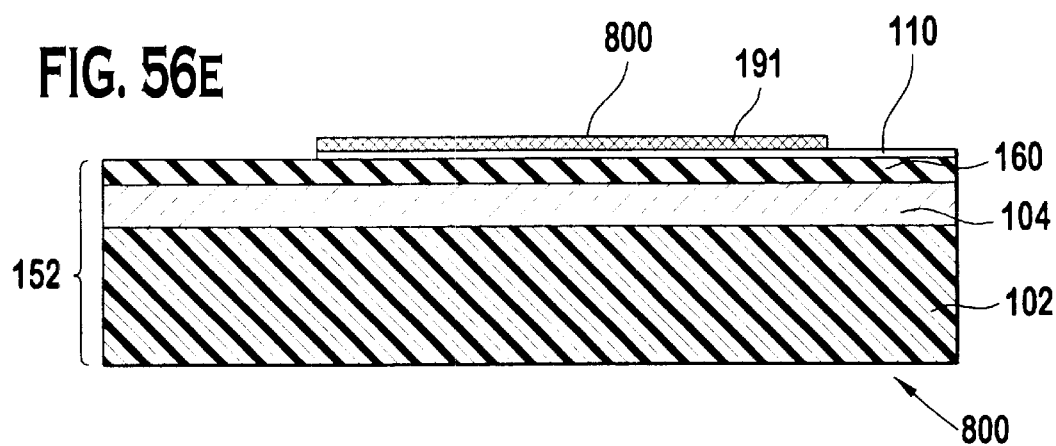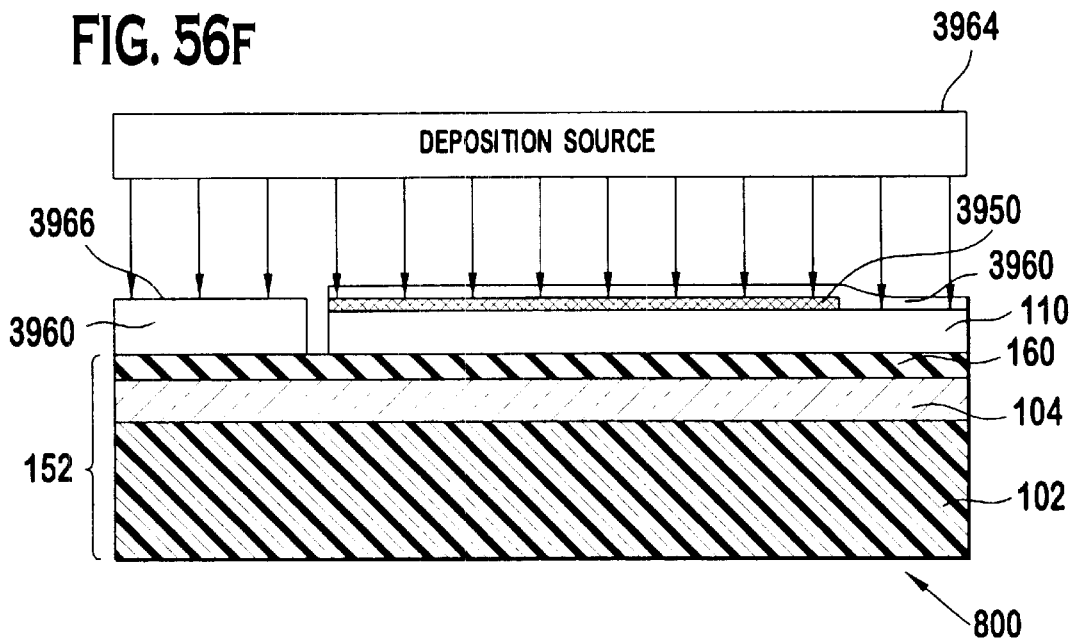

WAVEGUIDE COUPLER AND METHOD FOR MAKING SAME

CROSS-REFERENCE TO RELATED APPLICATIONS

This application is a continuation in part to U.S. patent application Ser. No. 09/991,542, filed Nov. 10, 2001 now pending (incorporated herein by reference), which is a continuation in part to U.S. patent application Ser. No. 09/859,693, filed May 17, 2001 now pending (incorporated herein by reference).

FIELD OF THE INVENTION

This invention relates to optical waveguide devices, and more particularly to passive optical waveguide devices, as well as integrated optical circuits including passive optical waveguide devices.

BACKGROUND OF THE INVENTION

In the integrated circuit industry, there is a continuing effort to increase device speed and increase device densities. Optical systems and technologies promise to deliver increasing speed and circuit packing density in the future. Optical waveguides typically include optical waveguide devices to provide optical functionality. Such optical waveguide devices can perform a variety of optical functions in integrated optical waveguide circuits such as optical signal transmission and attenuation.

In one aspect, optical waveguide devices include a variety of passive optical waveguide devices and/or a plurality of active optical waveguide devices. For example, certain gratings, lenses, filters, photonic crystals, and the like can be fabricated as passive optical waveguide devices. Similarly, active optical waveguide devices may function as filters, gratings, lenses, deflectors, switches, transmitters, receivers, and the like. Availability of a variety of passive and active optical waveguide devices and/or electronic devices provides a desired range of functionality. The availability of these devices is useful in making optical waveguide circuits simpler to design and fabricate.

A passive optical device does not change its function over a period of time excluding device degradations. A large variety of passive optical devices that include, e.g., optical fibers, slab optical waveguides, or thin film optical waveguides, may provide many optical functions. As such, the output or optical functionality of passive optical waveguide devices cannot be tuned or controlled. Additionally, passive active devices cannot be actuated (i.e., or turned on and off) depending on the present use of a region of an optical waveguide.

Many active optical waveguide devices such as modulators, filters, certain lenses, and certain gratings are precisely tunable. Tunability of certain active optical waveguide devices is important in making them more functional and competitive with present electronic circuits and devices.

Silicon-on-Insulator (SOI) and CMOS represent two technologies that have undergone a considerable amount of research and development relating to electronic devices and circuits. SOI technology can also integrate optical devices and circuits. It would be desirable to provide active optical waveguide device functionality and/or passive optical waveguide device functionality based largely on the CMOS devices and technology as well as manufacturing methods that allow for simultaneous fabrication of optically active and passive waveguide elements.

One embodiment of prior-art optical waveguide device is an arrayed waveguide grating (AWG) as shown in FIG. 2. The AWG 400 includes an input coupler 402, a plurality of arrayed waveguides 404, and an output coupler 406. The AWG 400 can be configured as a wavelength-division demultiplexer (if light signals travel from the left to the right in FIG. 2) or a wavelength-division multiplexer (if light signals travel from the right to the left in FIG. 2). In the AWG 400, each arrayed waveguide 404 has a different length between the input coupler 402 and the output coupler 406. The difference in length between each one of the different arrayed waveguides 404 corresponds to an optical phase shift of m2π, where m is an integer for the central design wavelength of the light that is applied to the AWG 400. Since each arrayed waveguide 404 has a different length, the light passing through the longer arrayed waveguides arrives at the output coupler 406 later than the light passing through the shorter arrayed waveguides.

AWGs 400, however, are difficult and expensive to produce. Each arrayed waveguide 404 is measured and formed separately. The operation of the AWG 400 requires that the different arrayed waveguides 404 differ in length by a distance equal to an m2π optical phase shift for the central design wavelength that the AWG is designed to multiplex/demultiplex. The cross-sectional area and the material of each arrayed waveguide 404 of the AWG 400 is constant to maintain the effective mode index (or the propagation constant β) of the different arrayed waveguides 404, and therefore provide a uniform velocity of light traveling through the different arrayed waveguides. As such, in present designs, each arrayed waveguide 404 of the AWG 400: a) has precisely calculated and measured lengths; b) has the same precisely produced and measured cross-sectional areas; c) has different lengths, such that the difference between the successive lengths, Δl is such that β Δl=m2π; and d) is smoothly-curved through a gradual radius of curvature to reduce bending losses of light flowing through the arrayed waveguide 404. Due to these requirements, the AWG 400 is challenging to design and fabricate since it is difficult to ensure the precise relative lengths of each one of the arrayed waveguides 404. Both the precision requirements and fabrication tolerances place extreme requirements on the manufacturing process. These waveguides traditionally use different indices of glass to make the core and the cladding. Silicon is used in the fabrication process but does not participate in the optical function. A 6" Si wafer may be able to accommodate 5–50 AWGs 400 depending on the design requirements and the available index contrast between the core and the cladding, which is generally of the order of a few percent. The waveguides in AWGs are designed to be polarization independent so that both the polarizations of the input light are more or less treated equally. Considerable time and human effort is therefore necessary to produce precise AWGs 400.

It would therefore be desirable to fabricate passive optical waveguide devices (such as AWGS) using standard CMOS fabrication techniques which, when combined with active optical functions such as a modulator on the same substrate, could form the basis of a WDM system on a chip. It would also be desirable to fabricate such passive optical waveguide devices as AWGs and interferometers in a manner that the lengths and shapes of the arrayed waveguides are simple to accurately calculate, measure, and produce. Furthermore, it would be desired to apply active optical waveguide devices as tuning devices associated with optical circuits including passive optical waveguide devices, wherein much of the fabrication errors inherent in passive optical waveguide devices or device degradation over time can be dynamically tuned out by tuning the associated active optical waveguide devices.

SUMMARY OF THE INVENTION

One aspect of the invention relates to a passive optical waveguide device deposited on a wafer. The wafer includes an insulator layer and an upper semiconductor layer formed at least in part from silicon. The upper silicon layer forms at least part of an optical waveguide, such as a slab waveguide. The passive optical waveguide device includes an optical waveguide, a gate oxide, and a polysilicon layer (i.e., a layer formed at least in part from polysilicon) In some embodiments, the optical waveguide is formed within the upper semiconductor layer, a gate oxide layer that is deposited above the upper semiconductor layer, and a polysilicon layer that is deposited above the gate oxide layer. The polysilicon layer projects a region of static effective mode index within the optical waveguide. The region of static effective mode index has a different effective mode index than the optical waveguide outside of the region of static effective mode index. The region of static effective mode index has a depth extending within the optical waveguide. A value and a position of the effective mode index within the region of static effective mode index remains substantially unchanged over time. The region of static effective mode index applies a substantially unchanging optical function to light travelling through the region of static effective mode index over the lifetime of the passive optical waveguide device.

As explained below, the terms "gate oxide" or "gate oxide layer" as used herein refer to the type of oxides (or other electrically insulating materials including glass) that are typically used to form a gate regardless of whether the material is used functionally to form all or part of a gate. Each region of static/altered effective mode index described herein is due to the presence of polysilicon deposited on the "gate oxide" layer, and controlled (at least in part) by controlling the shape or dimensions of the polysilicon. The polysilicon acts to guide light though one or more layers of a wafer (similar to a rib waveguide) and, depending on the width and height of the polysilicon, acts to create a region with a different effective mode index or having a different propagation constant, as compared to remaining regions on the wafer. Various "photonic guides" may be created simply by the presence of polysilicon deposited on the gate oxide. Optionally, a layer below the gate oxide layer (e.g., an upper silicon layer of an SOI substrate) may also be etched to create total reflection boundaries that also serve to define the "photonic guide." By positioning different "photonic guides" (or polysilicon portions) in appropriate geometric relationships on a substrate as described herein, many useful passive and/or active optical devices may be fabricated using well understood manufacturing steps of electronic device manufacturing. Different portions of the "photonic guides" may be made active by construction of appropriate electrodes for diode or transistor action and local, variable effective mode index created, as described below. Exemplary passive complex functions formed using the "photonic guides" described herein include AWG's for separation and combining of different colors of light in the waveguide, interferometers, lenses, and gratings.

One aspect of the invention relates to an integrated optical circuit comprising an optical waveguide and an evanescent coupler. The optical waveguide is located on a wafer. The optical waveguide is formed from an upper semiconductor layer of the wafer, a gate oxide layer deposited on the upper semiconductor layer, and a polysilicon layer deposited on the gate oxide layer. The evanescent coupling region is formed at least in part from a gap portion that optically couples light to the upper semiconductor layer of the optical waveguide using the evanescent coupling region. Light can be coupled from outside of the passive optical waveguide device via the evanescent coupling region into the optical waveguide. Alternatively, light can be coupled from the optical waveguide through the evanescent coupling region out of the passive optical waveguide device. The polysilicon layer projects a region of static effective mode index within the optical waveguide, wherein the region of static effective mode index has a different effective mode index than the optical waveguide outside of the region of static effective mode index. A value and a position of the effective mode index within the region of static effective mode index remains substantially unchanged over time and applies a substantially unchanging optical function to light travelling through the region of static effective mode index within the optical waveguide over the lifetime of the passive optical waveguide device.

One aspect of the invention relates to an optical waveguide device that controls the transmission of light through an optical waveguide. The optical waveguide device comprises an active optical waveguide device and a passive optical waveguide device. The active optical waveguide device is formed at least in part on a semiconductor layer and includes an electrode portion. A region of altered effective mode index is created by the active optical waveguide device. An effective mode index of the region of altered effective mode index within the optical waveguide is controlled by application of an electric voltage to the electrode portion in a manner that alters a free carrier density of the region of altered effective mode index. Changing the electric voltage to the electrode portion changes the effective mode index in the region of altered effective mode index. The passive optical waveguide device is formed at least in part from a polysilicon layer deposited on the semiconductor layer. An effective mode index of a region of static effective mode index within the optical waveguide is created by the polysilicon layer of the passive optical waveguide device. The polysilicon layer has a shape and a height. The effective mode index of the region of static effective mode index is related to the shape of the polysilicon layer and the height of the polysilicon layer. A value and a position of the effective mode index within the region of static effective mode index remains substantially unchanged over time and applies a substantially unchanging optical function to light travelling through the region of static effective mode index over the lifetime of the passive optical waveguide device. The optical waveguide forms at least a part of both the active optical waveguide device and the passive optical waveguide device. The optical waveguide couples the active optical waveguide device and the passive optical waveguide device, and the optical waveguide is formed at least in part using the semiconductor layer. In one aspect, the active optical waveguide device can be configured to provide electronic transistor action.

One aspect of the present invention relates to an interferometer comprising at least one optical waveguide, a first passive optical waveguide segment, and a second passive optical waveguide segment. The at least one optical waveguide includes at least one gate oxide layer deposited on a semiconductor layer of a wafer and a polysilicon layer deposited on the at least one gate oxide layer. The first passive optical waveguide segment includes a first portion of the polysilicon layer. The first portion projects a first region of static effective mode index within the at least one optical waveguide. The first region of static effective mode index has a different effective mode index than the at least one optical waveguide outside of the first region of static effective mode index. A value and a position of the effective mode index within the first region of static effective mode index of the first passive optical waveguide segment remains substantially unchanged over time. The first region of static effective mode index therefore applies a substantially unchanging optical function to light travelling through the first region of static effective mode index within the at least one optical waveguide over the lifetime of the first passive optical waveguide segment. The second passive optical waveguide segment includes a second portion of the polysilicon layer. The second portion projects a second region of static effective mode index within the at least one optical waveguide. The second region of static effective mode index has a different effective mode index than the at least one optical waveguide outside of the second region of static effective mode index. A value and a position of the effective mode index within the second region of static effective mode index of the second passive optical waveguide segment remains substantially unchanged over time and applies a substantially unchanging optical function to light travelling through the second region of static effective mode index within the at least one optical waveguide over the lifetime of the second passive optical waveguide segment. A length of the first passive optical waveguide segment equals a length of the second passive optical waveguide segment. The first and second passive optical waveguide segments are coupled to each other and together form at least in part the optical waveguide. The first and second passive optical waveguide segments and the optical waveguide are each formed at least in part from the semiconductor layer. The first region of static effective mode index has a different effective mode index than the second region of static effective mode index. In one embodiment, the difference in effective mode between the first and the second region of static effective mode index is at least partially provided by a difference in cross-sectional areas respectively between the first portion of the polysilicon layer and the second portion of the polysilicon layer. In another embodiment, the difference in effective mode between the first and the second region of static effective mode index is at least partially provided by a difference in axial lengths respectively between the first portion of the polysilicon layer and the second portion of the polysilicon layer.

One aspect of the present invention relates to an arrayed waveguide grating (AWG) deposited on a wafer that includes an upper semiconductor layer comprising a first port, a plurality of second ports, a gate oxide layer, a polysilicon layer, and a plurality of arrayed waveguides. The gate oxide layer is deposited above the upper semiconductor layer. The polysilicon layer is deposited above the gate oxide layer. The plurality of arrayed waveguides extend between the first port and each one of the plurality of second ports. Each one of the plurality of arrayed waveguides are at least partially formed by the upper semiconductor layer, the polysilicon layer, and the gate oxide layer. Each one of the arrayed waveguides is associated with a portion of the polysilicon layer. Each portion of the polysilicon layer has a different cross-sectional area, wherein each of the arrayed waveguides has a different effective mode index. A value and a position of the effective mode index associated with each of the respective arrayed waveguides remains substantially unchanged over time and applies a substantially unchanging optical function to light travelling through the respective arrayed waveguide over the lifetime of the respective arrayed waveguide. In one embodiment, the different effective mode indexes in each of the respective arrayed waveguides is provided by a difference in cross sectional area of the polysilicon layer associated with each one of the plurality of arrayed waveguides. In another embodiment, the different effective mode indexes in each of the respective arrayed waveguides is provided by a difference in axial length of the polysilicon layer associated with each one of the plurality of arrayed waveguides.

One embodiment of the present invention relates to an optical waveguide device that controls the transmission of light through an optical waveguide. The optical waveguide device includes a first passive optical waveguide device and a second passive optical waveguide device. The first passive optical waveguide device is etched, at least in part, in a semiconductor layer of a wafer. A value and a position of an effective mode index within the first passive optical waveguide device remains substantially unchanged over time and applies a substantially unchanging optical function to light travelling through the first passive optical waveguide device over the lifetime of the first passive optical waveguide device. The second passive optical waveguide device is formed at least in part from a polysilicon layer deposited above an unetched portion of the semiconductor layer. The effective mode index of a region of static effective mode index within the optical waveguide is created by the polysilicon layer of the second passive optical waveguide device. The effective mode index of the region of static effective mode index is related to a shape of the polysilicon layer and a height of the polysilicon layer. A value and a position of the effective mode index within the region of static effective mode index remains substantially unchanged over time, and applies a substantially unchanging optical function to light travelling through the region of static effective mode index over the lifetime of the second passive optical waveguide device. The optical waveguide forms at least a part of both the first passive optical waveguide device and the second passive optical waveguide device. The optical waveguide couples the first passive optical waveguide device and the second passive optical waveguide device, and the optical waveguide is formed at least in part using the semiconductor layer.

One aspect of the present invention relates to a device that provides for the transmission of light through a first optical waveguide and a second optical waveguide. The device includes a semiconductor layer and a polysilicon coupler. The semiconductor layer includes at least one etched portion between first and second unetched portions. The first optical waveguide includes the first unetched portion and a first total internal reflection (TIR) boundary between the first unetched portion and the at least one etched portion. The second optical waveguide includes the second unetched portion and a second TIR boundary between the at least one unetched portion and the second etched portion. The polysilicon coupler at least partially overlaps the etched portion of the semiconductor layer. The polysilicon coupler optically couples the first optical waveguide and the second optical waveguide, wherein light can flow from the first optical waveguide via the polysilicon coupler portion to the second optical waveguide.

One aspect of the present invention relates to a passive optical waveguide device, comprising a silicon layer of a Silicon-on-Insulator (SOI) wafer, a gate oxide layer that is often fabricated on glass, and the polysilicon layer. The gate oxide layer is commonly used during the fabrication of electronic transistors. The polysilicon layer is often used during the fabrication of electronic transistors. The polysilicon layer is often used to form a portion of a gate electrode used in Field Effect Transistors (FET). The glass layer is deposited on the silicon layer, and the polysilicon layer is deposited on the glass layer. By controlling the width and the height of the polysilicon layer the effective mode index or the propagation constant β is controlled to provide a rib or ridge optical waveguide. Many structures that perform a variety of optical functions can be constructed by adjusting the polysilicon parameters (e.g., shape, dimension, height, etc.). Furthermore, optical waveguide devices such as AWGs, can be constructed in an existing CMOS fab, using cost effective techniques and processes. Certain passive optical waveguide devices that can be constructed using the techniques described herein include, e.g.,: rectangular AWGs, lenses and lens arrays, adiabatic tapers, and Bragg structures. Many embodiments of passive optical waveguide devices can be constructed in thin SOI by etching the silicon layer. Examples of passive optical waveguide devices that are formed by etching the silicon layer in thin SOI include mirrors, mirror arrays, Echelle gratings, MMI, adiabatic tapers, coupled waveguides, and focusing Echelle devices

BRIEF DESCRIPTION OF THE DRAWINGS

The accompanying drawings, which are incorporated herein and constitute part of this specification, illustrate the presently preferred embodiment of the invention, and, together with the general description given above and the detailed description given below, serve to explain features of the invention.

FIG. 7A shows a side cross-sectional view, of one embodiment of an active optical waveguide device including a field effect transistor (FET);

FIG. 7B shows a top view of the active optical waveguide device of FIG. 7A;

FIG. 26 shows a top view of a passive optical waveguide device that is configured as another embodiment of AWG;

FIGS. 39A and 39B show respective top and cross-sectional views of yet another embodiment of passive optical waveguide device that is formed by etching the silicon layer, that is configured as a refectory Echelle diffraction grating;

FIG. 40 shows an expanded view of a portion of the passive optical waveguide device shown in FIG. 39;

FIGS. 41A and 41B show respective top and cross-sectional views of yet another embodiment of passive optical waveguide device that is formed by etching the silicon layer, that is configured as a refectory Echelle lens grating;

FIG. 42A shows a top view of one embodiment of passive optical waveguide device that is configured as an inter-optical waveguide coupler;

FIG. 42B shows a cross sectional view of the inter-optical waveguide coupler as taken along sectional lines 42—42 of FIG. 42A;

FIG. 45 shows a cross-sectional view of one embodiment of the integrated optical/electronic circuit;

FIG. 46 shows a cross-sectional view of another embodiment of the integrated optical/electronic circuit;

FIG. 54 shows a partially exploded perspective view of an alternate embodiment of the integrated optical circuit using flip chips.

FIGS. 55A to 55G show a method of fabricating a layer on the partially completed integrated optical/electronic circuit, similar to as shown in FIG. 43;

FIGS. 56A to 56I show a method of fabricating a layer on the partially completed passive optical waveguide device in combination with a light coupler.

Throughout the figures, unless otherwise stated, the same reference numerals and characters denote like features, elements, components, or portions of the illustrated embodiments.

DETAILED DESCRIPTION OF THE EMBODIMENT

I. Optical Waveguide Device Introduction

Figure 1:
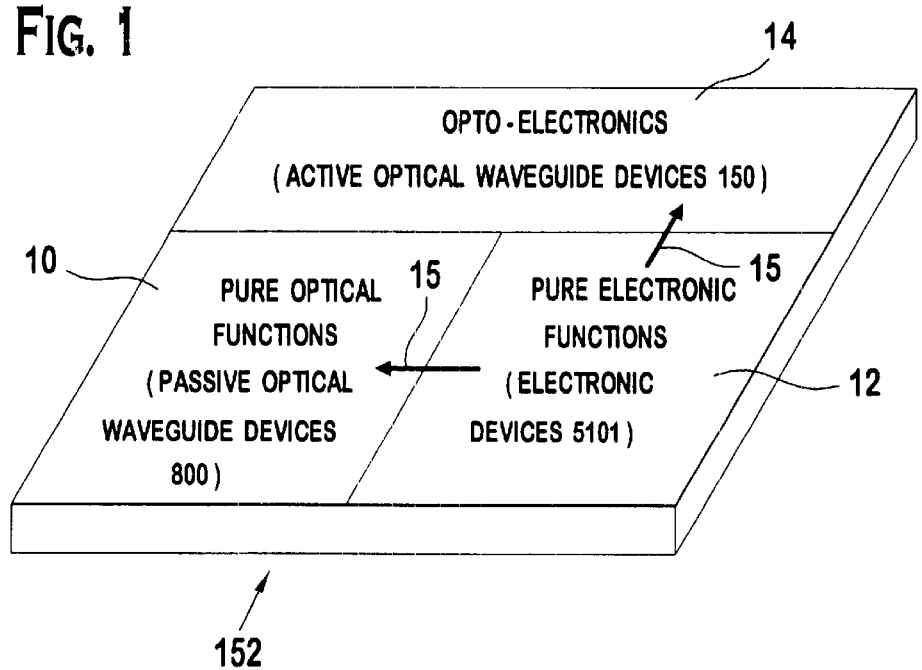
FIG. 1 shows a logical diagram of an integrated optical/electronic circuit.

The present disclosure provides multiple embodiments of optical waveguide devices 100 in which light travels within an optical waveguide 160 on a single wafer 152. FIG. 1 illustrates a logical diagram of one embodiment of integrated optical/electronic circuit 103. The integrated optical/electronic circuit 103 may provide pure optical functions 10, pure electronic functions 12, and opto-electronic functions 14 on the single wafer 152. Each type of optical function is preferably performed by a different type of device configured for that particular function. For example, passive optical waveguide devices 800, described herein, can perform the pure optical functions 10. Electronic devices 5101, described herein, can perform the pure electronics functions 12. Active optical waveguide devices 150, described herein, can perform the opto-electronics functions 14. While the pure optical functions 10, the pure electronic functions 12, and the opto-electronic functions 14 are illustrated at distinct locations on the wafer 152, in actuality the devices that perform these functions are each typically physically interspersed across the wafer 152. For example, one passive optical waveguide device 800 may be adjacent, and operationally associated with, one active optical waveguide device 150 or one electronic device 5101. One active optical waveguide device 150 may be used, for example, to tune out optical operational irregularities present in the passive optical waveguide device 800. The passive optical waveguide devices can be closely combined with active optical waveguide devices. For example, a silicon passive optical waveguide (which is a passive optical waveguide device) constructed using standard CMOS processes can be combined with active electronics devices 5101 (such as diodes or transistors) to form the integral part of an optical modulator as one embodiment of integrated optical/electronic circuit 103.

The same CMOS-based manufacturing process, described herein, can be used to fabricate the active optical waveguide devices 50, the electronic devices 5101, and the passive optical waveguide devices 800 within the integrated optical/electronic circuit 103 often using the same processing steps as described herein. As such, the devices that can perform the pure optical functions 10, the pure electronic functions 12, and the opto-electronics functions 14 can be produced concurrently, on the same wafer 152, and using the same manufacturing process.

The passive optical waveguide devices 800, the electronic devices 5101, and the active optical waveguide devices 150 can each be fabricated using standard CMOS processing techniques and technology. In one embodiment, the passive optical waveguide devices 800, the electronic devices 5101, and the active optical waveguide devices 150 are described as being fabricated on a single Silicon-on-Insulator (SOI) wafer 152. For example, pure electronic devices such as field effect transistors (FETs) can be deposited and/or etched on the SOI wafer 152. The passive optical waveguide devices 800 and the active optical waveguide devices 150 can be simultaneously deposited and/or etched on the SOI wafer 152. The masks, and the positioning equipment, that are used for etching active optical waveguide devices 5101 can also be used to etch the passive optical waveguide devices 800 and the active optical waveguide devices 150 as described herein.

Semiconductors such as silicon, gate oxides (such as glass), polysilicon, and metal form the basic building materials from which electronic devices 5101 are fabricated using CMOS technology. Passive optical waveguide devices 800 and active optical waveguide devices 150 can be fabricated using the same building materials. Similar doping techniques can be applied, where appropriate, for polysilicon that is used in electronic devices 5101, active optical waveguide devices 150, and passive optical waveguide devices 800.

Figure 4:
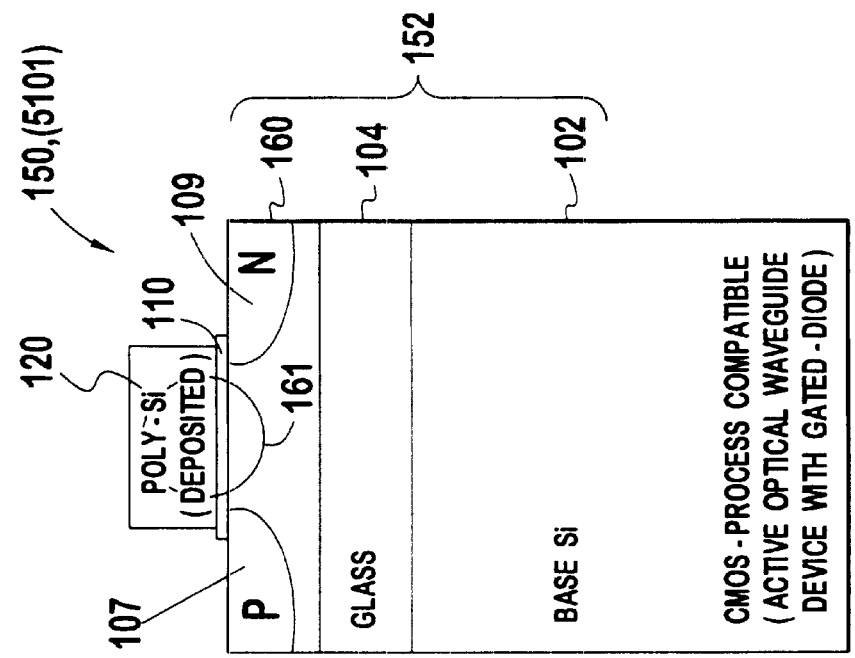
FIG. 4 shows an end cross-sectional view of one embodiment of either an active optical waveguide device or an electronic device.
Figure 3:
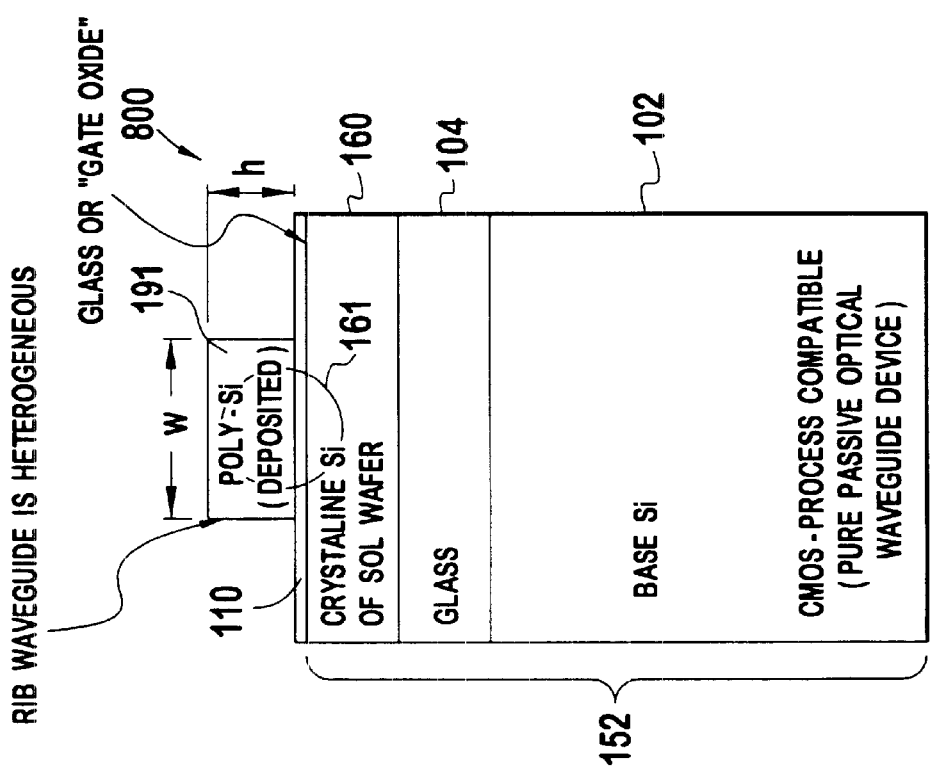
FIG. 3 shows an end cross-sectional view of one embodiment of passive optical waveguide device.

Certain embodiments of passive optical waveguide devices 800 are structurally very similar to certain embodiments of active optical waveguide devices 150. For example, one embodiment of passive optical waveguide device 800 that is integrated on the SOI wafer 152 is illustrated in FIG. 3. One embodiment of active optical waveguide device 150 that is integrated on the SOI wafer 152 is illustrated in FIG. 4. In FIGS. 3 and 4, the SOI wafer 152 includes a substrate 102, an optical insulator 104, and the silicon layer 160. The substrate 102 includes, for example, silicon, gallium arsenide (GaAs), indium phosphate (InP), glass, sapphire, or diamond. The optical insulator 104 includes, e.g., glass, silicon dioxide, or other optically insulating materials. Cladding layers, used with certain slab optical waveguides 160 and optical fibers, are one embodiment of optical insulators 104 and gate oxide layers 110.

Any description of a specific semiconductor in this disclosure is exemplary, and not limiting in scope, since a very large number of materials may be used. Other materials can be used in the silicon layer 160. Examples of such materials generally include semiconductor materials. The term "semiconductor" used through this disclosure relates particularly to the silicon layer 160 of the optical waveguide devices 100. The silicon layer 160 (often configured as an optical waveguide) is formed at least in part from silicon and may also include GaAs, InP, SiGe, or other materials which in combination with silicon transmit light. At room temperature, silicon and germanium are single element semiconductors. GaAs and InP are examples of binary compound semiconductors. There are semiconductors made from three element semiconductors such as AlGaAs. The salient feature of all semiconductors is the existence of a band-gap between the valence and the conduction band. During the fabrication of the optical waveguide device 100, multiple semiconductor layers may be deposited and/or etched.

The embodiment of passive optical waveguide 800 shown in FIG. 3 includes (in addition to the components of the SOI wafer 152) a polysilicon layer 191 and a gate oxide layer 110. The gate oxide layer 110 in CMOS processing often includes glass, such as silicon dioxide. In this disclosure, the term "gate oxide" refers to the type of oxide (or glass) that is typically used to form a gate, but in the present disclosure the gate oxide does not necessarily have to form a gate. For example, the gate oxide layer is applied to polysilicon layers in certain embodiments of passive optical waveguide devices as described herein. Polysilicon, such as used in the polysilicon layer 191, corresponds to a layer formed at least in part from polysilicon and would include, for example, a pure polysilicon layer or a polySi layer doped with materials such as Ge or C. Polysilicon is often used in gate electrodes for field effect transistors (FETs), using CMOS processing. FETs represent one embodiment of electronic device 5101. However, with FETs, the polysilicon of the gate electrodes are doped. The polysilicon used in the polysilicon layer 191 is preferably not doped. Undoped polysilicon layers are desired to limit the light absorption of doped polysilicon. An optical waveguide 161 is formed within the silicon layer 160, the gate oxide layer 110, and/or the polysilicon layer 191. Light travelling within the passive optical waveguide device 800 flows within the optical waveguide 161. The width w and the height h of the polysilicon layer 191 largely determine the cross-sectional configuration, and therefore the optical characteristics, of the optical waveguide 161. In passive optical waveguide devices, the optical waveguide, that defines where light flows, is formed in the silicon layer 160, the gate oxide 110, and the polysilicon layer 191.

The embodiment of active optical waveguide device 150 shown in FIG. 4 also includes (in addition to the components of the SOI wafer 152 and the passive optical waveguide device 800 shown in FIG. 3) a gate electrode 120, a first body contact well 107, and a second body contact well 109. The first body contact well 107 and the second body contact well 109 are also known in FET terminology (either respectively or inversely) as a source and a drain. In the active optical waveguide device 150, the optical waveguide 161 is formed within the silicon layer 160, the polysilicon layer 191, the gate oxide 110, and/or the gate electrode 120. The width w and the height h of the gate electrode 120 largely determine the cross-sectional configuration of the optical waveguide 161.

Physically, the active optical waveguide device 150 includes similar materials to FETs. The polysilicon in the gate electrode 120 is doped in a similar manner to the polysilicon in the gate electrode of a FET. Many embodiments of active optical waveguide devices 150 could also function as an electronic device 5101 (such as the FET). The dimensions of active optical waveguide devices 150 may differ from the dimensions of FETs, due to their relative functions. As such, virtually identical CMOS deposition and etching techniques and are used to fabricate the active optical waveguide device as electronic devices such as FETs. The dimensions and configurations of the active optical waveguide devices 150 and the electronic devices 5101 may differ, however, since they respectively control the flow of light and electricity. The silicon layer 160, that is configured to act as a portion of an optical waveguide 161, is also capable of acting as a channel in a FET. As such, the active optical waveguide device 150 shown in FIG. 5 can, indeed, provide electronic transistor action based on suitable electric biasing of the gate electrode 120, the first body contact well 107, and the second body contact well 109.

SOI (such as in SOI wafers 152) is a commonly used, heavily researched, and highly accepted technology for electronics using semiconductors. Modifying the already-accepted SOI platform for electronic circuits to allow for the concurrent fabrication and use of passive optical waveguide circuits 800 and active optical waveguide circuits 150 avoids the necessity of developing an entirely new technology for mass-fabrication of optical waveguide circuits.

In fully operational optical waveguide circuits, located on a single wafer 152, one or more active optical waveguide devices 150 may interface with one or more passive optical waveguide devices 800. Similarly, multiple active optical waveguide devices 150 may be optically coupled to permit light transfer therebetween. Moreover, multiple passive optical waveguide devices 800 may be optically coupled to permit light transfer therebetween. Active optical waveguide devices 150, passive optical waveguide devices 800, and electronic devices 5101 may be fabricated simultaneously on a single SOI wafer 152 as explained below. SOI technology is therefore highly applicable to integrated optical/electronic circuits.

Figure 5:
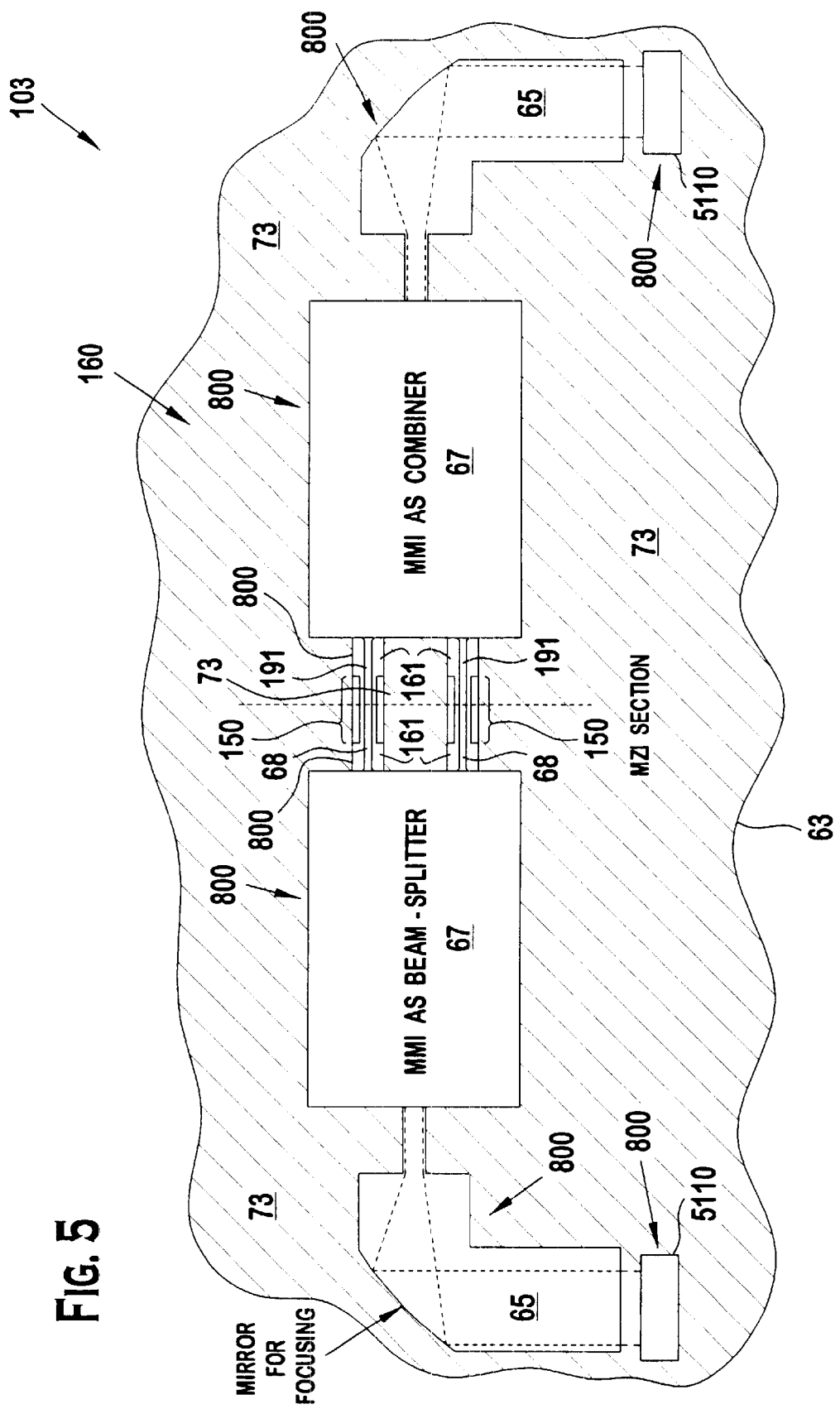
FIG. 5 shows a top view of an integrated optical device that includes a passive optical waveguide device and an active optical waveguide device or an electronic device.

FIG. 5 show a top view of a broken-away portion of an exemplary optical circuit 63 including a plurality of passive optical waveguide devices 800 and a plurality of active optical waveguide devices 150. A plurality of passive optical waveguide devices, illustrated as 800, transfer light to and receive light from active optical waveguide devices 150. The passive optical waveguide devices 800 illustrated in FIG. 6A include a light coupler 5110, a mirror 65, a pair of multiple mode interference (MMI) devices 67 that (from left to right) are configured to act respectively as a light splitter and a light combiner.

Figure 6A:
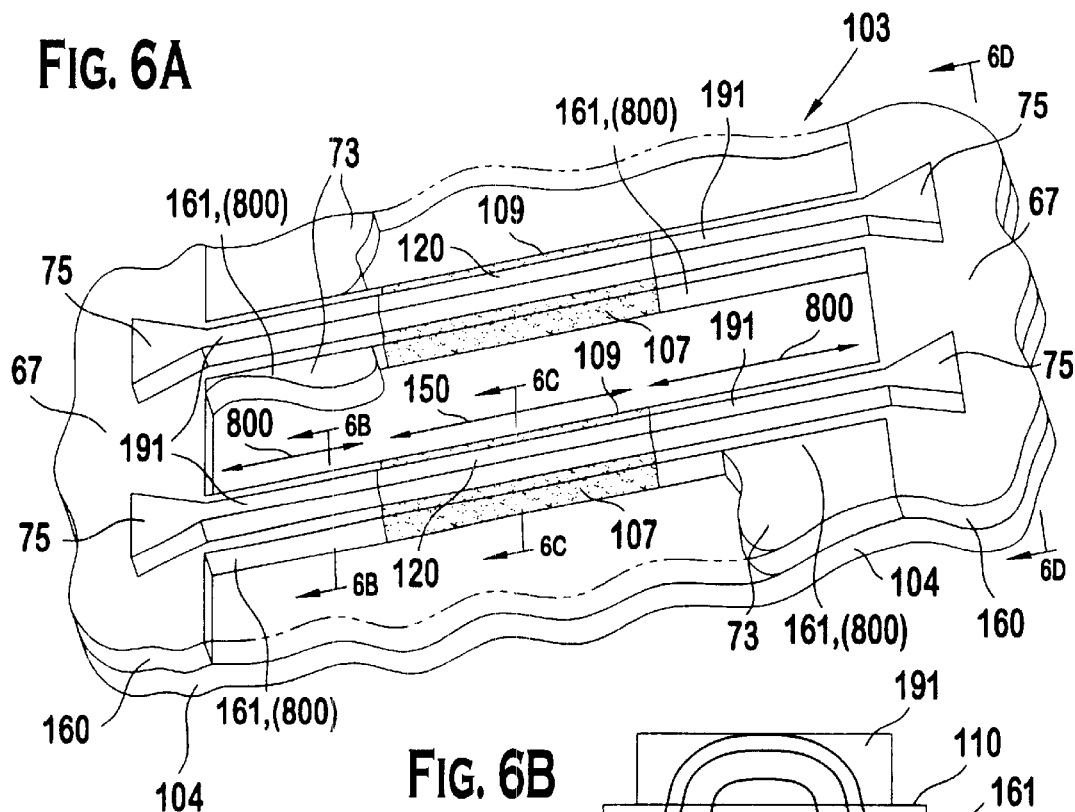
FIG. 6A shows an expanded view of a portion of the integrated optical device shown in FIG. 5.
Figure 6B:
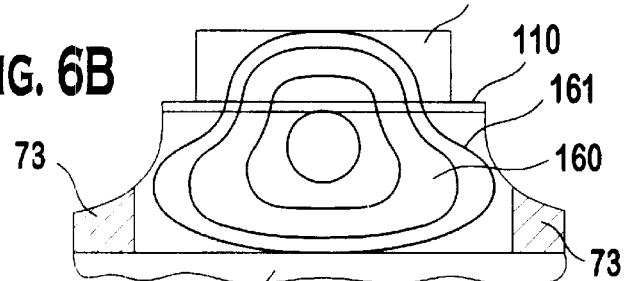
FIG. 6B shows a sectional view taken through sectional lines 6B—6B of FIG. 6A, illustrating a cross-sectional view of one embodiment of active optical waveguide device.
Figure 6C:
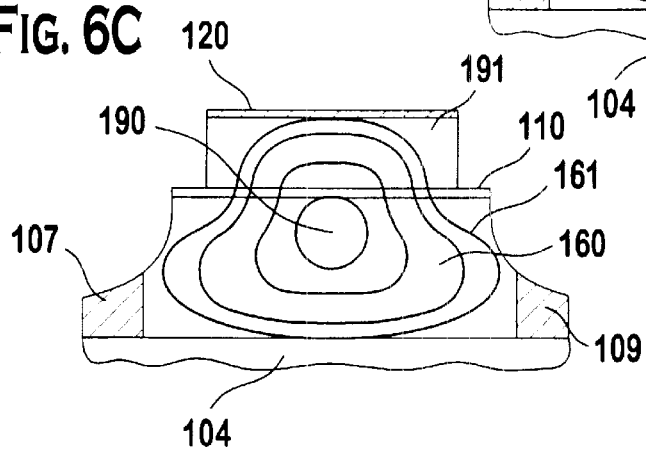
FIG. 6C shows a sectional view taken through sectional lines 6C—6C of FIG. 6A illustrating a cross sectional view of one embodiment of passive optical waveguide device.
Figure 6D:
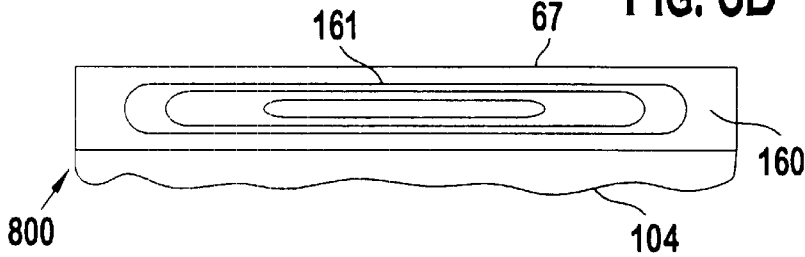
FIG. 6D shows a sectional view taken through sectional lines 6D—6D of FIG. 6A illustrating a cross sectional view of another embodiment of passive optical waveguide device.

FIG. 6A shows an expanded portion of the integrated optical/circuit 103 shown in FIG. 5, that includes both passive optical waveguide devices 800 and active optical waveguide devices 150. For example, FIG. 6B, which illustrates a portion of the polyloaded optical waveguide shown in FIG. 6A above, includes the silicon layer 160. The polyloaded optical waveguide shown in FIG. 6B is a passive optical waveguide device. FIG. 6C, by comparison, illustrates a portion of one of the modulators 68 shown in FIG. 6A including the silicon layer 160. The optical modulator 68 shown in FIG. 6C is an active optical waveguide devices 150, as illustrated in FIG. 4. Each modulator 68 extends between a pair of the optical waveguides 161. These modulators 68, that are arranged in parallel, act as an interferometer. FIG. 6D illustrates a cross sectional view of a portion of the MMI device 67 illustrated in FIG. 6A that is also a passive optical waveguide device 800, and includes only the silicon layer 160 that is configured to control the travel of light therein. By comparison, the silicon layer 160, the gate oxide layer 110, and the polysilicon layer 191 each can support at least a portion of the flow of light within the passive optical waveguide device 800.

The passive optical waveguide devices 800 described herein are formed by a progression of depositing, patterning (with a mask), and etching the silicon layer 160, the gate oxide layer 110, or the polysilicon layer 191. The different embodiments of passive optical waveguide devices 800 illustrated in FIG. 5 may further be sub-divided according to how they are fabricated. Certain passive optical waveguide devices 800 are fabricated by etching a portion of the silicon making up the silicon layer 160 in the SOI wafer 152. The etched regions of the silicon layer 160 is filled with air, glass (silicon dioxide), or another silicon layer optical insulator 73. The junction between silicon and the silicon layer optical insulator 73 creates a total internal reflectance (TIR) boundary 195, as described below, that acts to maintain light flowing within the silicon that remains in the silicon layer 160 following etching. This etching away portions of the silicon layer 160 is common in CMOS processing. For example, the silicon in FETs, and other active electronic devices, is often formed by etching away sacrificial material within the silicon layer 160 that falls outside the boundaries of the FETs. In those embodiments of passive optical waveguide devices that include only the silicon layer 160 such as illustrated in FIG. 6D (and devices 65 and 67 in FIG. 5), the silicon layer is etched in a manner that the etched surface provides the total internal reflection (TIR) boundary 195 to the light travelling within the optical waveguide 161 that contacts the etched surface.

Another embodiment of passive optical waveguide devices 800 is illustrated in FIGS. 3, 5, 6A, and 6B. In this embodiment of passive optical waveguide 800, the polysilicon layer 191 is deposited on the gate oxide 110 after the gate oxide has been deposited on the silicon layer 160. The deposited polysilicon layer 191 creates a region of altered effective mode index 190, as shown in FIG. 6B, that helps to define the optical waveguide 161. The optical waveguide 161, that defines where light flows, exists within the silicon layer 160, the gate oxide 110, and/or the polysilicon layer 191. In those embodiments of passive optical waveguide devices that include the polysilicon layer 191, the silicon layer 161, and the gate oxide layer 110, the silicon layer 160 may, or may not be, etched to still constrain the light to travel within the optical waveguide using the TIR boundary 195. In these embodiments of passive optical waveguide devices, the polysilicon layer 191 and the gate oxide layer 110 are configured to provide a modified, but static (unchanging with time) effective mode index.

It will be understood by those skilled in the art that the passive optical waveguide devices described below as having polysilicon layer 191, an etched silicon layer 161, and the gate oxide layer 110, could alternatively be formed without etching the silicon layer 161. Similarly, it will be understood by those skilled in the art that the passive optical waveguide devices described below as having polysilicon layer 191, an unetched silicon layer 161, and the gate oxide layer 110, could alternatively be formed with an etched silicon layer 161. The photonic guide function as at least partially provided by the region of static effective mode index in the passive optical waveguide device 800 (or the region of altered effective mode index in an active optical waveguide device 150) may be determined from the cross-section of the polysilicon layer 191 as well as the upper semiconductor layer (such as the Si layer on an SOI substrate.)

Another embodiment of passive optical waveguide devices 800, shown in FIG. 5, includes the light couplers 5110. Light couplers 5110 are used to couple light into, or couple light out of, the silicon layer 160. The light couplers 5110 can be either etched in the silicon layer 160 of the SOI wafer 152, or alternatively affixed as a separate object to the silicon layer. Techniques to fabricate, and techniques to use the light couplers 5110 as they relate to passive optical waveguide devices are described herein.

Active optical waveguide devices 150, such as illustrated in FIGS. 4, 5, and 6C, include a region where the effective mode is varied during operation of the device by, e.g., applying a voltage to an electrode portion such as the gate electrode 120 or otherwise altering an external parameter during operation of the device. Passive optical waveguide devices 800 (such as those shown in FIGS. 3, 6B, and 6D) include a region where the effective mode index remains constant, or static, over the life of the device. That is, passive optical waveguide devices 800 do not include regions where the effective mode index is varied during operation through alteration of a control voltage or other external parameter. As illustrated in FIG. 6B, adiabatic tapers 75 are located at both of the ends of each polysilicon layer 191. The adiabatic tapers 75 act to converge light travelling toward the passive optical waveguide device (in this instance, the optical waveguides 161).

FIG. 6E illustrates the structural similarity between the modulators 68, which are active optical waveguide devices, and optical waveguides, that are passive optical waveguide devices 800. The only structural difference is that the active optical waveguide device 150 includes the body contact wells 107, 109. The addition of these body contact wells 107, 109, that permit operation as gate electrodes and source electrodes, act to alter the effective mode index within the modulator 68. By comparison, the optical waveguides 161 (which are passive optical waveguide devices), lack the body contact wells 107, 109 and the associated electrodes. Therefore, the effective mode index remains static or substantially unchanged over time in passive optical waveguide devices, except for variations due to degradation of the device over time.

Thin optical waveguides are associated with silicon layers 160 having a thickness of less than or equal to $10\mu$. Using silicon layers 160 with a thickness less than $10\mu$ (such as thin SOI waveguides) has many benefits. Thin SOI silicon layers 160 limit the vertical regions in which light can diffract, and localize the light to a relatively narrow optical space. Optical waveguides 161 including such thin silicon layers 160 are relatively easy to precisely fabricate. Planar lithography techniques (such as used in deposition and etching processes) can be used to fabricate thin SOI devices.

Any optical waveguide 161 supports the transmission of light for one or more modes (light wavelengths at which the optical waveguide transmit light). The concepts described herein relative to the optical waveguide devices 100 apply equally well to any mode of light within the optical waveguide 161. Therefore, a multi-mode optical waveguide 161 can model a single optical device having multiple light modes. The physical phenomena described for the single mode of single mode waveguides 161 pertains to each mode in multi-mode optical waveguides 161.

The following sections relate to the various types of optical waveguide devices that can be used to provide optical and electronic/optical functionality, and to indicate the close functional and structural relationship of certain embodiments of the passive optical waveguide devices 800, active optical waveguide devices 150, and electronic devices 5101. The "Active Optical Waveguide Device" portion of this disclosure describes different embodiments of the active optical waveguide devices 150. The "Passive Optical Waveguide Device" portion of this disclosure describes different embodiments of passive optical waveguide devices 800. The structure and operation of many embodiments of passive optical waveguide devices are then described. The techniques of manufacture of many embodiments of active optical waveguide devices 150 and passive optical waveguide devices 800 are described. The passive optical waveguide devices 800 can be operationally associated (and fabricated simultaneously) with the active optical waveguide devices 150. The optical waveguide circuits 100 can be fabricated using standard (CMOS) fabrication techniques.

II. Active Optical Waveguide Devices

This section describes the structure and operation of active optical waveguide devices 150 as illustrated generally in FIGS. 4 and 6C. The active optical waveguide devices 150 can be fabricated using CMOS fabrication techniques. Multiple ones of the active optical waveguide devices 150 and passive optical waveguide circuits 800 can be integrated into a single integrated optical waveguide circuit. Examples of these integrated optical waveguide circuits include an arrayed waveguide grating (AWG), a dynamic gain equalizer, and a large variety of integrated optical waveguide circuits. Such optical waveguide devices 100 (both active and passive) and integrated optical waveguide circuits can be made using existing CMOS and other semiconductor fabrication technologies.

Figure 7C:
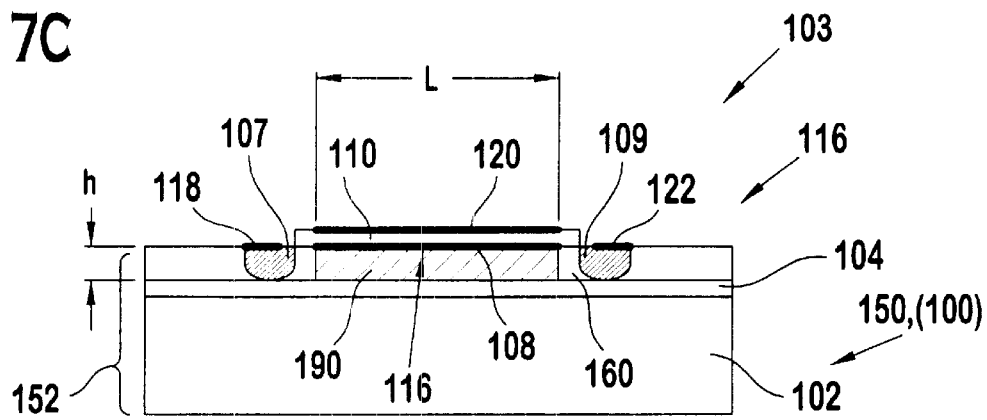
FIG. 7C shows a front cross-sectional view of the active optical waveguide device of FIG. 7A.
Figure 8:
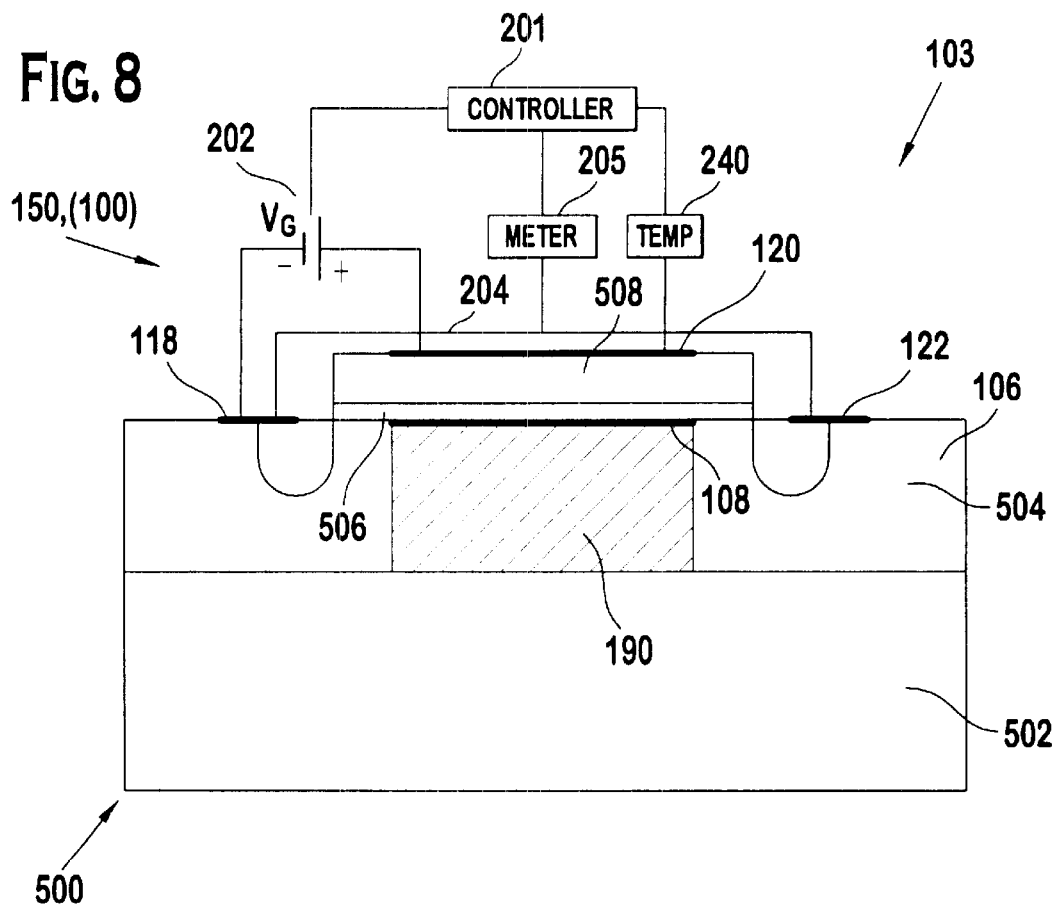
FIG. 8 shows a front view of another embodiment of an active optical waveguide device including a high electron mobility transistor (HEMT)

Different embodiments of active optical waveguide devices 150 may be located in: a) a Field Effect Transistor (FET) structure as shown in FIGS. 7A to 7C; b) a High Electron Mobility Transistor (HEMT) 500 as shown in FIG. 8; or c) other similar active optical waveguide devices 150 in which an electric current can be applied adjacent to the silicon layer 160 to alter the free carrier concentration in a portion of the silicon layer 160.

In the embodiment of FETs applied to FIGS. 7A to 7C, a substantially constant electrical potential conductor 204 as shown in FIG. 7B extends between the source body contact electrode 118 and the drain body contact electrode 122 to maintain the two electrodes 118, 122 at a common voltage. Holding the source electrode 118 of a FET at the same potential as the drain electrode 122 causes the FET to functionally operate as a MOSCAP. The term "body contact electrode" describes either the common potential source electrode and drain electrode in the FET.

The application of the voltage to between the gate electrode 120 and the body contact electrodes 118, 122 predominantly changes the distribution of free-carriers (either electrons or holes) near the boundary between the silicon layer 160 and the gate oxide layer 110 (which is an optical and electrical insulator). As sufficient voltage is applied between the gate electrode 120 and the body contact electrode(s) 118, 122 causes the transistor action in field effect transistors, and also actuates an optical action in the active optical waveguide devices 150 as described herein. Passive optical waveguide devices 800, as described below, do not include operational gate electrodes 120 or the body contact electrodes 118, 122, and as such do not rely on a change in free carrier concentration to effect operation. Two-dimensional electron gas or 2DEG included in MOSCAPs represent essentially surface localized changes in the free carrier distributions. In a FET structure, for example, an increase in the application of the bias leads consecutively to accumulation of charges of the same polarity as the semiconductor silicon layer 160, i.e. holes in a p-type and electrons in n-type, depletion, and finally inversion. In 2DEGs 108, the polarity of the semiconductor is opposite the type of the predominant free carriers, (i.e. electrons in p-type or holes in n-type). In a High Electron Mobility Transistor (HEMT) 500 (shown in FIG. 6), the electron (hole) distribution formed just below the surface of the optical (and electric) insulator 104 is referred to as 2DEG 108 because of particularly low scattering rates of charge carriers. For the purposes of clarity, all of the above shall be referred to as 2DEG signifying a surface localized charge density change due to application of an external bias.

The silicon layer 160 provides the ability to change the density of the 2DEG 108 by varying the voltage applied between the gate electrode 120 and the body contact electrodes 118, 122. The 2DEG 108 is proximate the light travel path, near the boundary between the silicon layer 160 and the gate oxide layer 110. This change in free-carrier distribution results from application of the potential between the insulated gate electrode 120 and one or a plurality of body contact electrodes 118, 122 connected to the body of the semiconductor. The propagation constant within the optical waveguide 161, and the optical properties, (e.g., phase or amplitude) of light guided through the optical waveguide 161, vary as the density of the free carriers changes. Field-effect transistor action (i.e., rapid change in 2DEG as a function of voltage of the gate electrode 120) controls the properties of light travel in the optical waveguide 161 and integrates electronic and optical functions on one substrate 102. Therefore, traditional FET electronic concepts can provide active optical functionality in the optical waveguide device 100. The FET portion 116 is physically located above, and affixed to, the silicon layer 160 using such semiconductor manufacturing techniques as epitaxial growth, chemical vapor deposition, physical vapor deposition, etc.

The field effect transistor (FET) portion 116 shown in FIGS. 7A to 7C operationally includes a portion of the optical waveguide 161. One embodiment of the silicon layer 160 is proximate to, and underneath, the gate electrode 120 of the FET portion 116. The FET portion 116 includes a first body contact electrode 118 (e.g. source), the gate electrode 120, and a second body contact electrode 122 (e.g. drain). A voltage can be applied by e.g., a voltage source 202 between pairs of the electrodes 118, 120, and 122. To control the active optical waveguide device 150, the voltage level of the gate electrode 120 is varied. The 2DEG 108 is formed at the junction between the silicon layer 160 and the gate oxide layer 110. In some embodiments, the gate electrode 120 is biased relative to the combined first and second body contact electrodes 118, 122.

The variation in voltage level changes the propagation constant of at least a portion of the optical waveguide 161. The changes in the index profile of the optical waveguide 161 are effected by the location and shapes of all the electrodes 118, 120, 122. The density of the 2DEG generally follows the contour (shape) of the gate electrode 120. The shape of the gate electrode 120 is "projected" as a region of altered effective mode index 190 into the silicon layer 160. The value of the propagation constant may vary at different locations within the optical waveguide 161. In this disclosure, the region of altered effective mode index 190 is considered that region of the optical waveguide 161 where the value of the effective mode index is changed by application of voltage to the gate electrode 120. The term "region of altered effective mode index" is applied to active optical waveguide devices 150 because the value of the effective mode index can be altered by varying the electric signals applied to the different electrodes 118, 120, 122. The region of altered effective mode index 190 typically extends through the vertical height of the optical waveguide 161. Changing the effective mode index in the region of altered effective mode index usually results in a change in the propagation constant in the region of altered effective mode index. Such changing of the propagation constant results in phase modulation of the light passing through that device. In FIGS. 7A to 7C and 8, phase modulation occurs in the region of altered effective mode index 190, indicated in crosshatching. Different embodiments of gate electrodes 120 can have rectangular or non-rectangular shapes in a horizontal plane. The different embodiments of the active optical waveguide device 150 perform such differing optical functions as optical phase/amplitude modulation, optical filtering, optical deflection, optical dispersion, etc.

FIGS. 7A to 7C respectively show a side cross-sectional, top, and front cross-sectional view of one embodiment of an optical waveguide device 100. FIG. 7A shows prism couplers 112, 114 coupled to the planar silicon layer 160; the silicon layer 160 being bounded by low-index insulating materials. Other well-known types of couplings such as gratings, tapers, and butt couplings may be coupled to either end of the silicon layer 160. Light passing from the input prism coupler 112 (or other input port) to the output prism coupler 114 (or other output port) follows optical path 101 as shown in FIG. 7A.

The gate electrode 120 is directly above the light path in the silicon layer 160. The low-index dielectric of the gate oxide layer 110 acts as an electrical insulator and an optical insulator that separates the gate electrode 120 from the silicon layer 160. This embodiment of active optical waveguide device 150 is a FET structure with the body contact electrodes 118, 122 forming a symmetric structure typically respectively referred to as "source" and "drain" in FET terminology. A substantially constant potential conductor 204 equalizes the voltage level between the first body contact electrode 118 and the second body contact electrode 122.

In many embodiments, the channel normally associated with electronic functions of the FET is considered, and acts as, the optical waveguide 161. Examples of electronic-type FETs that can be used in their modified form as FET portions 116 in optical waveguide devices 100 include a metal-oxide-semiconductor FET (MOSFET), a metal-electrical insulator-semiconductor FET (MISFET), a metal semiconductor FET (MESFET), a modulation doped FET (MODFET), a high electron mobility transistor (HEMT), and other similar transistors. The term "body contact electrodes" alternatively describes the substantially common potential source body contact electrode 118 and drain body contact electrode 122 in the FET-like structure 116 (FIG. 7C).

The silicon layer 160 (which may be doped) has a thickness h, and is sandwiched between the optical insulator layer 104 and the gate oxide layer 110. The first optical insulator layer 104 is typically formed from silicon dioxide (glass) or any other optical and electrical insulator commonly used in semiconductors (for example SiN). The optical insulator layer 104 and the gate oxide layer 110, where located, also acts to reflect and confine the light using total internal reflection of the light traversing the optical waveguide 161.

FIG. 7B shows one embodiment of a voltage source configuration that biases the voltage of the optical waveguide device 100 by using a voltage source 202 and the substantially constant electrical potential conductor 204. The substantially constant potential conductor 204 acts to tie the voltage level of the first body contact electrode 118 to the voltage level of the second body contact electrode 122. The voltage source 202 biases the voltage level of the gate electrode 120 relative to the combined voltage level of the first body contact electrode 118 and the second body contact electrode 122.

To apply a voltage to the gate electrode 120, a voltage source 202 applies an AC voltage $v_g$ between the gate electrode 120 and the combined first body contact electrode 118 and second body contact electrode 122. The AC voltage $v_g$ may be either a substantially regular (e.g. sinusoidal) signal or an irregular signal. An example of an irregular AC voltage $v_g$ is a digital data transmission signal. In one embodiment, the AC voltage $v_g$ is the information-carrying portion of the signal. The voltage source 202 can also apply a DC bias $V_g$ to the gate electrode 120 relative to the combined first body contact electrode 118 and second body contact electrode 122. Depending on the instantaneous value of the $V_g$, the concentration of the 2DEG will accumulate, deplete, or invert as shown by the HEMT 500 shown in FIG. 8. In one embodiment, the DC bias $V_g$ is the signal that compensates for changes in device parameters. A combined DC bias $V_g$ and AC voltage $v_g$ equals the total voltage $V_G$ applied to the gate electrode 120 by the voltage source 202. It will be understood from the description above that modulation of the AC voltage $v_g$ can thus be used to effect, for example, a corresponding modulation of light passing through the optical waveguide 161.

The voltage potential of the first body contact electrode 118 is tied to the voltage potential of the second body contact electrode 122 by the substantially constant potential conductor 204 as shown in the embodiments of active optical waveguide device 150 in FIGS. 7B and 8. Certain embodiments of the substantially constant potential conductor 204 as shown in FIG. 8 include a meter 205 (e.g. a micrometer) to measure the electrical resistance of the gate electrode 120 from the first body contact electrode 118 to the second body contact electrode 122. The constant potential conductor uses the term "substantially" because the meter 205 may generate some relatively minor current levels in comparison to the operating voltage and current levels applied to the optical waveguide device 100. In one embodiment, minor current levels measure the resistance of the gate electrode 120. The current level produced by the meter 205 is relatively small since the voltage (typically in the microvolt range) of the meter is small, and the electrical resistance of the silicon layer 160 is considerable (typically in the tens of ohms).

One embodiment of the optical waveguide devices 100 can be constructed on so-called silicon on insulator (SOI) technology that is used in the semiconductor electronics field. In SOI electronic devices, the vast majority of electronic transistor action in SOI transistors occurs on the top few microns of the silicon. Therefore optically, the material below the top few microns of the silicon layer 160 does not have to transmit light. While still following basic SOI rules, the silicon layer below the top few microns could be formed instead from the optical insulator 104 such as a glass (e.g., silicon dioxide). The SOI technology is based on providing a perfect silicon wafer formed on the gate oxide layer 110 which is an optical (and electrical) insulator such as glass (silicon dioxide), that often starts two to five microns below the upper surface of the silicon. The gate oxide layer 110 electrically isolates the upper two to five microns of silicon from the rest of the silicon.

The inclusion of the optical (electrical) insulator 104 in thin SOI electronic devices 5101 limits the large number of electric paths that can be created through a thicker silicon layer 160. Therefore, forming optical waveguide devices 160 on thin SOI wafers makes SOI transistors and active optical waveguide devices 150 operate faster and consume less power.

The electrical resistance of the gate electrode 120 is a function of such parameters as voltage of the gate electrode, temperature, pressure, device age, and device characteristics. The voltage (e.g. the AC voltage or the DC voltage) applied to the gate electrode 120 can be varied to adjust the electrical resistance of the gate electrode 120. Such variations in the electrical resistance of the gate electrode can compensate for temperature, pressure, device age, and/or other operating parameters of the optical waveguide device 100.

As the temperature of the optical waveguide device 100 varies, the DC bias $V_g$ applied to the gate electrode 120 of the optical waveguide device 100 is adjusted to compensate for the changed temperature. Other parameters (pressure, device age, device characteristics, etc.) can be compensated for in a similar manner as described for temperature (e.g. using a pressure sensor to sense variations in pressure).

Figure 9:
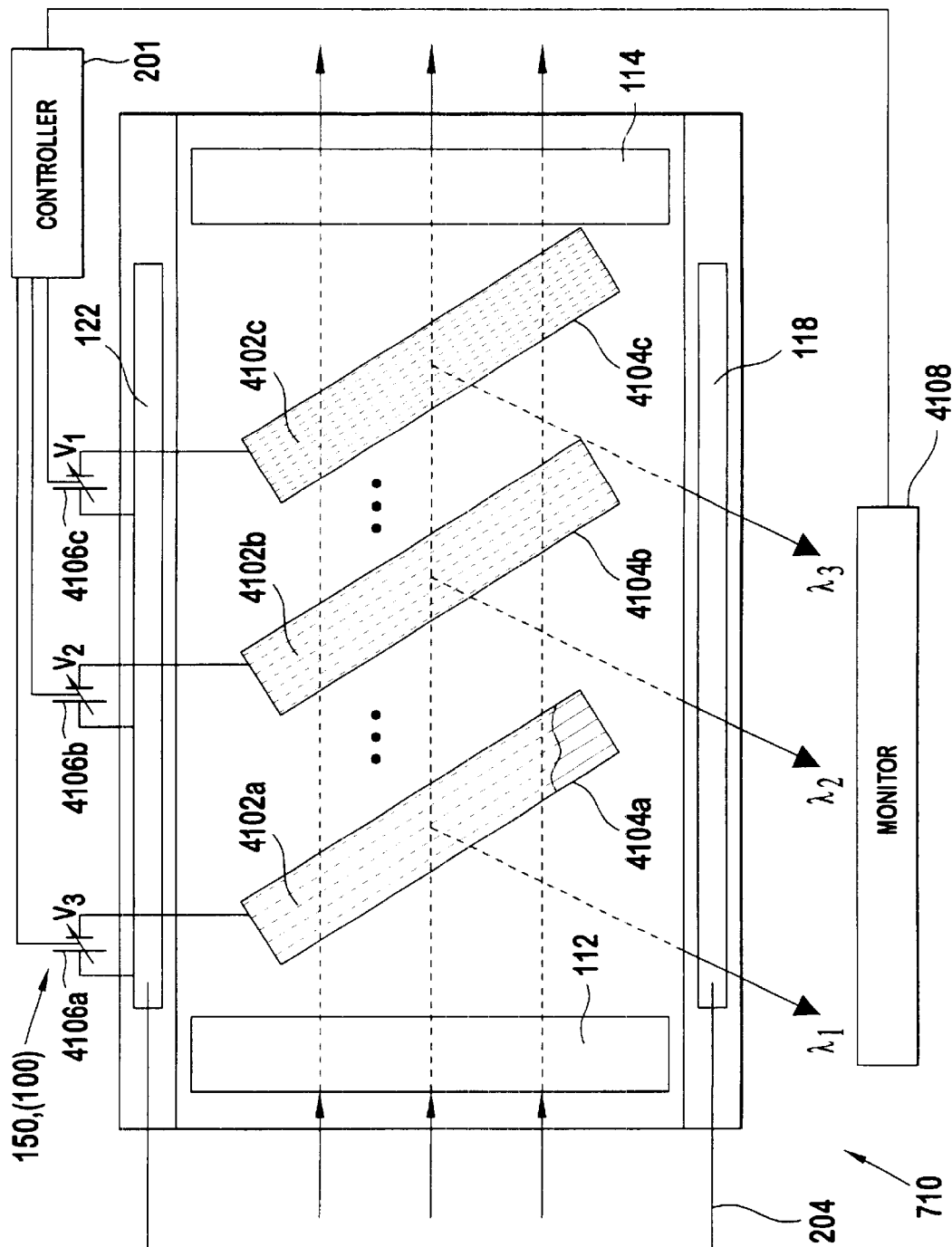
FIG. 9 is a top view of one embodiment of active optical waveguide devices formed on the FET as illustrated in FIGS. 7A to 7C.
Figure 10:
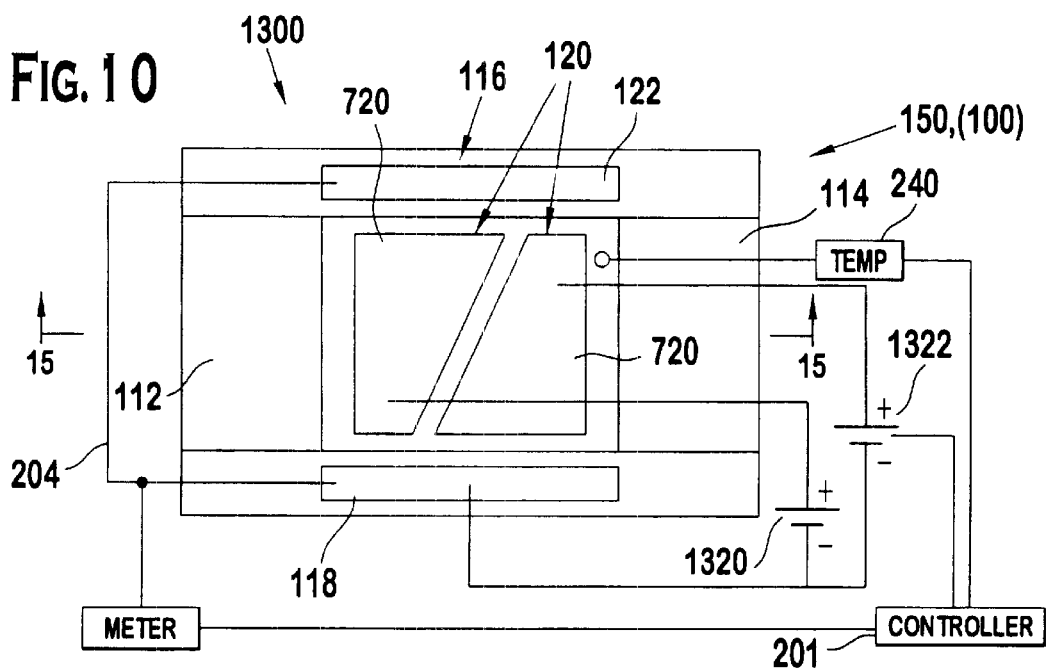
FIG. 10 is a top view of another embodiment of active optical waveguide devices formed on the FET as illustrated in FIGS. 7A to 7C.
Figure 11:
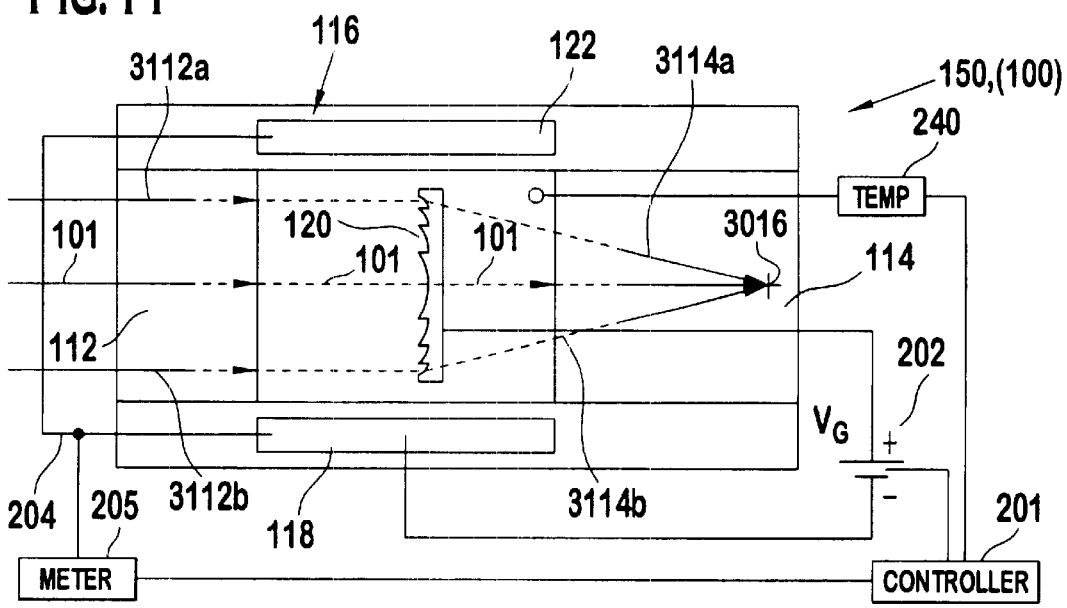
FIG. 11 is a top view of yet another embodiment of active optical waveguide devices formed on the FET as illustrated in FIGS. 7A to 7C.

FIGS. 9, 10, and 11 illustrate three embodiments of the active optical waveguide device 150 that include the FET shown in FIGS. 7A, 7B, and 7C, whose optical function differs from each other. The different optical function of the active optical waveguide devices 150 shown in FIGS. 7B, 8, 9, 10, and 11 differ from each other based on the shape of the gate electrode 120. The embodiment of active optical waveguide device 150 shown in FIGS. 7A to 7C, for example, functions as a modulator since the gate electrode 120 is rectangular. The rectangular gate electrode 120 extends across the width of the silicon layer 160, and has a substantially equal axial length, as taken in a direction parallel to the optical waveguide 161 across the entire silicon layer. The shape of the gate electrode 120 projects the 2DEG region within the silicon layer 160. Since the gate electrode 120 has a substantially rectangular configuration, the gate electrode 120 alters the propagation constant or the effective mode index within the silicon layer 160 to be substantially uniform across the width of the silicon layer 160. In this configuration, the active optical waveguide device acts as a modulator since the propagation constant of light travelling in the optical waveguide 161 is substantially uniform. Varying the electric voltage level applied to the gate electrode 120 alters the effective mode index of the 2DEG region, and alters the propagation constant of that portion of the silicon layer 160 corresponding to the 2DEG region.

Changing the shape of the gate electrode 120 alters the shape of the 2DEG region 108 projected within the silicon layer 160. For example, FIG. 9 illustrates the active optical waveguide device 150 having a plurality of gate electrodes 4102a, 4102b, and 4102c. The grate-like configuration of the gate electrodes 4102a, 4102b, and 4102c differs from the substantially rectangular gate electrode 120 shown in FIG. 7B. The grating-shaped gate electrodes 4102a, b, c therefore project grating-shaped 2DEG regions 108 into the silicon layer 160. The grating-shaped 2DEG regions 108 within the silicon layer 160 have a different effective mode index (and different propagation constant) than the portions of the silicon layer 160 that are located outside of the 2DEG region. The projection of such grating-shaped regions of altered propagation constant within the optical waveguide 161 causes the embodiment of active optical waveguide device 150 as shown in FIG. 9 to function to deflect various wavelengths of light in a similar manner to known optical gratings, depending on the voltage applied to electrodes 120. Only some percentage of light having wavelengths that corresponds to the spacing between the grating-shaped regions of altered propagation constant within the optical waveguide 161 will constructively interfere to produce the deflected beam. Light having wavelengths that corresponds to the spacing between the grating-shaped regions of altered propagation constant will destructively interfere, and will not factor in the deflected beam.

FIG. 10 illustrates one embodiment of the active optical waveguide device 150 having a gate electrode 120 shaped as a pair of optical prisms 720. U.S. patent application Ser. No. 09/859,239 (incorporated by reference below) shows one embodiment of active optical waveguide device having the gate electrode shaped as a pair of optical prisms. Each optical prism-shaped gate electrode 720 in FIG. 7B, therefore, when actuated projects an optical prism-shaped 2DEG region 108 into the silicon layer 160. The optical prism-shaped 2DEG region 108 within the silicon layer 160 has a different effective mode index (and different propagation constant) than the portions of the silicon layer 160 that are located outside of the 2DEG region. The projection of such an optical prism-shaped region of altered effective mode index within the silicon layer 160 causes the embodiment of active optical waveguide device 150 as shown in FIG. 7B to function to divert light through a prescribed angle. Active optical waveguide devices 150 including the gate electrode 120 shaped as an optical prism 720 may act as an optical switch.

FIG. 11 illustrates the active optical waveguide device 150 having the gate electrode 120 shaped as an optical lens 730. U.S. patent application Ser. No. 09/859,647 (incorporated by reference below) shows one embodiment of active optical waveguide device having the gate electrode shaped as a lens. The optical lens-shaped gate electrode 120 therefore projects an optical lens-shaped 2DEG region 108 into the silicon layer 160. The optical lens-shaped 2DEG region 108 within the silicon layer 160 has a different effective mode index (and different propagation constant) than the portions of the silicon layer 160 that are located outside of the 2DEG region. The active optical waveguide device 150 as shown in FIG. 7C projects the optical lens-shaped region of altered effective mode index within the silicon layer 160 to focus light to a prescribed focal point 3016.

Figure 12:
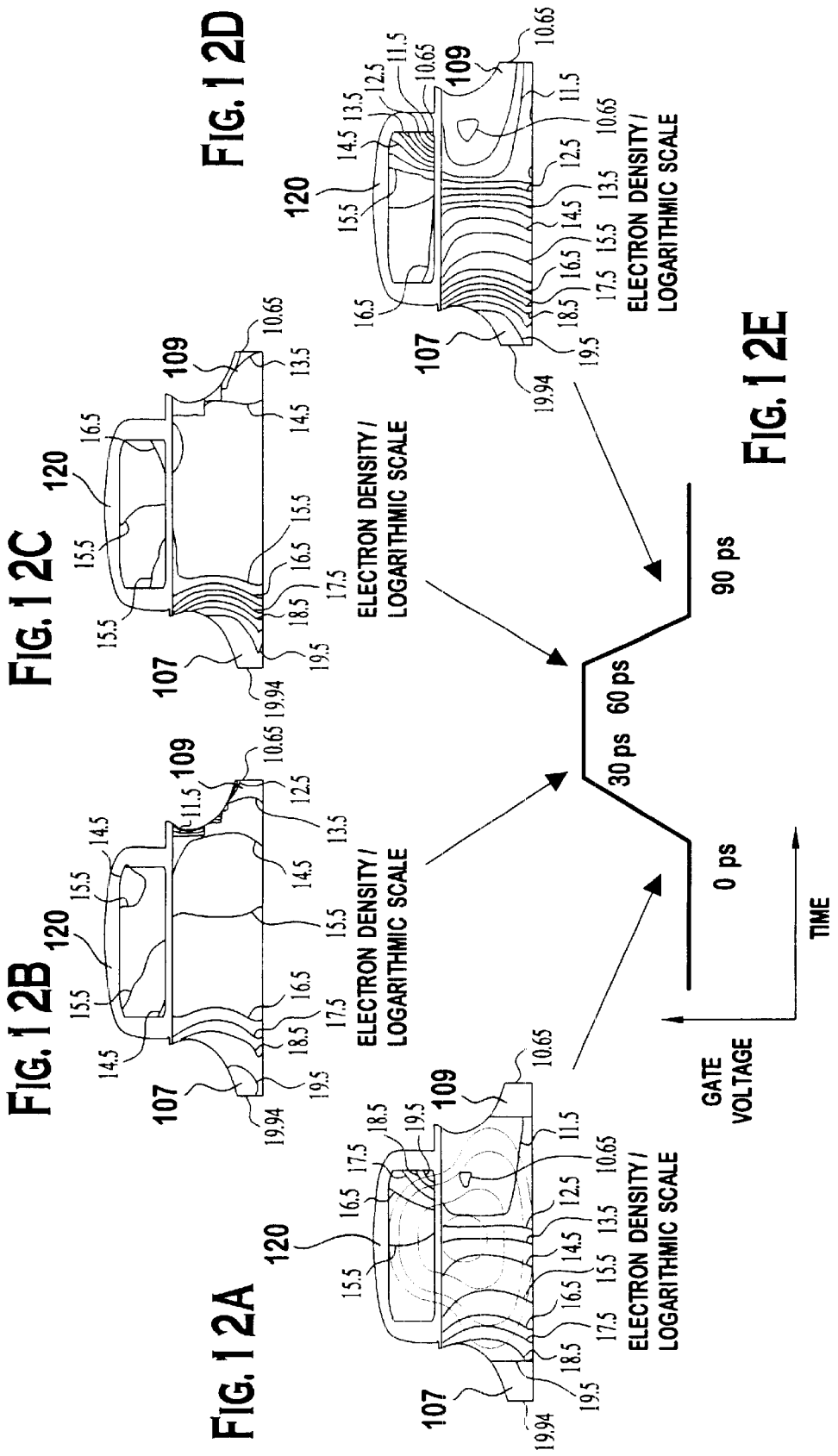
FIGS. 12A to 12E illustrate the electron density progression of one embodiment of active optical waveguide device as the gate voltage varies.

FIGS. 12A to 12E illustrate how effective mode index in active optical waveguide devices vary as different charges are applied to the body contact electrodes 107, 109 as well as the gate electrodes. FIG. 12E illustrates a progression of different voltages that are applied between the gate electrode 120 and the body contact electrode(s). The locations that each ones of FIGS. 12A to 12D are located across the voltage plot of FIG. 12E are illustrated by the arrows. FIGS. 12A to 12D illustrate that as different voltages are applied between the gate electrode 120 and the body contact electrode(s), a different electronic profile (indicated by the contours in each figure) is established across the optical waveguide 161. As such, the active optical waveguide device 150 responds to electronic input in a manner that alters the effective mode index within the region of altered effective mode index of the optical waveguide, and therefore can alter how light flows through the optical waveguide.

Figure 13:
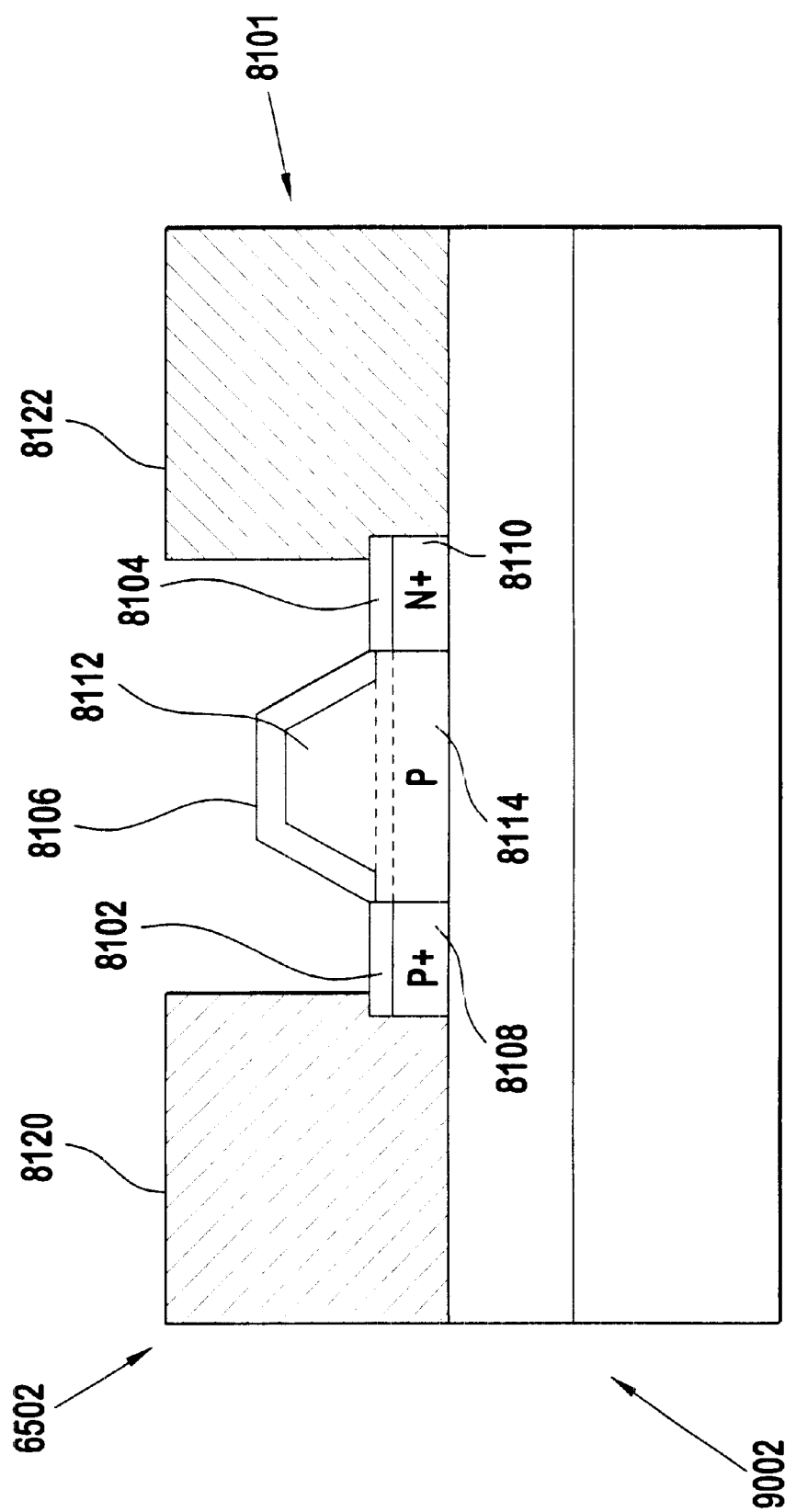
FIG. 13 shows another embodiment of active optical waveguide device.

FIG. 13 shows another embodiment of hybrid active electronic and optical circuit 6502 that is configured either as a diode or as a field effect transistor. The field effect transistor 8101 is configured with the source contact 8102, a drain contact 8104, and a gate contact 8106. Underneath the source contact 8102, there is a P+ region 8108 that is biased by electric voltage being applied to the source 8102. Underneath the drain 8104, there is a N+ region 8110 that is biased by a voltage applied to the drain 8104. Underneath the gate 8106, there is a loaded optical structure 8112, and below the loaded optical structure 8112 there is a P region 8114. Light beams are modulated by passing current via the source 8102 and the drain 8104 through a p-n junction established in the diode. Thus, free carriers from the injected current are used to change the effective mode index in the loaded optical structure 8112 and the P region 8114, that together act as a waveguide. The phase and/or amplitude of light in the waveguide can thus be varied based on the applied voltage. An electrical conductor 8120 is electrically coupled to source 8102. An electrical conductor 8122 is electrically coupled to drain 8104. The use of a specific doping is illustrative, but not limiting in scope. For example, an inversely doped device will operate similarly provided that the polarities are reversed, as such, the simple diode 6502 would operate similarly if the region 8108 was doped N+, the region 8114 was doped N, the region 8110 was doped P+ while the polarity of electrical conductors 8120 and 8122 were reversed from their present state. If the source 8112 and the drain 8104 are electrically connected together, then the hybrid active electronic and optical circuit device 6502 acts a diode instead of a field effect transistor.

Figure 14:
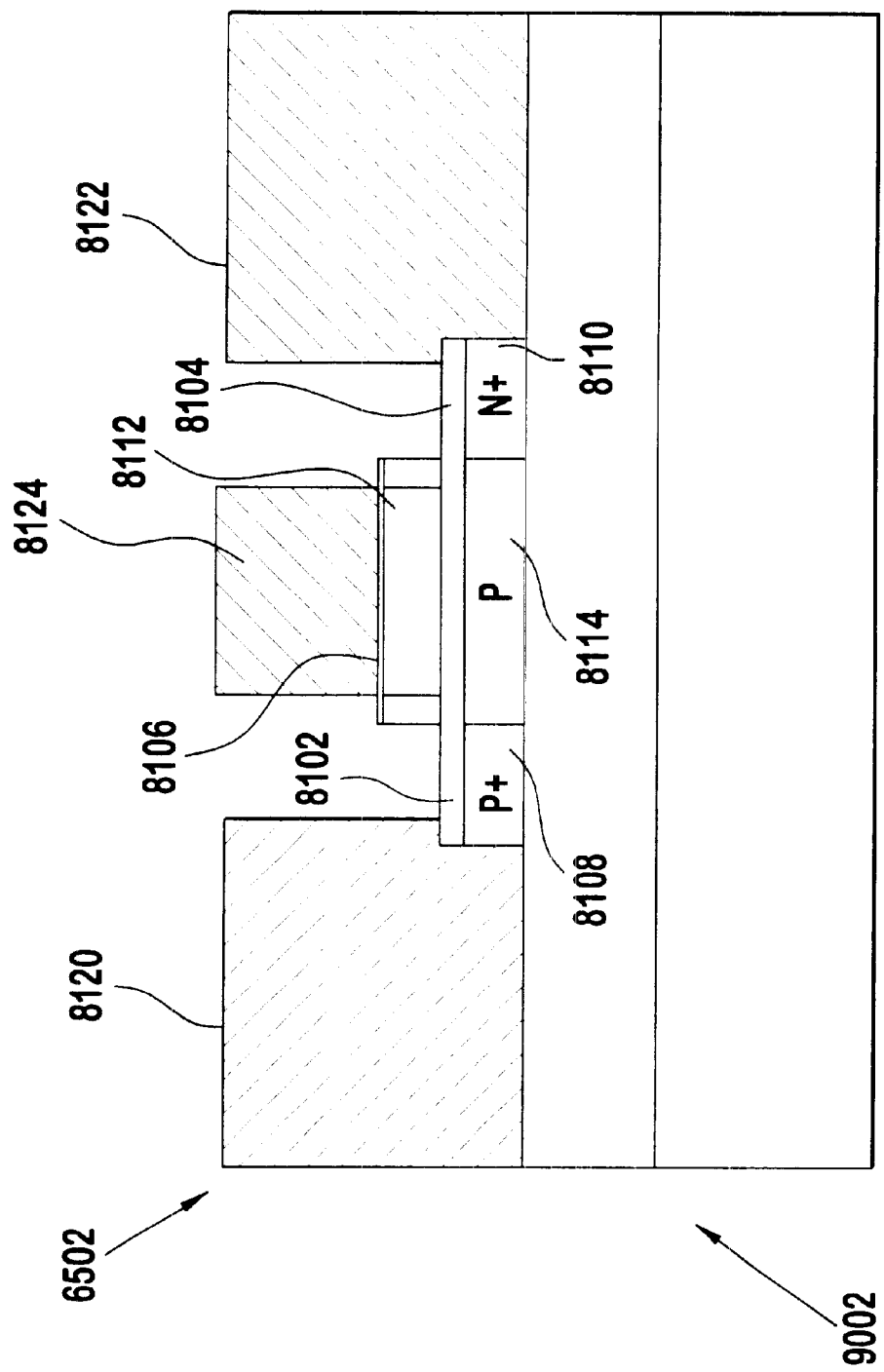
FIG. 14 shows yet another embodiment of active optical waveguide device.
Figure 15:
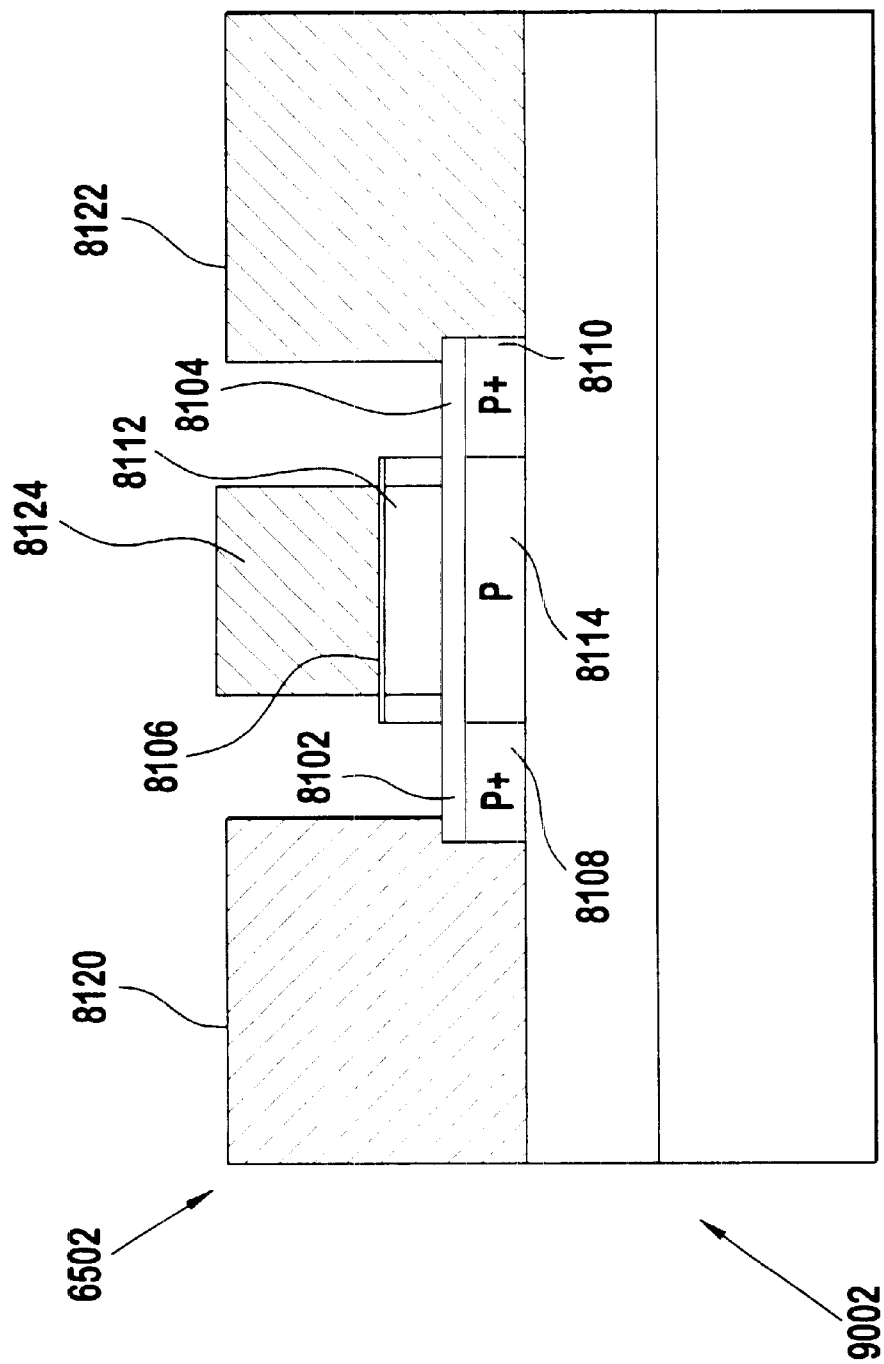
FIG. 15 shows still another embodiment of active optical waveguide device.

FIG. 14 shows one embodiment of field-plated diode 9002 that differs from the embodiment of diode shown in FIG. 13 primarily by the addition of an additional electrical conductor 8124 that is electrically connected to the gate 8106. The field-plated diode 9002 free carrier characteristics can be altered by applying a potential to the gate 8106 via the electrical conductor. Light can therefore be modulated. The gate 8106 can be configured as viewed from above in a similar manner as the embodiments of active optical waveguide devices shown in FIGS. 7A to 7C and 8 by appropriately shaping the gate electrode. A large variety of transistor/diode devices can therefore be utilized as the active electronic portion of one embodiment of the hybrid active electronic and optical circuit by similarly slight modifications. For example, FIG. 15 shows one embodiment of a MOSFET 9101 (and if the source and drain are electrically connected, a MOSCAP). Note that the doping of region 8110 is the only structural difference between FIGS. 14 and 15. Such devices are within the intended scope of the present invention.

Optically, light is guided perpendicular to the plane of the paper in FIG. 13, in a loaded optical structure 8112. The structure of glass and polysilicon shown is an example in which the hybrid active electronic and optical circuit 6502 creates a higher mode index in the center of the loaded optical structure 8112, in order to ease lateral confinement of the light flowing within the waveguide defined by the loaded optical structure 8112. This represents one embodiment of a lower waveguide.

Considerable variations in proportions may be applied to light traveling in active optical waveguide devices 150 within the optical waveguide 161 as illustrated in FIGS. 7A, 7B, 7C, 8, 9, 10, and 11. Much of the variation in the functionality relates to altering the effective mode index and propagation index within the region of altered effective mode index 190 within the optical waveguide 161. Patent applications owned by the assigned of the present invention and that describe these and other active optical waveguide devices 150 or active optical waveguide circuits include: a) U.S. patent application Ser. No. 09/859,693, filed May 17, 2001, entitled "Electronic Semiconductor Control of Light in Optical Waveguide", to Shrenik Deliwala (incorporated herein by reference in its entirety); b) U.S. patent application Ser. No. 09/859,297, filed May 17, 2001, entitled "Optical Modulator Apparatus and Associated Method", to Shrenik Deliwala (incorporated herein by reference in its entirety); c) U.S. patent application Ser. No. 09/859,647, filed May 17, 2001, entitled "Optical Lens Apparatus and Associated Method", to Shrenik Deliwala (incorporated herein by reference in its entirety); d) U.S. patent application Ser. No. 09/859,239, filed May 17, 2001, entitled "Optical Deflector Apparatus and Associated Method", to Shrenik Deliwala (incorporated herein by reference in its entirety); e) U.S. patent application Ser. No. 09/859,338, filed May 17, 2001, entitled "Optical Filter Apparatus and Associated Method", to Shrenik Deliwala (incorporated herein by reference in its entirety); f) U.S. patent application Ser. No. 09/859,279, filed May 17, 2001, entitled "Dynamic Gain Equalizer Method and Associated Apparatus", to Shrenik Deliwala (incorporated herein by reference in its entirety); g) U.S. patent application Ser. No. 09/859,769, filed May 17, 2001, entitled "Self-Aligning Modulator Method and Associated Apparatus", to Shrenik Deliwala (incorporated herein by reference in its entirety); h) U.S. patent application Ser. No. 09/859,321, filed May 17, 2001, entitled "Programmable Delay Generator Apparatus and Associated Method", to Shrenik Deliwala (incorporated herein by reference in its entirety); i) U.S. patent application Ser. No. 09/859,663, filed May 17, 2001, entitled "Polarization Control Apparatus and Associated Method", to Shrenik Deliwala (incorporated herein by reference in its entirety); j) U.S. patent application Ser. No. 09/859,786, filed May 17, 2001, entitled "Interferometer Apparatus and Associated Method", to Shrenik Deliwala (incorporated herein by reference in its entirety); k) U.S. patent application Ser. No. 09/991,542, filed Nov. 10, 2001, entitled "Integrated Optical/Electronic Circuits and Associated Methods of Simultaneous Generation Thereof", to Shrenik Deliwala (incorporated herein by reference in its entirety); and l) U.S. patent application Ser. No. 09/991,371, filed Nov. 10, 2001, entitled "Anisotropic Etching of Optical Components", to Shrenik Deliwala et al. (incorporated herein by reference in its entirety).

III. Passive Optical Waveguide Devices

This section describes the structure and operation of passive optical waveguide devices 800. As previously mentioned relative to FIGS. 3, 5, 6A, 6B, and 6D, there are a variety of passive optical waveguide devices 800. Certain embodiments of passive optical waveguide devices 800, such as illustrated in FIG. 6D, are fabricated by etching the silicon from certain regions of the silicon layer 160 in the SOI wafer 152, to form lateral etched surfaces that provide the total internal reflectance (TIR) boundary 195 that maintain the light along a desired path, or within a desired region, within the silicon layer 160. The etched (TIR) boundary 195 can be etched in different configurations to provide different optical functions. Other embodiments of the passive optical waveguide devices 800 are fabricated by etching a polysilicon layer 191 (see FIGS. 3 and 6B) that has been deposited on a gate oxide layer 110. The gate oxide layer 110 has previously been deposited on the silicon layer 160 of the SOI wafer 152. These two embodiments are described in-detail in the next two sections of this disclosure.

In certain embodiments of passive optical waveguide devices that are fabricated by etching the polysilicon layer 191, certain portions of the silicon layer 161 (generally below the etched portion of the polysilicon layer 191) may additionally be etched to provide the TIR boundary 195 that limits the overall transmission of light in certain directions. Certain embodiments of passive optical waveguide devices that include a deposited and etched polysilicon layer 191 are described in the first portion of this section. Certain embodiments of passive optical waveguide devices that include an etched silicon layer 160 are described in the latter portion of this section. As will become evident, a specific passive optical waveguide devices can interface with another optical waveguide device (either passive or active) to provide a unitary optical waveguide device. For example, one passive optical waveguide device may create the TIR boundary 195, formed as an optical waveguide or mirror, that constrains light flowing within an unetched portion of the silicon layer to remain within the unetched portion of the silicon layer; a second passive optical waveguide device may then create a desired effective mode index in a region of static effective mode index within the path or region through which the path of light is travelling.

IIIA. Polysilicon Layer Based Passive Optical Waveguide Devices

Figure 16:
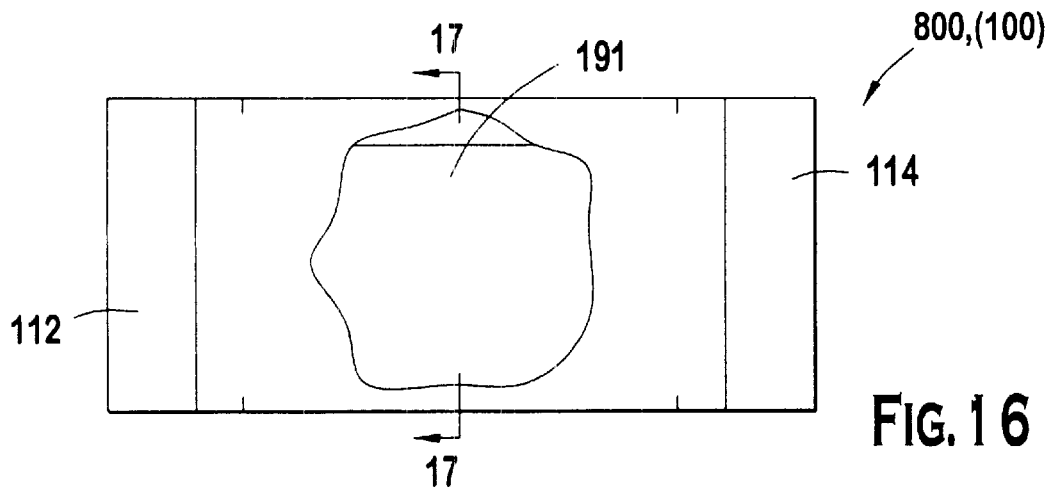
FIG. 16 shows a top view of one generalized embodiment of a passive optical waveguide device.
Figure 17:
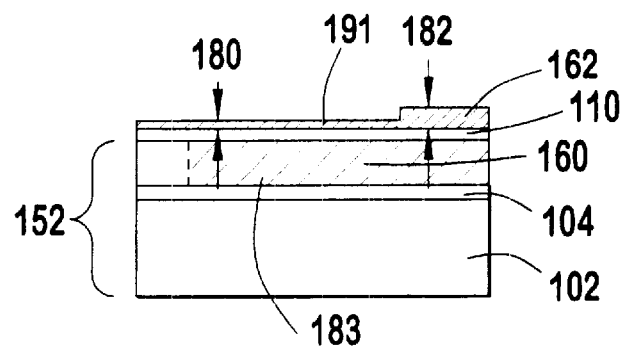
FIG. 17 shows a cross-sectional view through sectional lines 17—17 of the passive optical waveguide device of FIG. 16.
Figure 18:
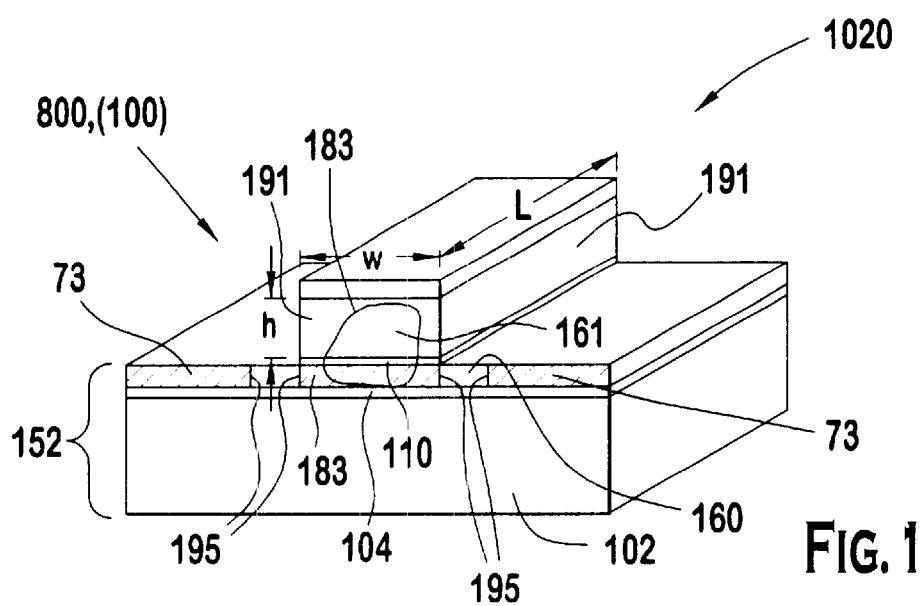
FIG. 18 shows a perspective view of one embodiment of the passive optical waveguide device that is a polyloaded waveguide.
Figure 19A:
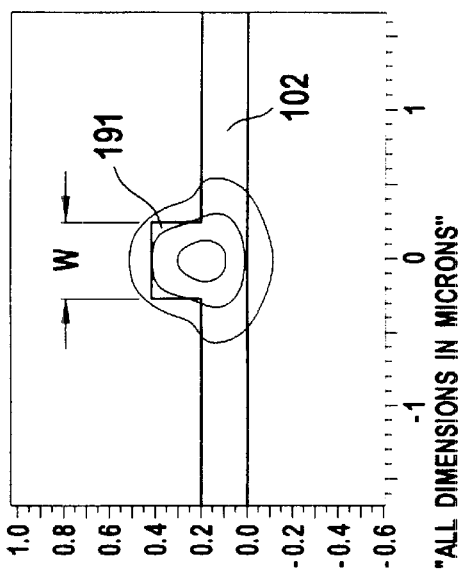
FIGS. 19A, 19B, 19C, and 19D show respective end views simulating light travelling within multiple optical waveguides, in which the width of the optical waveguide is varied for each optical simulation.
Figure 19B:
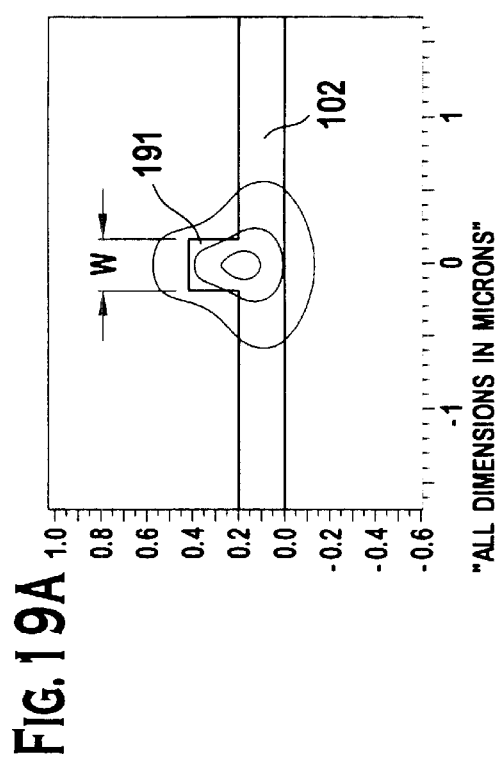
Figure 19C:
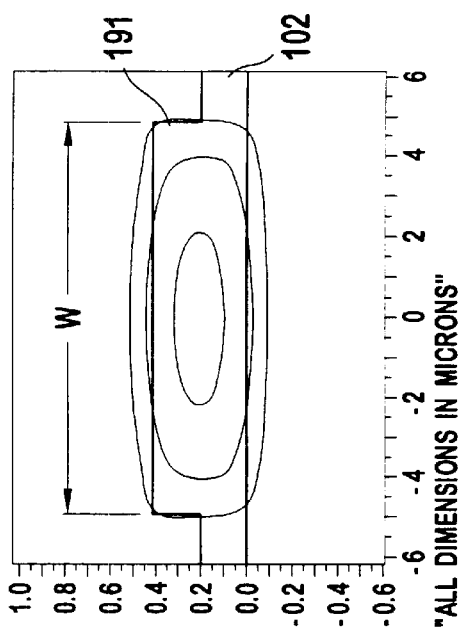
Figure 19D:
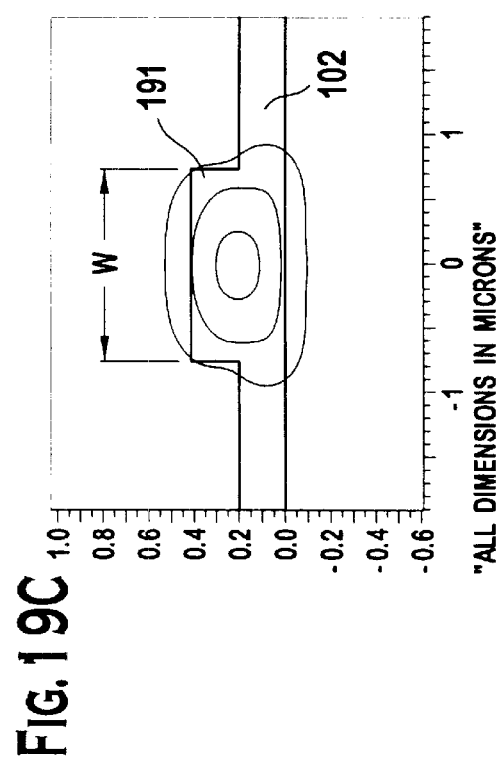

The embodiments of passive optical waveguide devices 800 shown in FIGS. 16 to 18 are formed by depositing and etching polysilicon on the silicon layer 160 (with a gate oxide formed there between) to form the polysilicon layer 191. The silicon layer may, or might not be bounded laterally by the silicon layer optical insulator 73 which maintains light traveling within an unetched portion of the silicon layer by the TIR boundary 195 as described herein. (As such, the dimensions of the optical insulator 73 shown may be reduced, or the optical insulator 73 and/or the etched region in the silicon layer occupied by the optical insulator 73, may be eliminated altogether in certain embodiments depending on the characteristics of the polysilicon layer.) The polysilicon layer is shaped in a desired horizontal and vertical configuration. The configuration is characterized by a width w, a height h, and a length L as shown in FIG. 18. The polysilicon layer creates a region of static effective mode index within the silicon layer 160. The effective mode index in the region of static effective mode index in the passive optical waveguide devices does not change over time alter the device fabricated, excepting for device degradation and aging. The effective mode index within the region of increased effective mode index 183 is a function of the width w, the length L, and the height h of the polysilicon layer 191. In some optical circuits, one or more passive optical waveguide devices 800 may transmit light directly to (or from) one or more other passive optical waveguide devices or active optical waveguide devices 150. As such, many passive optical waveguide devices 800 are often optically interconnected to active optical waveguide devices 150 to form optical waveguide circuits. A large variety of optical waveguide circuits can therefore be produced by combining one or more active optical waveguide devices 150 with one or more passive optical waveguide devices 800.

FIGS. 16 and 17 show respectively a top and an end cross-sectional view of one generalized embodiment of passive optical waveguide device 800 that is formed on the SOI wafer 152. The passive optical waveguide device 800 includes the substrate 102, the optical insulator 104, the silicon layer 160, the gate oxide layer 110, and the polysilicon layer 191 as shown in FIGS. 17 and 18. In the SOI wafers 152, the structure that normally operates as a "channel" in electronic devices 5101 operates instead as the optical waveguide 161 in many embodiments of active and passive optical waveguide devices.

Depositing, etching, masking, and doping polysilicon is known in CMOS and SOI technology as applied to electronic devices. The polysilicon layer 191 can be precisely etched to a specific height dimension h (e.g., 0.5 microns, 0.1 micron, etc.) using CMOS techniques. During CMOS fabrication, the height h, width w, and length L of the gate electrodes 120 and the polysilicon layer 191 can be deposited/etched to sub-micron accuracy relying largely on computer-controlled deposition, masking, and etching tools. The computer design and fabrication tools work most efficiently when the deposited polysilicon layer 191 of the passive optical waveguide device 800 (and the gate electrode 120 of either the active optical waveguide devices 150 or the electronic device 5101) are straight, have few changes in cross-sectional width and cross-sectional height, and have few or no curves since the associated computers go through the simplest computations. CMOS and Very-Large Scale Integration (VLSI) techniques applied to electronic devices 5101, passive optical waveguide devices 800, and active optical waveguide devices 150 are generally most effective if the device design includes relatively simple polysilicon, silicon, and metal patterns, and identical electronic devices 5101 are repeated a considerable number of times on a single substrate 102.

The shape and height of the different embodiments of the polysilicon layer 191 largely determine the optical function of the different embodiments of the passive optical waveguide device 800. The polysilicon layer 191 is thus precisely deposited and etched to provide the desired optical function. A single layer of polysilicon forming either the polysilicon layer 191 extending across the passive optical waveguide devices 800, and/or the gate electrode 120 extending across the electronic devices 5101 or active optical waveguide devices 150, can be selectively deposited, masked, etched, and/or doped at different regions using CMOS processes in order to simultaneously fabricate multiple optical and/or electronic waveguide devices on the substrate 152.

In passive optical waveguide devices 800,-the polysilicon in the polysilicon layer 191 does not have to be doped. This lack of doping to the polysilicon layer 191 is possible since the polysilicon layer 191 (in passive optical waveguide devices 800) does not have to change the free-carrier concentration within the silicon layer 160. In actuality, the doping of the polysilicon layer in passive optical waveguide devices 800 may hinder the operation of the passive optical waveguide device since the doping may enhance absorption of light by the polysilicon layer 191. The polysilicon used for gate electrodes 120 in electronic devices 5101 and active optical waveguide devices 150, however, is typically doped to allow for some desired change in free carrier density within the silicon layer 160. As such, the masks that apply doping to gate electrodes 120 for both active optical waveguide devices 150 and electronic devices 5101 do not simultaneously apply doping to the polysilicon in the polysilicon layer 191 used to form the passive optical waveguide devices 800. The shapes and positions of openings in the masks dictate the location where a dopant is applied.

The effective mode index of the silicon layer 160 is altered in certain embodiments of passive optical waveguide devices 800 by the presence of the polysilicon layer 191 adjacent the silicon layer 160. As such, the shape of the polysilicon layer 191 can be considered as projecting the region of static effective mode index 183 down to the silicon layer 160. The region of static effective mode index 183 in the optical waveguide 161 has a different propagation constant compared to other portions of the optical waveguide 161 (similar to the region of altered effective mode index 190 described relative to the active optical waveguide devices 150 shown in FIGS. 7A, 7C, and 8).

The amount that the propagation constant and the effective mode index differs in the region of static effective mode index 183 (compared to portions of the other optical waveguide 161) depends partially on the height h and width w of the polysilicon layer 191 as shown in FIG. 18. Therefore, in one embodiment of passive optical waveguide device 800, the value of the effective mode index within the region of static effective mode index 183 is altered based on the height 180 of the polysilicon layer 191. If it is desired to have the region of static effective mode index 183 with a different effective mode index value, then the height h of the polysilicon layer 191 can be selected accordingly. In FIG. 16, the primary polysilicon layer 191 has a height 180, while a secondary polysilicon layer 162 has a height 182. Multiple regions of altered effective mode index can thus project within a single silicon layer 160.

Many embodiments of the passive optical waveguide device 800 are relatively simple to fabricate and use, and comply with such CMOS and VLSI techniques and rules as are well known in semiconductor processing. There is no necessity to provide electrical connections to the passive optical waveguide devices 800. Additionally, passive optical waveguide devices 800 do not need controllers 201, as shown in FIG. 7B, or the associated controller programming. The programming of the controllers 201 can be limited to the active optical waveguide devices 150 and the electronic devices 5101 within the optical waveguide circuit 1140. It is envisioned that certain embodiments of passive optical waveguide devices 800 may be optically associated with certain embodiments of active optical waveguide devices 150. For example, as illustrated in FIG. 6A, polyloaded optical waveguides 161, which are passive optical waveguide devices, may be susceptible to slight optical operational irregularities during fabrication. To compensate for these optical operational irregularities, the active optical waveguide device 150 can be integrated to slightly tune the operation of the passive optical waveguide device 800. In FIG. 6A, for example, the active optical waveguide device 150 (that includes the electrodes 107, 109, 120) which is configured as an optical modulator, can be electrically tuned as indicated above to compensate for these optical operational irregularities in the associated passive optical waveguide device(s).

The optical function of the passive optical waveguide device 800 shown in FIG. 16, as determined by the configuration of the region of static effective mode index 183, is a function of the shape, width, length, and height of the polysilicon layer 191. The embodiments of passive optical waveguide devices 800 described in this disclosure perform a variety of optical functions as now described.

1. Polyloaded Waveguide

The embodiment of polyloaded waveguide shown in FIG. 18 represents one embodiment of passive optical waveguide device that is at least partially fabricated by depositing and/or etching the polysilicon layer. The term "polyloaded" in this disclosure relates to the application of the polysilicon layer 191 as shown in FIG. 17, above the silicon layer 160 of the particular passive optical waveguide device 800 (and in the embodiment shown above the gate oxide layer 110 that is deposited between the polysilicon layer and the silicon layer).

In the polyloaded waveguide 1020, the gate oxide layer 110, is deposited on the silicon layer 160. A rectangular (within the horizontal plane) polysilicon layer 191 is then deposited on the gate oxide layer. The gate oxide layer 110 provides electrical and optical insulation between the polysilicon layer 191 and the silicon layer 160. The silicon layer 160, the gate oxide layer 110, the substrate 102, the optical insulator 104, and the polysilicon layer 191 may each be fabricated using known CMOS and VLSI techniques in a similar manner to electronic devices such as FETs. The embodiment of passive optical waveguide device 800 shown in FIG. 18 is a so-called ridge optical waveguide in which the polysilicon layer has exposed lateral sides. Multiple polyloaded waveguides 1020 can be fabricated on a single substrate 102.

The region of static effective mode index 183 is maintained within the optical waveguide 161 of polyloaded waveguides 1020 at a prescribed effective mode index. Light travelling within the optical waveguide 161 is constrained on both lateral sides of the optical waveguide 161 by the TIR boundary 195. The TIR boundary 195 is created by etching, within the silicon layer 160, a region in which the silicon layer optical insulator 73 is deposited as shown in FIGS. 18 and 5. In certain embodiments, no silicon layer optical insulator 73 is deposited since air forms a natural TIR boundary with the silicon layer.

The width of the polyloaded waveguide 1020 is a factor in determining the effective mode index of the region of static effective mode index 183 within the optical waveguide 161. Therefore, selecting a different width of the polysilicon layer 191 in the polyloaded waveguide 1020 affects the propagation rate of light traveling through the region of static effective mode index 183 in the optical waveguide 161.

The width w of the polysilicon layer 191 in passive optical waveguide devices 800 (as well as the gate electrode 120 in active optical waveguide devices 150 and electronic devices) can be easily modified by selecting a different opening width in a polysilicon mask layout. FIGS. 19A to 19D illustrate a progression of simulated propagation constant measurements as the width of polysilicon layer 191 increases. In each simulation shown in FIGS. 19A to 19D, the simulated wavelength of the light travelling within the optical waveguide is maintained at 1.55 microns, and the height of the polysilicon layer 191 is maintained at 0.21μ. The width of the polysilicon layer 191 in the passive optical waveguide device 800 progressively increases from FIGS. 19A to 19D, as measured in microns. The phase (φ) is related to the propagation constant (β) according to equation 1:

$$\beta * L = \phi \quad \text{(equation 1)}$$

which can be shown to equal $$[(2\pi/\lambda)n_{eff}]*L = \phi \quad \text{(equation 1)}$$

where L is the length of the polysilicon layer 191. In active electronic devices 5101 and active optical waveguide devices 150, β is a function of the free carrier density in addition to the width w and height h of the polysilicon gate electrode 120, and $\eta_{eff}$ is the effective mode index.

The cross-sectional area of the polysilicon layer 191 (as determined by the height h and the width w) also effects the effective mode index and the propagation rate of light within the region of static effective mode index 183 in the optical waveguide 161. For a given width, the greater the height h of the polysilicon layer 191, the greater the change in the effective mode index within the region of altered effective mode index 190 in the optical waveguide 161. Any modification in the effective mode index within the region of static effective mode index 183 (resulting from depositing the polysilicon layer) also produces a corresponding change in the propagation constant.

During normal CMOS processing, it may be desirable to maintain the height h of the polysilicon for the polysilicon layer 191 in all passive optical waveguide devices 800 throughout a given wafer (and the height of the polysilicon forming the gate electrodes 120 in all active optical waveguide devices 150 and all electronic devices 5101 throughout a given wafer, see FIG. 5) equal. The width w or length L of the polysilicon layer are the most likely device parameters to be altered to provide a passive optical waveguide device (or different devices of the same wafer 152) since applying different depths (to different portions of the same layer on the wafer 152) requires additional photolithographic masks. Providing the polysilicon layer 191 or gate electrode 120 in each one of the active optical waveguide devices, passive optical waveguide devices, and electronic devices with a common height thus simplifies CMOS processing, and mask design.

The height (vertical) of the polysilicon layer 191 compared to the vertical height of the silicon layer 160 largely determines where the optical waveguide 161, in thin SOI wafers 152, is located (i.e., where the light travels within the silicon layer 160 compared to the polysilicon layer 191). For example, simulations indicate that if the silicon layer is maintained at 0.2 microns, and the gate oxide layer 110 is maintained at 80 Angstroms, and the height of the polysilicon layer 191 is changed, then the region that the light travels within the polysilicon layer 191 and/or the silicon layer 160 also changes. When the polysilicon layer 191 is relatively thin (e.g., 0.1 micron thick), the optical waveguide 161 is located almost entirely within the silicon layer 160, and the light travels substantially within the silicon layer. By comparison, when the polysilicon layer 191 is relatively thick (e.g., 0.6 micron thick), almost the entire optical waveguide 161 is within the polysilicon layer 191, and almost all of the light travels within the polysilicon layer. Between these values graduating percentages of light travel in the polysilicon layer 191 and the silicon layer 160 (as well as the gate oxide layer 110). As such, the depth of the polysilicon layer can be selected to control the range (in the vertical direction) that most of the light travels within the silicon layer 160, the gate oxide layer 110, and the polysilicon layer 191. The particular shapes and angles of the upper surface, the bottom surface, and the exposed lateral sides of the polyloaded waveguides 1020 can be modified to provide desired light characteristics in the optical waveguide.

2. Interferometer

The embodiments of interferometer shown in FIGS. 20 to 23 represent multiple embodiments of the passive optical waveguide device that are at least partially fabricated by depositing and/or etching a polysilicon layer 191a, b, c, and/or d. The interferometer may be configured as a Michaelson interferometer, a Mach-Zehnder interferometer, or another type of interferometer.

Figure 20:
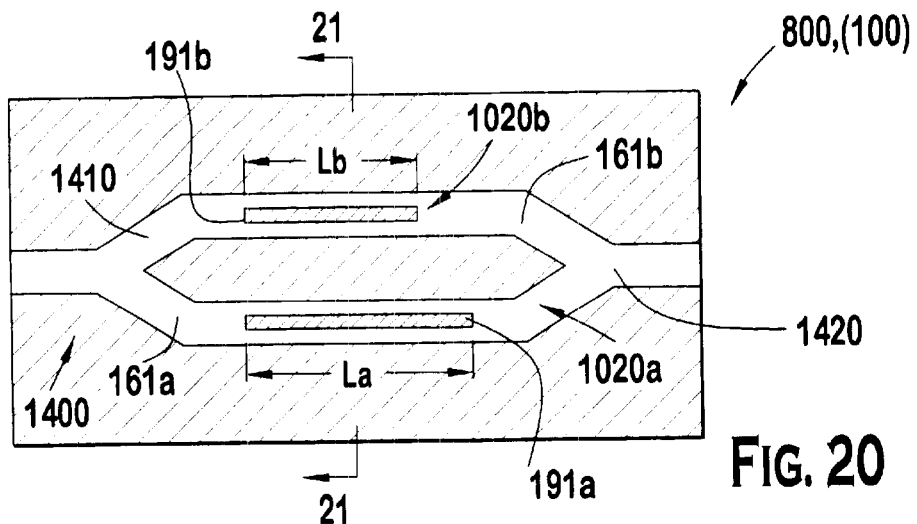
FIG. 20 shows a top view of a passive optical waveguide device that is configured as an interferometer.
Figure 21:
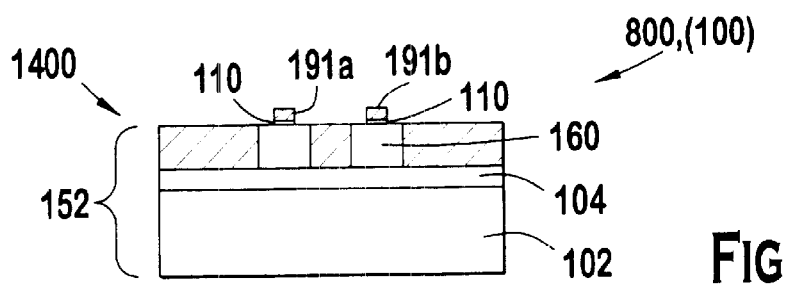
FIG. 21 shows a cross-sectional view taken through section lines 21—21 of FIG. 20.
Figure 22:
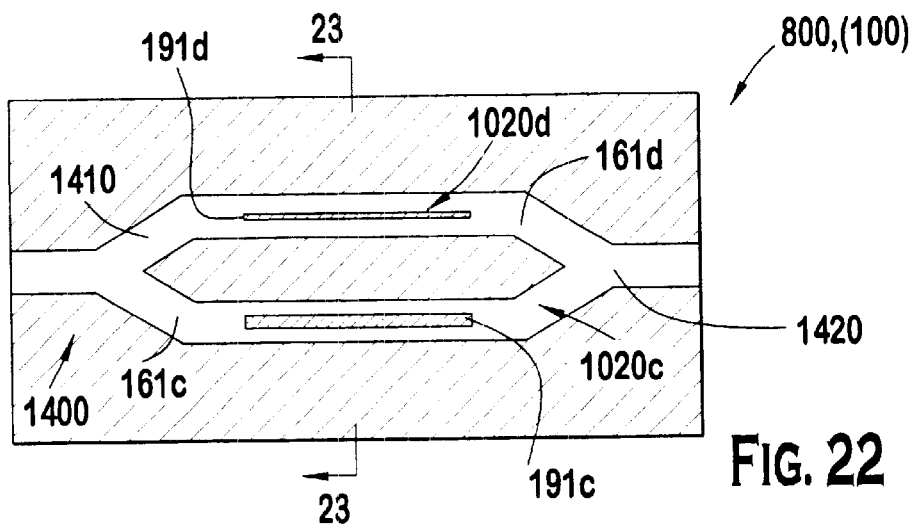
FIG. 22 shows a top view of a passive optical waveguide device that is configured as another embodiment of interferometer.
Figure 23:
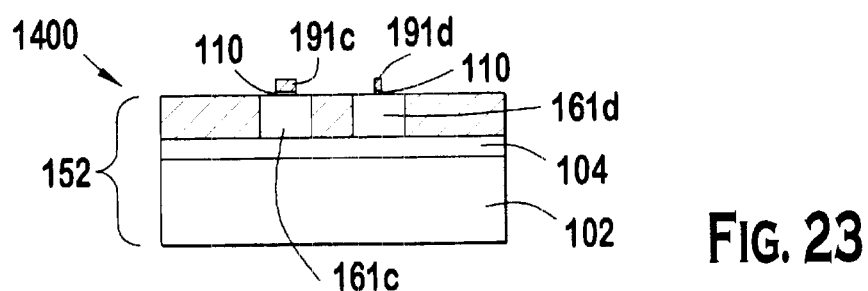
FIG. 23 shows a cross-sectional view taken through section lines 23—23 of FIG. 22.

In these embodiments of interferometers, at least one polysilicon layer 191a, b, c, and/or d is configured to provide a desired region of static effective mode index in one passive optical waveguide segment. FIG. 20 shows a top view, and FIG. 21 shows a cross-sectional view, of one embodiment of an interferometer 1400. FIG. 22 shows a top view, and FIG. 23 shows a cross-sectional view, of another embodiment of the interferometer 1400. The different embodiments of the interferometers 1400 shown in FIGS. 20, 21, 22, and 23 are passive optical waveguide devices 800, and include an input coupler 1410, two passive polyloaded waveguide segments (1020a and 1020b in FIGS. 20 and 21; 1020c and 1020d in FIGS. 22 and 23), and an output coupler 1420. The input coupler 1410 splits light into two light signals that follow each of the two passive polyloaded waveguide segments 1020a and 1020b. The output coupler 1420 acts as a light combiner. Each one of the passive polyloaded waveguide segments 1020a, 1020b, 1020c, and 1020d are configured and fabricated in a similar manner as the polyloaded waveguides 1020 described relative to FIGS. 16 to 18.

The interferometer described in U.S. patent application Ser. No. 09/859,786, to Shrenik Deliwala (the '786 patent application, incorporated by reference above) relates to an active optical waveguide device 150. As such, the wavelength of the light that the interferometer of the '786 patent application is associated with can be altered to a controllable effective mode index by adjusting the voltage between the gate electrode 120 and the body contact electrodes 118, 122 as shown in FIG. 7B. By comparison, the embodiments of the interferometer 1400 shown in FIGS. 20 to 23 include a plurality of passive polyloaded waveguide segments, each passive polyloaded waveguide segment is configured with a region of static effective mode index.

The embodiment of interferometer 1400 as shown in FIGS. 20 and 21 includes polysilicon layers 191a and 191b (associated with respective passive polyloaded waveguide segments 1020a, 1020b), that have the same cross-sectional areas (e.g., both heights h and both widths w of the polysilicon layers 191a and 191b are identical, where FIG. 18 shows h and w), but extend for different respective axial lengths $L_a$ and $L_b$ along the respective passive polyloaded waveguides segments 1020a and 1020b. The projected lengths of the regions of static effective mode indexes 183 thus vary between the passive polyloaded waveguide segment 1020a and the passive polyloaded waveguide segment 1020b (since the outline of the, polysilicon layers 191a and 191b, that each have different lengths, project to the regions of static effective mode indexes 183 nearly exactly). Since the length of the region of the static effective mode index 183 (not shown) within the passive polyloaded waveguide segment 1020a is considerably longer than the projected region of static effective mode index 183 (not shown) with the passive polyloaded waveguide segment 1020b, the optical waveguide 161a of the passive polyloaded waveguide segment 1020a has a different propagation constant than the optical waveguide 161b of the passive polyloaded waveguide segment 1020b.

Due to the different propagation constants of optical waveguide 161a relative to optical waveguide 161b, light will pass through the different optical waveguides 161a, 161b at different overall velocities. The phase of light between the two polyloaded waveguides will therefore change. Light travelling through the optical waveguide 161a (as shown in FIGS. 20 and 21) will exit the optical waveguide separated by an optical phase shift equal to $\phi$, for a central design wavelength of the passive optical waveguide device, compared to light traveling through the optical waveguide 161b. The phase ($\phi$) is related to the propagation constant ($\beta$) as per equation 1 above. The light travelling through the optical waveguide 161a will interfere at the output coupler 1420 with the light travelling through the optical waveguide 161b. The amount of light exiting-depends on the phase shift $\phi$ and the amplitude of the light in the individual waveguide segments.

In one embodiment of interferometer 1400 (not shown), only one passive polyloaded waveguide segment 1020a or 1020b has a respective polysilicon layer 191a or 191b. As such, only one polysilicon layer 191a or 191b would project the region of static effective mode index 183 into the optical waveguide 161 associated with the passive polyloaded waveguide segment. The phase of light travelling through the polyloaded waveguide with the polysilicon layer would therefore shift from the light travelling through the polyloaded waveguide without the polysilicon layer by some phase $\phi$, for a central design wavelength of light of the passive optical waveguide device.

In another embodiment of interferometer 1400 shown in FIGS. 22 and 23, the passive polyloaded waveguide segment 1020c includes the polysilicon layer 191c; and the passive polyloaded waveguide segment 1020d includes the polysilicon layer 191d. The general components of the embodiment of interferometer 1400 shown in FIGS. 22 and 23 may be similar to that shown in the embodiment of shown in FIGS. 20 and 21, except that the lengths of the polysilicon layers 191c and 191d are equal ($L_a=L_b$), and the cross-sectional area of the polysilicon layer 191c differs from the cross sectional area of the polysilicon layer 191d. The difference in cross sectional areas between the polysilicon layer 191c and the polysilicon layer 191d results from: a) a difference in height h between the respective polysilicon layers 191c and 191d of the respective passive polyloaded waveguide segments 1020c and 1020d (see FIG. 18 for h and w); b) a difference in width w between the polysilicon layers 191c and 191d of the respective passive polyloaded waveguide segments 1020c and 1020d; or c) a combination of the above. As mentioned above, b) is the most likely in CMOS processing, since it is difficult to vary the height h between different polysilicon traces on the same polysilicon wafer.

In those embodiments where two polysilicon layers 191 are of different heights h (not shown) this difference in height may be accomplished by applying identical deposition and etching steps to both polysilicon layers 191c and 191d, and then applying additional deposition or etching steps to only one of the polysilicon layers 191c, 191d. Providing the two polyloaded waveguide segments 1020c and 1020d, with different cross-sectional areas causes the region of static effective mode index 183 in the optical waveguide 161c to have a different effective mode index than the region of static effective mode index 183 in the optical waveguide 161d. Due to the different effective mode index of the regions of static effective mode indexes 183 within the optical waveguides 161c and 161d, the optical waveguides 161c and 161d will have different propagation constants.

The respective cross sectional areas of the polysilicon layers 191c and 191d, as shown in FIGS. 22 and 23, are configured so light exiting the optical waveguides 161c and 161d will enter the output coupler 1420 separated by some optical phase shift $\phi$, for a central design wavelength of the passive optical waveguide device. Therefore, light exiting the optical waveguide 161c that enters the output coupler 1420 is in phase with light exiting the optical waveguide 161d that enters the output coupler 1420. As such, the light travelling through the optical waveguide 161c will interfere at the output coupler 1420 with the light travelling through the optical waveguide 161d for the intended wavelength(s) of light for the interferometer 1400. The amount of light exiting 1420 depends on the phase shift $\phi$ and the amplitude of the light in the individual waveguide segments.

The different embodiments of interferometer 1400 described relative to FIGS. 20, 21, 22, and 23 include two passive polyloaded waveguide segments that are illustrated as being substantially straight. Making the passive polyloaded waveguide segments substantially straight provides for-simple CMOS and VLSI layout design, particularly relating to the deposition of the silicon, polysilicon, and various oxides such as gate oxide. Similar concepts apply to the interferometer 1400 where each passive polyloaded waveguide segment 1020a and 1020b (or 1020c and 1020d) follows a curved, an arcuate, a combined curved and straight, or any other path (not shown), and such embodiments are intended to be within the scope of the present invention.

The embodiments of the interferometer 1400 shown in FIGS. 20, 21, 22, and 23 are representative of embodiments of the passive optical waveguide device 800 where the velocity of light traveling through one passive polyloaded waveguide segment 1020a (or 1020c) is adjusted relative to light travelling through another passive polyloaded waveguide segment 1020b (or 1020d). This adjustment of the velocity of light within different optical waveguides controls the relative phase of light exiting the passive polyloaded waveguide segment 1020a, 1020b (or 1020c, 1020d). There are a variety of other embodiments of passive optical waveguide devices 800 that operate by adjusting the phase of light travelling through a plurality of passive polyloaded waveguide segments (for example, the embodiments of the AWG 1600 as described herein).

While each passive polyloaded waveguide 1020 and each passive polyloaded waveguide segment 1020a, 1020b, 1020c, and 1020d shown in FIGS. 18 to 23 has a substantially constant cross sectional area (each polyloaded waveguide or polyloaded waveguide segment has a constant width w and height h along the entire length of the passive polyloaded waveguide segment as shown in FIG. 18), it may be desired in certain embodiments to increase or decrease the cross sectional area along the length. For example, FIG.

6B shows a passive optical waveguide device 800 configured as a polyloaded waveguide having adiabatic tapers 75 formed at either end. The width dimension of the adiabatic tapers 75 gradually increase toward where the light is input compared to the remainder of the polysilicon layer (that has a constant width and thickness) to direct or funnel light into the polyloaded waveguide. As such, adiabatic tapes may be considered as one embodiment of polyloaded waveguide 1020.

3. Arrayed Waveguide Gratings

Figure 24A:
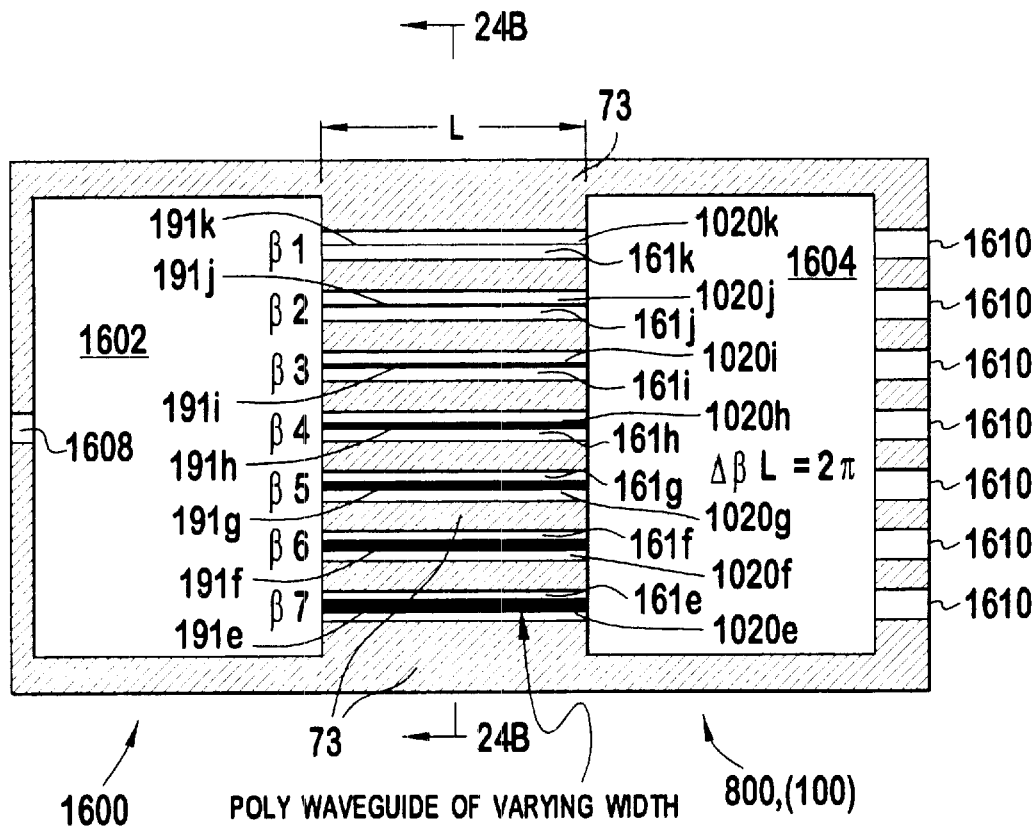
FIGS. 24A and 24B respectively show top and cross-sectional views of a passive optical waveguide device that is configured as an arrayed waveguide grating (AWG)
Figure 24B:
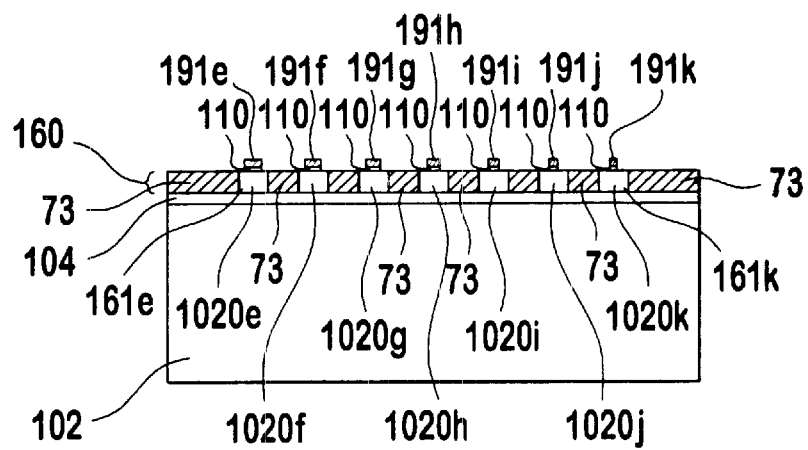

FIGS. 24A and 24B respectively show top and front cross-sectional views of one embodiment of an arrayed waveguide grating (AWG) 1600. These embodiments of AWG represent passive optical waveguide devices that are at least partially fabricated by depositing and/or etching the polysilicon layer 191. The AWG 1600 is configured either as a wavelength division multiplexer or a wavelength division demultiplexer, depending on the direction that the light signal propagates. The AWG 1600 includes an input coupler 1602, an output coupler 1604, an input signal port 1608, a plurality of output signal ports 1610 and a plurality of arrayed waveguides or waveguide arms 1020e to 1020k. In the wavelength division demultiplexer configuration, the input signal port 1608 applies input signals to the input coupler 1602 and a plurality of output signal ports 1610 receive a plurality of output signals from the output coupler 1604. The terms input coupler 1602, output coupler 1604, input signal port 1608, and output signal port 1610 are intended to be illustrative in nature and not limiting in scope. For example, when the AWG 1600 is acting as a wavelength division demultiplexer, a single optical signal (that is to be wavelength-demultiplexed) travels through the input signal port 1608, the input coupler 1602, the plurality of arrayed waveguide arms 1020e to 1020k, and the output coupler 1604, as a plurality of wavelength division demultiplexed signals are applied to the respective plurality of output signal ports 1610. When the AWG 1600 is acting as a wavelength division demultiplexer, the input coupler 1602 demultiplexes the single optical signal into the plurality of wavelength division demultiplexed signals.

When the AWG 1600 is acting as a wavelength division multiplexer, a plurality of wavelength division demultiplexed signals are input to the plurality of output signal ports 1610, and the wavelength division demultiplexed signals travel via the output coupler 1604, the plurality of arrayed waveguide arms 1020e to 1020k, and the input coupler 1602, to yield a single wavelength division multiplexed signal to the input signal port 1608. When the AWG 1600 is acting as a wavelength division multiplexer, the input coupler 1602 multiplexes the plurality of wavelength division demultiplexed signals into a single wavelength division multiplexed signal.

Figure 25A:
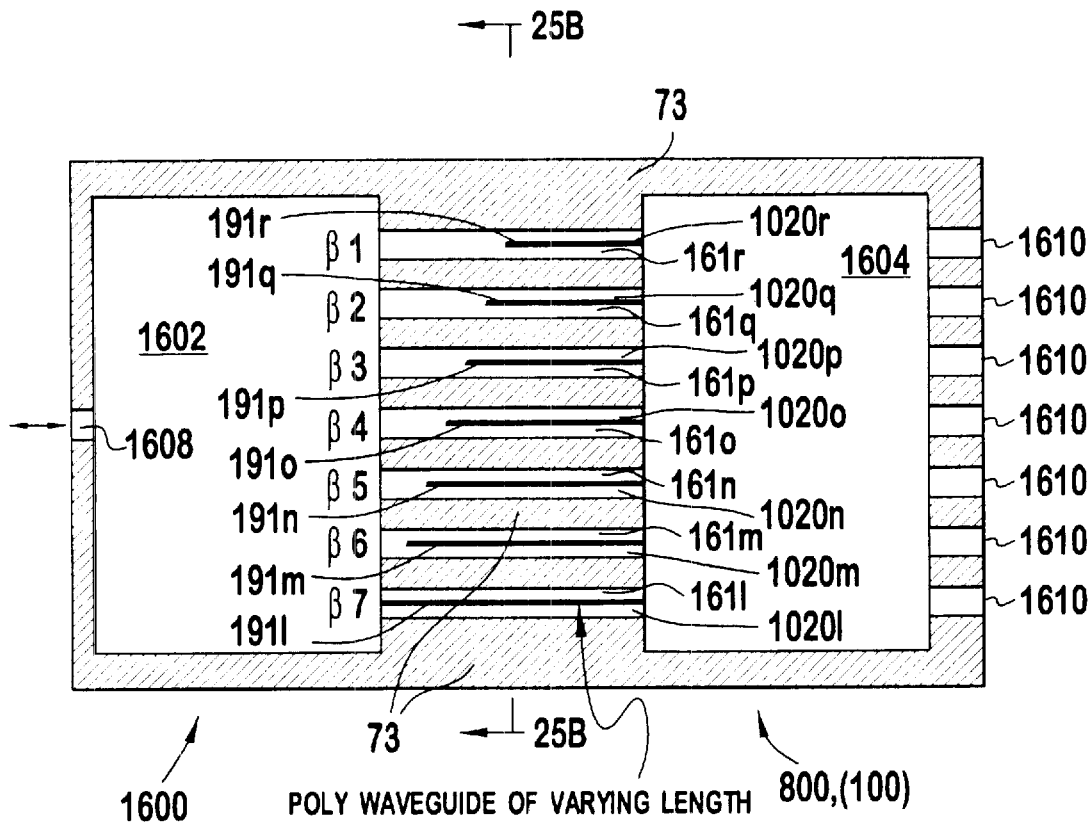
FIGS. 25A and 25B respectively show top and cross-sectional views of a passive optical waveguide device that is configured as another embodiment of AWG.
Figure 25B:
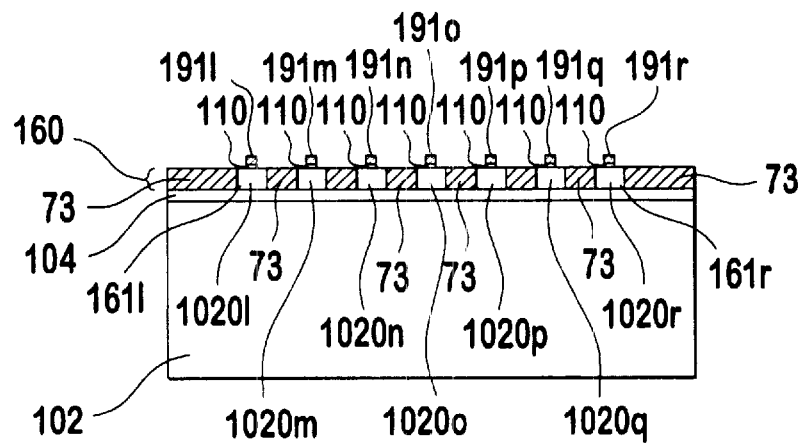

The plurality of arrayed waveguide arms 1020e to 1020k extend between the input coupler 1602 and the output coupler 1604. Glass or air optical insulator 73 (as described in FIG. 6A) is integrated within the silicon layer, between each pair of adjacent arrayed waveguide arms 1020e to 1020k (at the level of the silicon layer), and provides total internal reflection to light within the each arrayed waveguide arm. Each one of the arrayed polyloaded waveguide arms 1020e to 1020k is similar structurally and operationally to the passive polyloaded waveguide segments 1020a to 1020d shown in the embodiments of interferometer 1400 described above relative to FIGS. 20 to 23. In different embodiments of AWGs, either the cross-sectional areas between the respective polysilicon layers 191e to 191k differ as illustrated in FIGS. 24A and 24B, or alternatively the lengths of each one of the polysilicon layers 191l to 191r vary as illustrated in FIGS. 25A and 25B. As a result of the difference of effective mode index within the polyloaded waveguide segments, the propagation constant of light differs through each one of the plurality of arrayed waveguide arms 1020e to 1020k (or 1020l to 1020r) of the AWG 1600 for the reasons described relative to each of the passive polyloaded waveguides 1020a, 1020b in the interferometer 1400. That is, a difference in cross-sectional areas and/or difference of lengths of the plurality of arrayed waveguide arms 1020e to 1020k (or 1020l to 1020r) result in a change in propagation constant.

In the embodiment of AWG 1600 shown in FIGS. 24A and 24B, the width w (indicated by the thickness of the line in FIG. 24A) of each one of the polyloaded waveguide arms 1020e to 1020k are different from each other. Each one of the plurality of waveguide arms 1020e to 1020k has an identical length L and height h (see FIG. 18). Each respective polysilicon layer 191e to 191k is deposited on a gate oxide layer (not shown) that in turn, has previously been deposited on the silicon layer 160. Each respective one of the plurality of waveguide arms 1020e to 1020k includes the silicon layer 160 that respectively has a uniform height and width. The variation in width w of the different polysilicon layers 191e to 191k results in a different effective mode index in each region of altered effective mode index within each optical waveguide 161 as shown in FIG. 24B. Therefore, the propagation constant in the region of static effective mode index 183 differs for each optical waveguide 161. Light therefore traverses the optical waveguides of each polyloaded waveguide arm 1020e to 1020k at a different velocity. AWGs 1600 of the type shown in FIGS. 24A and 24B are arranged so each pair of adjacent ones of the plurality of waveguide arms 1020e to 1020k (of equal arm lengths) satisfy equation 3:

$$(\beta_i - \beta_{i-1})L = m2\pi \qquad \text{(equation 3)}$$

where $\beta i$ represents the propagation constant of $i^{th}$ arm, m is an integer and L is the length of arms, i.e., arms i and (i−1). Where the length of the arms differ, equation 3 can be rewritten as equation 4:

$$\Delta(\beta L) = (\beta_i L_i - \beta_{i-1} L_{i-1}) = m2\pi \qquad \text{(equation 4)}$$

$$\phi_i + \Delta(\beta L) = m2\pi + \phi_i \qquad \text{(equation 5).}$$

In general, additional phase shift $\phi_i$ may be added to make the output of arms 161e–j focus at the inputs of output waveguides 1610. In another embodiment of AWG 1600 (not shown), as shown in FIGS. 25A and 25B, the cross-sectional shape of the silicon layers 160 in each polyloaded waveguide arms 1020l to 1020r is substantially identical. Each one of the plurality of waveguide arms 1020l to 1020r has an identical length; however the length L of each polysilicon layer 191l to 191r differs. This variation in length of the respective polysilicon layers 191l to 191r relative to the respective waveguide arms 1020l to 1020r results in regions of static effective mode index 183 of different lengths being projected into each of the waveguide arms 1020l to 1020r, which in turn provide a varied propagation constant between the different ones of the waveguide arms. This difference in propagation constant between adjacent ones of the waveguide arms 1020l to 1020r provides similar optical operation to the embodiment of AWG described above relative to FIGS. 24A and 24B.

Figure 2:
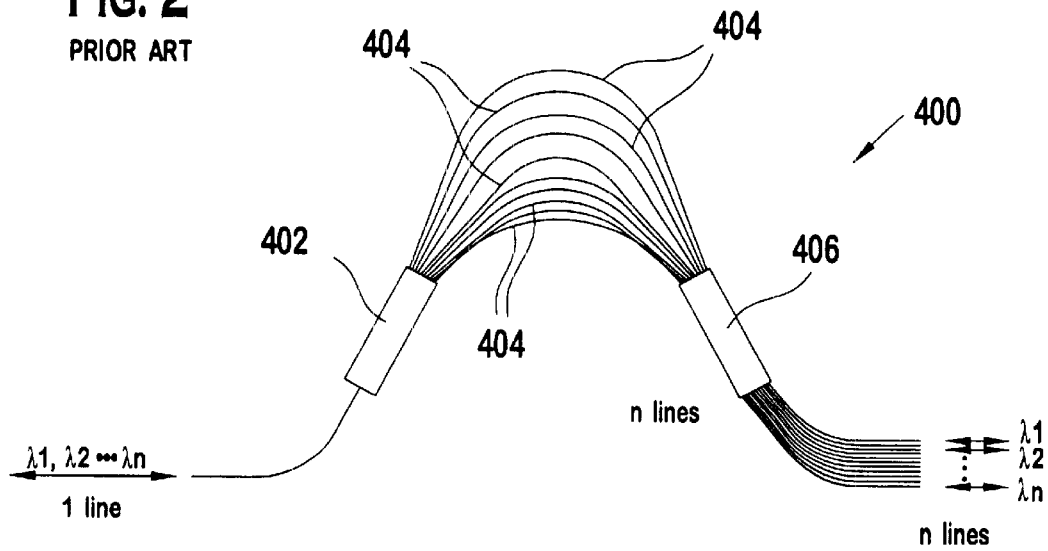
FIG. 2 shows an top view of one prior art embodiment of arrayed waveguide grating.

FIG. 26 shows an AWG 2600 formed as a passive optical waveguide device 800 of the type that is formed within the silicon layer 160, similar to as described relative FIG. 6A and similar in shape to the embodiment of AWG shown in FIG. 2. The AWG 2600 includes an input coupler 2602, an output coupler 2604, an input signal port 2608, a plurality of output signal ports 2611, and a plurality of polyloaded waveguide arms 2620a to 2620e. Each pair of adjacent ones of the plurality of waveguide arms 2620a to 2620e is separated by adjacent ones of the plurality of waveguide arms by a silicon layer optical insulator 73 such as air or glass, where the silicon layer optical insulator 73 may be formed by etching the silicon in the silicon layer 160, and depositing the desired optical insulator to form the silicon layer optical insulator 73 at the desired locations. Each one of the plurality of waveguide arms 2620a to 2620e has the same configuration as the passive optical waveguide device 800 shown in FIG. 4. Additionally, the polysilicon layer 191 defines a general curve of each of the plurality of waveguide arms 2620a to 2620e. Where each of the arms for the prior art embodiment of AWG shown in FIG. 2 includes entirely a glass (e.g., silicon dioxide) segment; each one of the plurality of waveguide arms 2620a to 2620e are formed by depositing the gate oxide layer 110, and then the polysilicon layer 191, in a desired configuration. It may be more desired to pattern polysilicon in the relatively complex configurations representing the plurality of waveguide arms than it is to pattern the silicon in the silicon layer, which in many thin SOI wafers 152 is very thin.

Another advantage of the "constant length AWG" is temperature stability. An ideal a-thermal AWG would have to maintain an m2π phase shift difference between arms over an operating temperature range. Since arm lengths are different in traditional AWG's, temperature changes the length of the long arms and hence deviation from the m2π condition occurs. By using constant length arms, this problem is no longer relevant. Only changes in the propagation constant β as a function of temperature are important and these effects are considerably smaller.

Although each of the AWG's illustrated above are shown as having straight passive waveguide arms, AWGs within the scope of the present invention could also be fabricated with straight active waveguide arms, i.e., straight waveguide arms wherein the phase of light in each arm is adjusted by controlling a gate voltage applied to an electrode associated with the waveguide arm.

4. Polyloaded Echelle Grating

The embodiments of Echelle Grating described in U.S. patent application Ser. No. 09/859,239, entitled "Optical Deflector Apparatus and Associated Method", relate to active optical waveguide devices 150 as described by this disclosure. As such, the amount of deflection of light (or changing the focal length) in the Echelle grating of the '239 patent application can be adjusted by adjusting the voltage between a gate electrode and combined body contact electrodes. By comparison, each embodiment of a polyloaded Echelle grating 2500 shown in FIGS. 30 to 35 represents a different embodiment of the passive optical waveguide device 800. The amount of deflection (or change in the focal length) of the light traversing the polyloaded Echelle grating 2500 remains substantially constant over the life of the passive optical waveguide device, and therefore cannot be altered within the region of static effective mode index of a given passive optical waveguide device 800 by, for example, variation of a control voltage.

Figure 30:
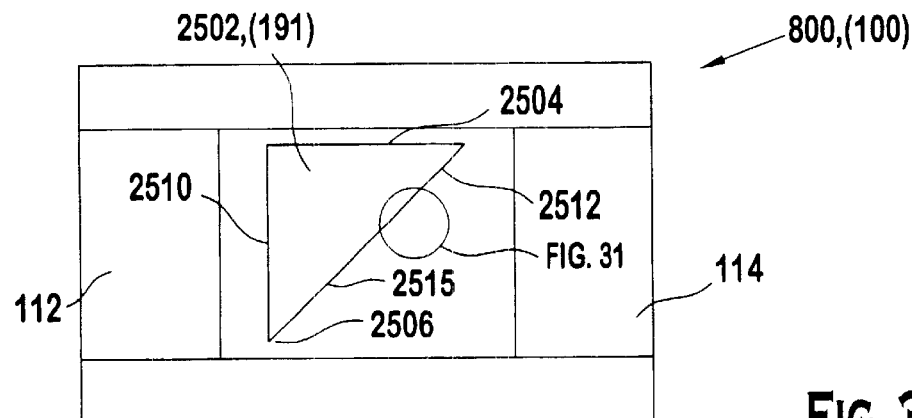
FIG. 30 shows a top view of another embodiment of the passive optical waveguide device, a portion of which is shown expanded in FIG. 31, the passive optical waveguide device is configured as an Echelle grating.

FIG. 30 shows one embodiment of the polyloaded Echelle grating 2500. The Echelle grating represents one embodiment of passive optical waveguide device that is at least partially fabricated by depositing and/or etching the polysilicon layer. The polyloaded Echelle grating 2500 is fabricated as a passive optical waveguide device 800 as described relative to FIGS. 17 and 18, and as such includes the layers of the wafer 152 (the substrate 102, the optical insulator 104, and the silicon layer 160) in addition to the gate oxide layer 110 that is deposited on the silicon layer 160, and the polysilicon layer 191 that is deposited on the gate oxide layer 110. As described below relating to fabrication, the polysilicon eventually forming the polysilicon layer 191 is deposited as a plane on top of the planar oxide eventually forming the gate oxide layer 110. The polysilicon layer 191 can then be etched from the polysilicon using planar lithography tools, and the gate oxide layer 110 forms a natural boundary to limit the further polysilicon etching into, or below, the gate oxide layer 110. The gate oxide layer 110 can then optionally be etched using gate oxide planar lithography tools (at which point the silicon layer 160 forms a natural boundary to limit further gate oxide etching into, or below, the silicon layer depending on the selected etchant). The gate oxide can be selected to have a sufficient dimension as to not affect the projection of the region of static effective mode index 183 from the polysilicon layer 191 into the silicon layer 160.

The polyloaded Echelle grating 2500 may be alternatively used as a diffraction grating or a lens grating depending on the relative configuration of the Echelle-shaped polysilicon layer 2502 and the silicon layer. In the embodiment of polyloaded Echelle grating 2500 shown in FIG. 30, the polysilicon layer 191 is configured as a substantially triangular-shaped Echelle-shaped polysilicon layer 2502. The Echelle-shaped polysilicon layer 2502 shape projects nearly identically in size and horizontal-shape to the region of static effective mode index 183 shown in FIGS. 32, 34, and 35. The Echelle-shaped polysilicon layer 2502 includes a base side 2510, a planar grooved surface 2512, and two parallel sides 2504 and 2506. The side 2506 appears as a point of the triangle, but is actually a length of material as shown in FIG. 22.

The base side 2510 extends substantially perpendicular to the incident direction of travel of light (the direction of travel of the light is indicated by arrows 2606, 2607, and 2609 shown in FIG. 22) entering the polyloaded Echelle grating 2500. The planar grooved surface 2512 includes a series of individual grooves 2515 that extend parallel to the side surface 2504, 2506, and all of the grooves 2515 regularly continue from side 2504 to the other side 2506. Each groove 2515 includes a width portion 2519 and a rise portion 2517.

Figure 31:
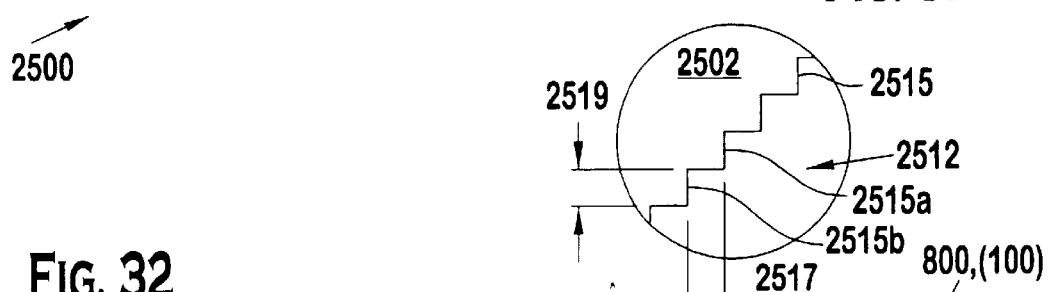

The rise portion 2517 defines the distance that each individual groove 2515 rises (parallel to the direction of propagation of light in the optical waveguide 161) from its neighbor groove. The rise portion 2517 is equal for each individual groove 2515, and the rise portion 2517 equals some integer multiple of the wavelength of the light that is to be acted upon by the polyloaded Echelle grating 2500. Two exemplary adjacent grooves shown in FIG. 31 are 2515a and 2515b; the vertical distance between the grooves 2515a and 2515b is the rise portion 2517. The width portion 2519 (taken in a direction perpendicular to the direction of propagation of light in the optical waveguide 161) of the Echelle-shaped polysilicon layer 2502 is equal for all of the individual grooves 2515. The distance of the width portion 2519 multiplied by the number of individual grooves 2515 equals the operational width of the entire Echelle-shaped polysilicon layer 2502.

Figure 32:
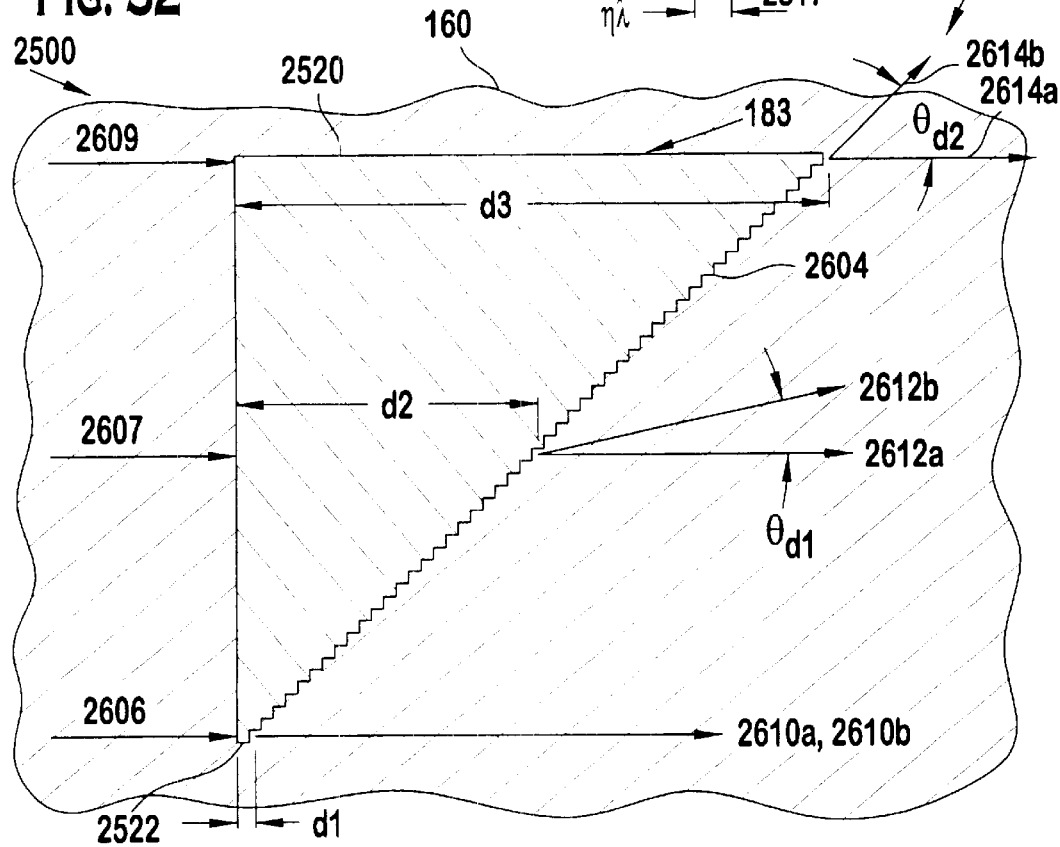
FIG. 32 shows a further top view of the passive optical waveguide device of FIG. 30 illustrating the diffraction of optical paths as light passes through the Echelle diffraction grating shown, wherein a region of static effective mode index that is projected from the Echelle diffraction grating is shown.
Figure 34:
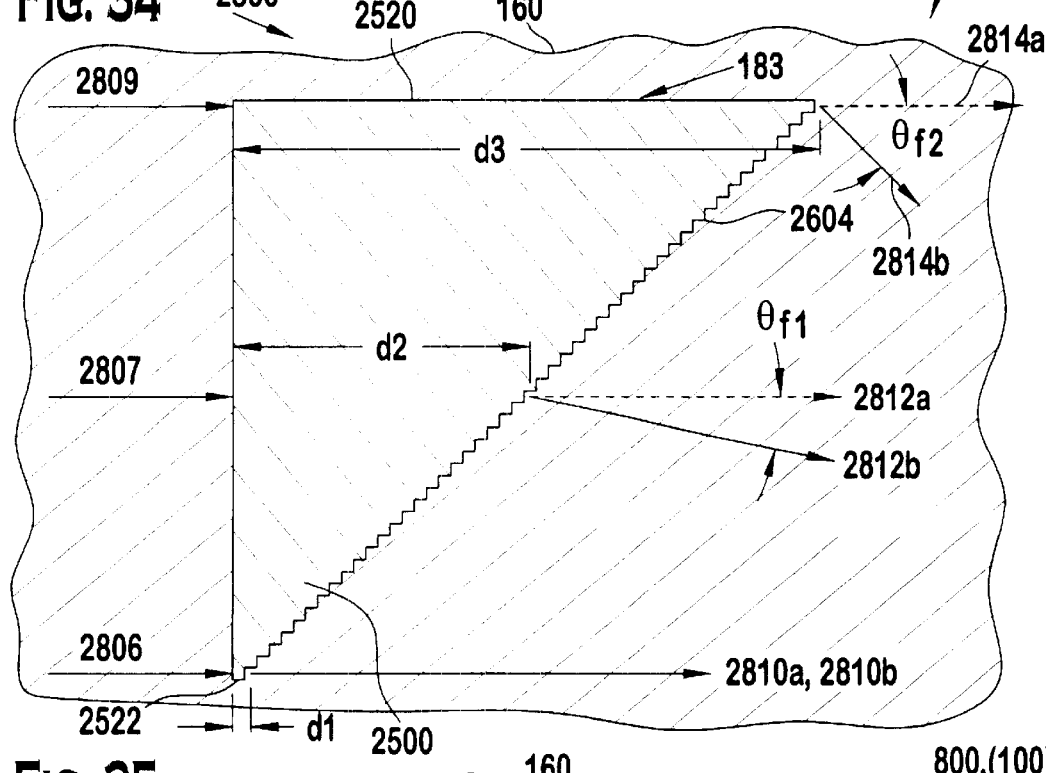
FIG. 34 shows a top view of a passive optical waveguide device illustrating the focusing of multiple optical paths as light passes through the Echelle lens grating similar to as shown in FIG. 30.
Figure 35:
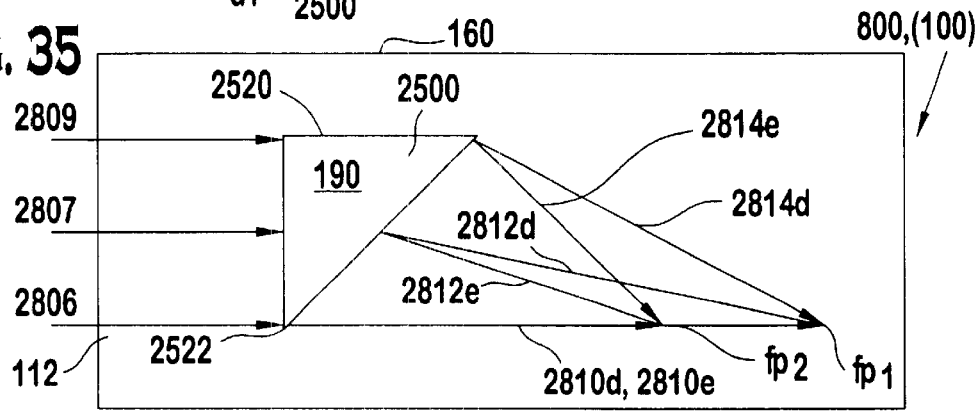
FIG. 35 shows a device view of the passive optical waveguide device that is configured as the Echelle lens grating as shown in FIG. 34 that acts to focus light.

The projected region of static effective mode index 183, shown in FIGS. 32, 34, and 35, can be viewed generally in cross-section as having the shape and dimensions of the Echelle-shaped polysilicon layer 2502 (including grooves 2515), and extending vertically through the entire thickness of the silicon layer 160. The numbers of individual grooves 2515 in the FIG. 30 embodiment of Echelle-shaped polysilicon layer 2502 may approach many thousand.

FIG. 32 shows the top cross sectional view of the region of static effective mode index 183 shaped as the polyloaded Echelle grating 2500. The optical waveguide 161 is envisioned to be a slab optical waveguide, and is configured to permit the angular diffraction of the beam of light emanating from the polyloaded Echelle grating 2500. Depending on the configuration of the FIGS. 30 and 31 embodiment of the Echelle-shaped polysilicon layer 2502, a projected region of static effective mode index 183 of the general shape shown in FIG. 32 is established within the optical waveguide 161. Depending upon the materials, doping, etc. of the Echelle-shaped polysilicon layer 2502 compared to the silicon layer 160 in FIG. 30, the propagation constant within the projected region of static effective mode index 183 can either exceed, or be less than, the propagation constant within the remaining part of the optical waveguide 161. The relative level of effective mode index (and therefore the level of propagation constant) within the projected region of static effective mode index 183 compared to outside of the projected region of static effective mode index 183 determines whether the optical waveguide 161 acts to diffract light or focus light. In this section, the Echelle-shaped polysilicon layer 2502 is configured to diffract light passing through the region of static effective mode index 183.

In FIG. 32, the three input light beams 2606, 2607, and 2609 extend into the optical waveguide 161. The input light beams 2606, 2607, and 2609 extend substantially parallel to each other, and substantially parallel to a side surface 2520 of the region of static effective mode index 183. The projected region of static effective mode index 183 precisely mirrors the shape and size of the FIGS. 30 and 31 embodiment of the Echelle-shaped polysilicon layer 2502. As such, the projected region of static effective mode index 183 extends vertically through the entire thickness of the silicon layer 160. The numbers of individual grooves 2515 in the FIGS. 30 and 31 embodiment of Echelle-shaped polysilicon layer 2502 may approach many thousand to provide effective diffraction, and therefore, individual groove dimensions are relatively small. It is therefore important that the projected region of static effective mode index 183 precisely maps from the Echelle-shaped polysilicon layer 2502 into the region of static effective mode index 183.

Three input light beams 2606, 2607, and 2609 are shown entering the projected region of static effective mode index 183; each light beam contains multiple wavelengths of light. The three input light beams 2606, 2607, and 2609 correspond respectively with, and produce, three sets of output light beams 2610a or 2610b; 2612a, 2612b or 2612c; and 2614a or 2614b as shown in FIG. 32. Each output light beam 2610, 2612, and 2614 is shown for a single wavelength of light. The output light beam represents the direction in which the light of one specific wavelength that emanates from adjacent grooves 2515 constructively interferes. In other directions, the light emanating from the adjacent grooves 2515 destructively interferes.

The lower input light beam 2606 travels for a very short distance d1 through the region of static effective mode index 183. Depending on whether the Echelle-shaped polysilicon layer 2502 exists, the lower input light beam 2606 exits as either output light beam 2610a or 2610b. Though the region of static effective mode index 183 has a different propagation constant then the rest of the optical waveguide 161, the amount that the output light beam 2610a or 2610b is diffracted is very small when compared to the amount of diffraction of the other output light beams 2612, 2614 that have traveled a greater distance through the projected region of static effective mode index 183.

The middle input light beam 2607 enters the projected region of static effective mode index 183 and travels through a considerable distance d2 before exiting from the polyloaded Echelle grating 2500. Depending on the height (not shown) of the FIG. 25 embodiment of the Echelle-shaped polysilicon layer 2502, the propagation constant in the optical waveguide 161 is set to a constant value within the region of static effective mode index 183. The propagation constant in the region of static effective mode index 183 will thereupon diffract light passing from the input light beam 2607 through an angle $\theta_{d1}$ along path 2612b.

If the Echelle-shaped polysilicon layer 2502 has a prescribed height, the output light beam 2614b will diffract through an output angle $\theta_{d2}$. The output angle $\theta_{d2}$ of output diffracted beam 2614b exceeds the output angle $\theta_{d1}$ of output light beam 2612b. The output angle varies linearly from one side surface 2522 to the other side surface 2520, since the output angle is a function of the distance the light is travelling through the projected region of static effective mode index 183.

When the polyloaded Echelle grating 2500 diffracts a single wavelength of light through an angle in which the waves are in phase, the waves of that light constructively interfere and that wavelength of light will become visible at that location. Light of different wavelength will not constructively interfere at that same angle, but will constructively interfere at some other angle. Therefore, in spectrometers, for instance, the location that light appears is related to the specified output diffraction angles of the light, and the respective wavelength of the light within the light beam that entered the spectrometer.

Figure 33:
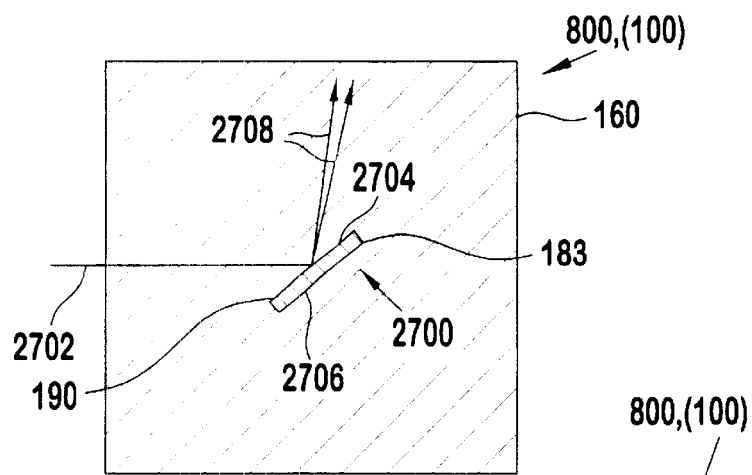
FIG. 33 shows a passive optical waveguide device configured to operate as an Echelle diffraction grating.

FIG. 33 shows one embodiment of a reflection polyloaded Echelle grating 2700 that is configured to reflect different wavelengths of light (instead of diffracting light) through an output reflection angle. For instance, an input light beam 2702 of a prescribed wavelength, as it contacts a grating surface 2704 of the projected reflection polyloaded Echelle grating 2700, will reflect an output light beam 2708 through an angle from the input light beam 2702. The propagation constant of the region of static effective mode index 183 will generally have to be higher for the reflection polyloaded Echelle grating 2700 than that for the diffraction polyloaded Echelle grating 2500, as shown in FIG. 32. In addition, the angle at which the grating surface 2704 faces the oncoming input light beam 2702 would likely be reduced if the light refracts, not reflects.

5. Polyloaded Optical Lens

The FIG. 30 embodiment of the polyloaded Echelle grating 2500 is configured to act as a lens to focus light as illustrated in FIGS. 34 and 35 (instead of a diffraction grating as described relative to FIG. 32). To act as a lens, the comparative effective mode indexes of the region of static effective mode index 183 and the remainder of the silicon layer 160 are such that incident light is either focused or defocused.

FIGS. 34 and 35 show three input light beams 2806, 2807, and 2809 that extend into the region of static effective mode index 183 in the optical waveguide 161. The input light beams 2806, 2807, and 2809 are shown as extending substantially parallel to each other, and also substantially parallel to the side surfaces 2520, 2522 of the projected region of static effective mode index 183. The projected region of static effective mode index 183 shown in FIGS. 34 and 35 generally mirrors vertically through the height of the silicon layer 160 the shape and size of the FIG. 30 embodiment of the Echelle-shaped polysilicon layer 2502.

Figure 28:
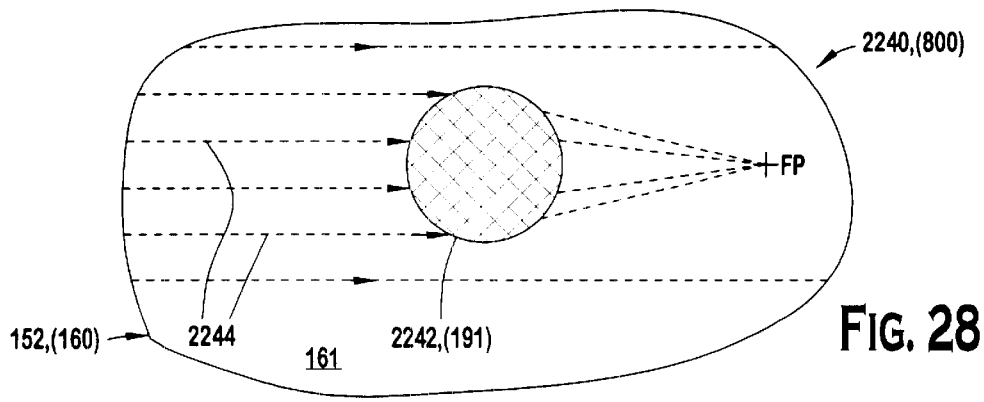
FIG. 28 shows a top view of another passive optical waveguide device that is configured as one embodiment of optical lens.

The light input from the input light beams 2806, 2807, and 2809 extend through the region of static effective mode index 183 to form, respectively, the three sets of output light beams shown in FIG. 28: 2810a and 2810b; 2812a and 2812b; and 2814a and 2814b. Each focused output light beam 2810, 2812, and 2814 represents a single light wavelength; and the output light beam represents the direction of travel of a beam of light of the single wavelength where the beam of light constructively interferes. In other directions, the light of the specific wavelength destructively interferes.

The lower input light beam 2806 enters near the bottom of the region of static effective mode index 183, and travels for a very short distance d1 through the projected region of altered effective mode index 190. The lower input light beam 2806 exits as output light beam 2810a that is substantially undiffracted from output light beam 2810b. As such, though the region of static effective mode index 183 has a different propagation constant than the remainder of the optical waveguide 161, the amount that the output light beam 2810a is focused is small compared with the amount of focusing on the other output light beams 2812, 2814 that have traveled a greater distance through the region of static effective mode index 183.

The middle input light beam 2807 enters the projected region of static effective mode index 183 and travels through a longer distance d2 before exiting from the projected polyloaded Echelle grating 2500. If the Echelle-shaped polysilicon layer 2502 has a medium depth (height), then the propagation constant within the region of static effective mode index 183 will not equal that within the surrounding optical waveguide 161. The propagation constant in the region of static effective mode index 183 will deflect light beam 2807 through an angle $\theta_{f1}$ along path 2812b. If the depth (height) of the Echelle-shaped polysilicon layer 2502 is increased by, e.g., depositing the polysilicon in the polysilicon layer for a greater time, the amount of deflection for focusing similarly increases.

If the Echelle-shaped polysilicon layer 2502 has a prescribed depth (height), the output light beam travels through an output angle $\theta_{f2}$ along output light beam 2814b. The output angle $\theta_{f2}$ of the output focused beam 2814b exceeds the output angle $\theta_{f1}$ of focused beam 2812b if the Echelle-shaped polysilicon layer 2502 has the same depth (height). The output angle varies linearly from one side surface 2522 to the other side 2520, since the output angle is a function of the distance the light is travelling through the projected region of static effective mode index 183.

FIGS. 34 and 35 demonstrate that the Echelle-shaped polysilicon layer 2502 can be configured in a manner to cause the polyloaded Echelle grating 2500 to act as a focusing device. The depth (height) of the deposited and etched Echelle-shaped polysilicon layer 2502 therefore partially dictates the focal length. For example, assume that a given projected region of static effective mode index 183 results in the output focused beams 2810, 2812, and 2814 converging at focal point $f_{P1}$ thereby, effectively determining the focal length of the lens. The FIGS. 34 and 35 embodiment of passive optical waveguide device 800 acts as an optical lens having a fixed focal length.

As indicated by the embodiments of passive optical waveguide devices 800 that include the polysilicon layer 191 configured as an Echelle grating, precise features such as gratings can be provided on the polysilicon layer 191, and these fine features can be precisely projected within the region of static effective mode index 183 that has similarly fine gratings.

Figure 29:
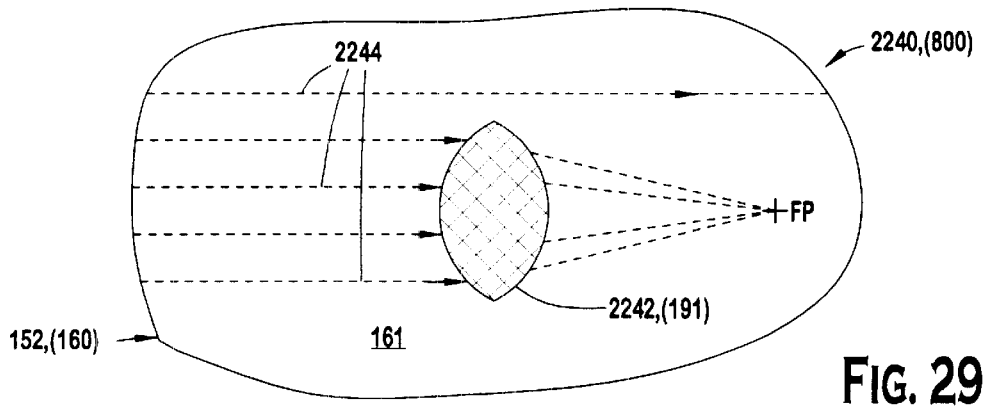
FIG. 29 shows a top view of yet another passive optical waveguide device that is configured as another embodiment of the optical lens.

FIGS. 28 and 29 illustrate two additional embodiments of passive optical waveguide 800 that are configured as optical lenses 2240, that can be compared to the embodiment of optical lens created by the polysilicon layer 2502 as shown in FIGS. 34 and 35. In FIGS. 28 and 29, the polysilicon layer 191 is deposited on the silicon layer 160 of the SOI wafer 152. As mentioned previously, the gate oxide layer (not shown) is initially deposited on the silicon layer 160, and the polysilicon (a portion of which will eventually make up the polysilicon lens 2242) is deposited as a layer on the gate oxide layer 110. The polysilicon is then etched to form a polysilicon lens 2242, and the gate oxide layer 110 is etched following the etching of the polysilicon layer in a shape substantially similar to the polysilicon lens.

The lens 2240 may be configured in a variety of shapes as is evident from FIGS. 28 and 29. For example, the lens 2240 in FIG. 28 is substantially circular. By comparison, the lens 2240 shown in FIG. 29 has a more traditional lens configuration. Any shape that is known to form discrete optical lenses may be patterned as the polysilicon lens 2242 while remaining within the scope of the present disclosure. A plurality of light beams 2244 are illustrated as following the silicon layer 160 partially forming the optical waveguide 161. Those optical beams are modeled as travelling substantially parallel. Those optical beams that contact the region of static effective mode index (that corresponds to the shape of the polysilicon lens 2242 and is projected within the optical waveguide 161) will be deflected by the region of static effective mode index toward the focal point FP. By comparison, those optical beams that do not contact the region of static effective mode index will continue substantially straight.

6. Other Polyloaded Passive Optical Waveguide Devices

This section describes a variety of passive optical waveguide devices the can be fabricated using the deposited and/or etched polysilicon layers 191. In these passive optical waveguide devices 800, the region of static effective mode index substantially corresponds to the shape of the polysilicon layer 191 for the vertical height of the optical waveguide 161. For example, a triangular polysilicon layer 191 projects a triangular region of static effective mode index that extends through substantially the entire vertical height of the optical waveguide 161 (including the polysilicon layer 191, the gate oxide layer 110, and the silicon layer 160). By comparison, a circular polysilicon layer 191 projects a circular region of static effective mode index through substantially the entire vertical height of the optical waveguide 161.

Figure 27:
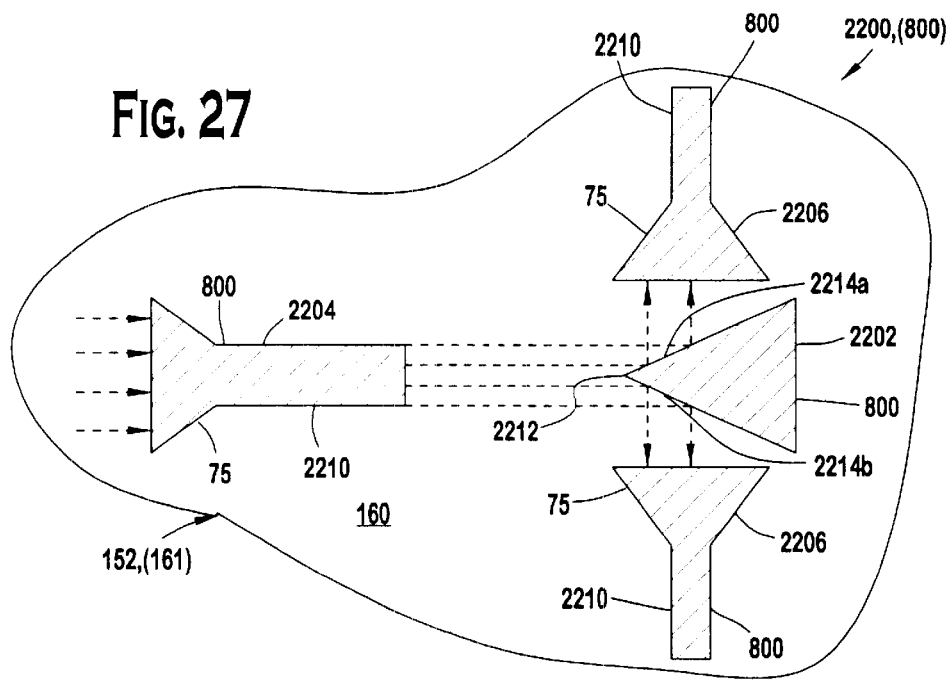
FIG. 27 shows a top view of a plurality of the passive optical waveguide devices that are configured as a beam-splitter.

FIG. 27 shows a top view of one embodiment of a beamsplitter 2200 that is fabricated on a thin Silicon-On-Insulator (SOI) wafer 152. The beam splitter 2200 includes a beam splitter element 2202, an input waveguide 2204, and a plurality of output waveguides 2206. Each of the beam splitter elements 2202, input waveguide 2204 and output waveguides 2206 may be fabricated as part of a single polysilicon layer deposited above the silicon layer 160. As described herein, a gate oxide is formed between the polysilicon of each of the beam splitter element 2202, input waveguide 2204 and output waveguide 2206 and the silicon layer 160. Light travelling with the optical waveguide 161 is illustrated in dotted-lines. The input waveguide 2204 and each of the output waveguides 2206 is formed with the adiabatic taper 75 and a constant width-waveguide portion 2210. The adiabatic taper 75 takes light over a considerable area within the optical waveguide 161 and laterally merges with the light so that the light is coupled into the constant width waveguide 2210. As such, the adiabatic taper 75 may be viewed as acting as a light combiner, or a funnel of light, to direct a relatively large beam of light into a smaller optical waveguide.

The beam splitter element 2202 has a triangular prismatic configuration with one its points 2212 directed to the input waveguide 2204. Light following the input waveguide 2204 will be directed at either side of the point 2212 onto facets 2214a, and 2214b. That light that is directed from the input waveguide 2204 to be facet 2214a will be reflected to the output waveguide 2206 on the upper portion of FIG. 27. By comparison, that light that is directed from the input waveguide 2204 to the facet 2214b will be reflected to the output waveguide 2206 along the lower portion of FIG. 27. The beam splitter element 2202 can be positioned relative to the input waveguide 2204 so that approximately half the light traveling through the input waveguide 2204 is directed toward the upper output waveguide 2206 and the remainder of the light is directed to the lower output waveguide 2206. By comparison, the position of the beam splitter element 2202 may be selected to provide a controllable distribution of light between the two output waveguides 2206.

It is therefore evident that a large variety of passive optical waveguide devices 800 can be fabricated by initially layering a gate oxide on the silicon layer 161, followed by the polysilicon layer 191 on the gate oxide layer 110. The shape of the polysilicon layer 191 and subsequently the shape of the gate oxide, can thereupon be etched to form the desired pattern on the surface of the silicon layer 160 of the SOI wafer 152. By selecting the desired shape of the patterning of the polysilicon layer 191, the desired optical operation of the passive optical waveguide device 800 may be provided.

IIIB. Patterned Silicon Based Passive Optical Waveguide Devices

The above section has described those embodiments of passive optical waveguide devices 800 that are configured by patterning (e.g., etching and/or depositing material) the polysilicon layer 191 that is deposited on the silicon layer 160 (with the gate oxide layer 110 formed therebetween) as shown in FIG. 18. Further embodiments of passive optical waveguide devices 800 may be formed in the silicon layer 160 by patterning the silicon layer optical insulator 73 in the silicon layer 160, as shown in FIGS. 6A and 6B. Light that is following an unetched silicon portion of the silicon layer that contacts the TIR boundary 195 (created by a junction with the silicon layer optical insulator 73) will be reflected back by the TIR boundary 195 and follow the unetched portion. These embodiments of passive optical waveguide devices may be: a) independent devices that are fabricated separately on a separate wafer 152 from, and operate independently from, certain ones of the passive optical waveguide devices that include polysilicon; b) devices that are fabricated on the same SOI wafer 152 as, but operate independently from, certain ones of the passive optical waveguide devices that include polysilicon; c) devices that are fabricated on the same SOI wafer 152 as, and whose optical operation is somehow related, to certain ones of the passive optical waveguide devices that include polysilicon; or d) devices that are fabricated as a portion of the same passive optical waveguide device that includes polysilicon.

As such, certain aspects of the fabrication and operation of certain embodiments of those passive optical waveguide devices 800 that are fabricated by etching and/or depositing the silicon layer optical insulator 73 within the silicon layer 160 are described in this section.

1. Waveguide Devices

Figure 36:
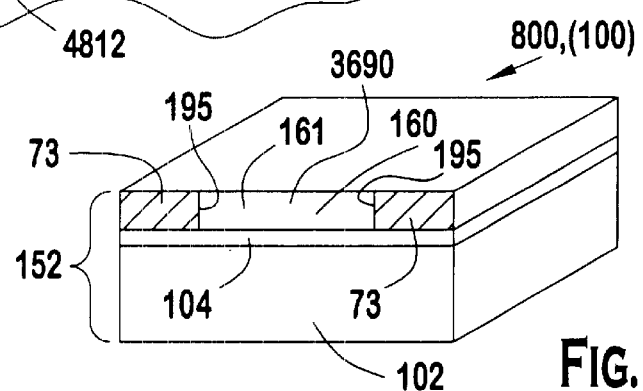
FIG. 36 shows a perspective view of another embodiment of passive optical waveguide device that is formed by etching the silicon layer, that is configured as an optical waveguide.

These embodiments of waveguide devices are created by forming TIR boundaries 195 at selected locations. Considering the embodiment of passive optical waveguide device 800 shown in FIG. 18 that is configured as a passive optical waveguide, if the polysilicon layer 191 (and optionally the gate oxide layer 110) was removed, then the passive optical waveguide device would still function as an optical waveguide. The silicon layer optical insulator 73 maintains light that is travelling within the unetched portion of the silicon layer within the unetched portion using the TIR boundary 195. This embodiment of passive optical waveguide device 800 is illustrated in FIG. 36. Without the polysilicon layer 191 in the passive optical waveguide device 800, there is no region of static effective mode index 183 being projected into the silicon layer 160 by the polysilicon layer in these embodiments of passive optical waveguide devices. The optical waveguide 161 is constrained to follow the silicon layer 160. The characteristics of light following the optical waveguide device is determined based on the characteristics of the (unetched) silicon included in the silicon layer 160 as well as the TIR boundary 195, in which light contacts the peripheral boundaries defined by the TIR boundary 195 of the optical waveguide 161 within the silicon layer 160. The peripheral boundaries of the optical waveguide 161 include the silicon layer optical insulator 73 on either lateral side of the optical waveguide 161, the optical insulator 104 underneath the silicon layer 160, and the air (or the gate oxide, if one exists) on the upper surface of the silicon layer. In this disclosure, the silicon layer optical insulator 73 is also referred to as an "etched portion" of the silicon layer 160, while the portion of the silicon that remains following etching the etched portion is referred to as an unetched portion 3690. The unetched portion 3690 often corresponds to the portion of the optical waveguide 161 that is within the silicon layer 161.

2. Optical Mirrors

Figure 37:
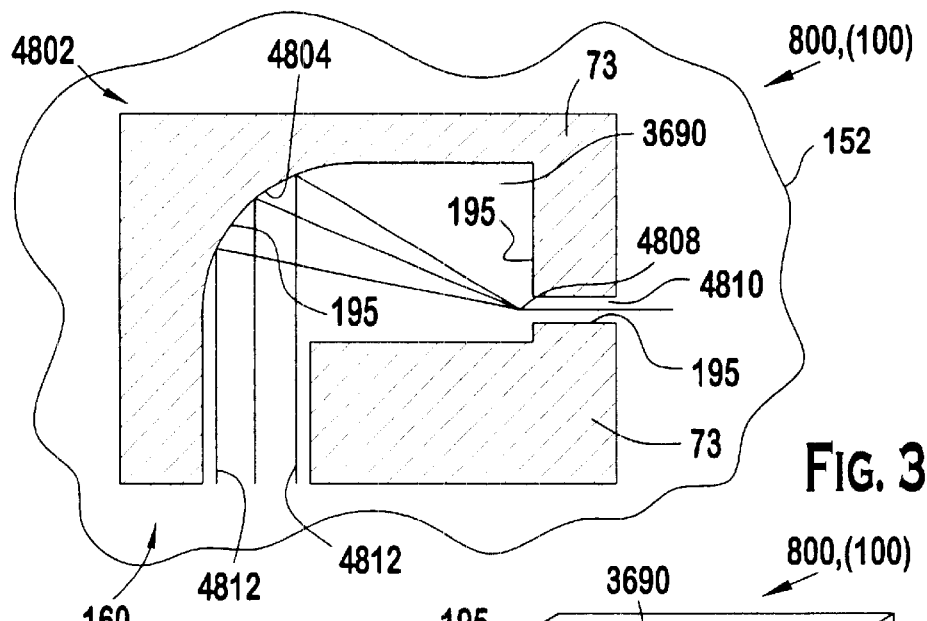
FIG. 37 shows a top view of another embodiment of passive optical waveguide device that is formed by etching the silicon layer, that is configured as a mirror.
Figure 38:
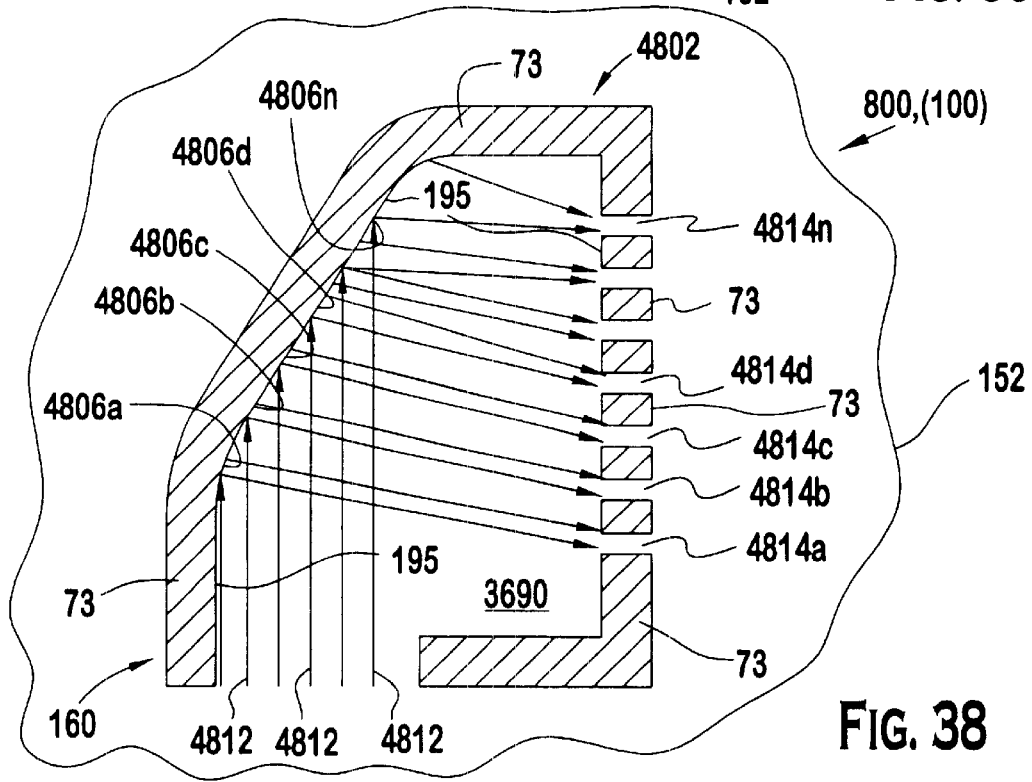
FIG. 38 shows a top view of yet another embodiment of passive optical waveguide device that is formed by etching the silicon layer, that is configured as a multiple mirror device.

FIGS. 37 and 38 illustrate two embodiments of passive optical waveguide devices 800 that are configured as optical mirrors 4802, and are fabricated by etching within the silicon layer 160 one or more etched portions and depositing silicon layer optical insulator 73 in the etched regions. The optical mirrors 4802 rely on the TIR boundary 195 created within the silicon layer at the junction between the silicon layer 160 and the etched portion or silicon layer optical insulator 73. As a result of this TIR boundary 195, the embodiments of passive optical waveguide devices as illustrated in FIGS. 37 and 38 function as optical mirrors 4802. The use of TIR boundary 195 within the silicon layer 160 therefore can be used to provide optical waveguides having limited transmission losses (as illustrated in FIG. 36 as described above), as well as optical mirrors 4802 that have limited optical losses during reflection.

While the embodiment of optical mirror 4802 shown in FIG. 37 has a single curved mirror surface 4804, the optical mirror 4802 shown in FIG. 38 has a plurality of mirrored surfaces 4806a, 4806b, ..., 4806n. It is preferred that the mirror surface 4804 shown in FIG. 37 is parabolic, wherein substantially parallel beams of light shall be directed to a coupling point 4808, that is generally aligned with a light outlet port 4810. As such, light that reflects off of the mirror surface 4804 is directed to the light outlet port 4810. There is only a single light outlet port 4810 in the embodiment of optical mirror 4802 shown in FIG. 37. It is envisioned that the mirror surface 4804 is preferably parabolic, in such a manner that the light reflecting off of the mirror surface 4804 is most efficiently directed at the coupling point 4808. While there is a considerable amount of surface etched from the silicon layer to create the etched portion or silicon layer optical insulator 73, shown in FIG. 37, the only critical portion that has to be etched to form the optical mirror 4802 is the mirror surface 4804 itself. For example, substantially parallel light generally following the input light beams 4812 will encounter the mirror surface 4804, and be directed toward the coupling point 4808, so long as the portion of the silicon layer optical insulator 73 that forms the mirror surface 4804 provides the TIR boundary 195 (regardless of the configuration of the remainder of the portions of the silicon layer optical insulator 73 shown in FIG. 37). Substantially all wavelengths of optical light that reflect off of the mirror surface 4804 will be directed to the coupling point 4808. As such, an optical mirror 4802 acts as a light combiner to combine light at the coupling point regardless of the wavelength of the light. Therefore, in the optical mirror 4802, different wavelengths of light are not diffracted at different angles by the mirror surface.

FIG. 38 shows another embodiment of optical mirror 4802 that is more complex than the embodiment of optical mirror shown in FIG. 37. In FIG. 38, there are a plurality of mirror surfaces 4806a to 4806n. Input light 4812 is generally applied to the optical mirror 4802 in a manner that encounters one of the mirror surface 4806a to 4806n. Each mirror surface 4806a to 4806n is configured as a distinct mirror, and reflects the light that encounters that mirror, and directs all the light to a particular coupling point associated with that mirror surface 4806a to 4806n (not shown), that is within a respective light outlet port 4814a to 4814n. As such, substantially all the light that is directed at mirror surface 4806a will be reflected out of light outlet port 4814a; substantially all of the light that is directed at mirror surface 4806b will be reflected and exit out the light outlet port 4814b; etc. In one preferred embodiment, each mirror surface 4806a to 4806n is configured as a parabolic mirror.

3. Silicon Layer Echelle Gratings

FIGS. 39A, 39B, 40, 41A and 41B show two embodiments of the silicon layer Echelle gratings 4002. The silicon layer Echelle gratings 4002 are fabricated by etching and/or depositing the etched portion or silicon layer optical insulator 73, which is shaped as an Echelle grating in the silicon layer 161 to create the TIR boundary 195 that is shaped as an Echelle grating. The silicon layer optical insulator 73 therefore provides the TIR boundary 195 to light that is travelling in the unetched portion of the silicon layer 161, in a similar manner to as illustrated relative to FIG. 5. The silicon layer Echelle grating 4002 includes a series of Echelle reflectors 4004, connected by step connectors 4006, which are illustrated in expanded view in FIG. 40. Since the etched portion or silicon layer optical insulator 73 provides total internal reflection, the silicon layer Echelle grating 4002 acts as a refectory Echelle grating instead of refractory Echelle grating, as illustrated in the embodiments in FIGS. 31, 32, 34, and 35. The Echelle reflectors 4004 follow nearly straight offset path 4008 that is offset from the non-offset path 4010. If Echelle reflectors 4004 did not have the step connectors 4006 connecting them, then the Echelle reflectors 4004, as illustrated in FIG. 40 would follow the non-offset path 4010. The step connectors 4006 cause each Echelle reflector 4004 to be slightly more laterally offset from the non-offset path 4010 than the original Echelle reflector 4004 below it.

FIG. 40 illustrates how the slight offset provided to each adjacent pair of Echelle reflectors 4004a and 4004b, provides for the grating action by the silicon layer Echelle grating 4002. Two substantially parallel input light beams 401a and 4012b are applied to the silicon layer Echelle grating 4002 at the respective adjacent Echelle reflectors 4004a and 4004b, and respectively reflect off the Echelle reflectors 4004a and 4004b to follow respective output light beams 4014a and 4014b. If both Echelle reflectors 4014 were aligned with, or equidistant from, the non-offset path 4010, then the distance that light would travel as the light reflects off of adjacent Echelle reflectors 4004a and 4004b would be equal. However, the Echelle reflector 4004b is offset to be a greater distance from the non-offset path 4010 than the Echelle reflector 4004a. As such, incident light 4012b that reflects off of the Echelle reflector 4004b travels an additional distance to, and from, the Echelle reflector 4004b (illustrated respectively as L1 and L2) than the input light beam 4012a that reflect off of the Echelle reflector 4004a. The total difference in distance of light traveling, and reflecting, off of Echelle reflectors 4004a and 4004b is therefore indicated as L=L1+L2. When L is an additional offset length that corresponds to an optical phase that equals m2π for the central design wavelength of the silicon layer Echelle grating 4002, the light reflected off of the Echelle reflectors 4004a and 4004b will constructively interfere. The silicon layer Echelle grating 4004 can be designed so that the different wavelengths of light constructively interfere at different locations along a remote interference pattern location 4016, illustrated as λ1, λ2, and λN in FIG. 39A. As such, light of wavelength λ1 would constructively interfere, and produce an interference pattern, at the location indicated as λ1. Light having the wavelength λ2 reflecting off of the silicon layer Echelle grating 4002 would constructively interfere, and produce an interference pattern, at the location indicated as λ2, etc.

FIGS. 41A and 41B illustrate another embodiment of silicon layer Echelle grating 4002, that is etched in the etched portion or silicon layer optical insulator 73, and configured as an optical lens. Light of a specific waveguide, as illustrated in FIG. 41A, will reflect off of the offset path 4008 and be directed toward a focal point FP. Light having different wavelengths will be reflected to different focal points FP that are spaced, at different locations, relative to the optical lens. This embodiment of silicon layer Echelle grating 4002 is a reflectory type Echelle grating. In considering the difference in distance that light that reflects off of each of the Echelle reflectors 4004 has to travel, in the FIG. 41 embodiment of silicon layer Echelle grating 4002, the entire distance from the input light beams 4012, reflecting off of the offset path 4008 that defines locations of the Echelle reflectors 4004, and following the output light beams 4014 to the focal point FP, has to be considered. The structure and operation of the Echelle grating, either refectory or refractory, and acting either as an optical diffractor or lens, is generally known when the Echelle grating is configured as a discrete device. As such, the description of the particular operation of Echelle gratings will not be provided in greater detail.

The above embodiments of passive optical waveguide devices that are etched and/or deposited to create an etched portion or silicon layer optical insulator 73 that causes light traveling with the remainder of the silicon layer to exhibit total internal reflection are described in this portion as being distinct from those embodiments of passive optical waveguide devices 800, as described above, that are formed by depositing and/or etching polysilicon layers above the upper surface of the silicon layer. It is envisioned, however, that many embodiments of passive optical waveguide devices may well be created by a combination of these two embodiments on a single wafer. One example where such devices may be combined on a single wafer is illustrated in FIGS. 6A to 6D. During fabrication of the optical waveguide 161 for such a combination of devices on a single wafer, the various silicon layer optical insulator 73, optical insulators 104, and gate oxide layers 110, can be fabricated at the desired locations to provide passive optical waveguide devices 800 that have quite similar effective mode indexes. Thereupon, the polysilicon layer can be deposited in a manner known to modify the effective mode index, in each region of static effective mode index, to a desired value.

4. Inter-Optical Waveguide Coupler

FIGS. 42A and 42B respectively illustrate top and end views of one embodiment of an inter-optical waveguide coupler 4902. This embodiment of passive optical waveguide device 800 involves etching of both the silicon layer 160 (to provide the TIR boundary 195) and the deposited polysilicon layer 191 (to create the static region of altered effective mode index). There are two passive optical waveguides 161a and 161b, with each optical waveguide configured similarly to that shown in FIG. 36. The light couplers 112 and 114 described above describes coupling light into, or out of, one single optical waveguide 161. By comparison, the inter-optical waveguide coupler 4902 described relative to FIGS. 42A and 42B couple light from one optical waveguide 161a to another optical waveguide 161b. Each optical waveguide 161a and 161b is bounded by an etched portion or silicon layer optical insulator 73, that creates a TIR boundary 195, formed on each lateral side thereof to constrain light to follow the unetched portion 3690 of the silicon layer 160. As such, for those portions of the optical waveguides 161a and 161b that are remote from a polysilicon coupler portion 4904, light is constrained to follow the respective unetched portion 3690 of each optical waveguide 161a and 161b as delineated by the TIR boundaries 195.

The polysilicon coupler portion 4904 includes two overlying portions 4906 and 4908 that at least partially overlie, and are deposited on, the respective optical waveguides 161a and 161b. The polysilicon coupler portion 4904 also includes a bridging portion 4910 that optically bridges the overlying portions 4906 and 4908. The polysilicon coupler portion 4904 is deposited above the silicon layer 160 (there may not include a gate oxide layer 110 in this embodiment of passive optical waveguide device 800). Light following the optical waveguide 161a, as illustrated in FIG. 42A, that travels underneath the polysilicon portion 4904 can either continue to follow the optical waveguide 161a, as indicated by arrow 4922, or alternatively such light can travel via an evanescent coupling region 3692 of the optical waveguide 161a, through the polysilicon coupler portion 4904, and then via another evanescent coupling region 3692 to follow the optical waveguide 161b.

The configuration of the polysilicon coupler portion (e.g., the degree of overlap with the respective optical waveguides 161a and 161b, the dimensions of portion 4904, etc.) can be modified to dictate the percentage of light following the optical waveguide 161a (as indicated by the arrow 4920) that will continue to follow the optical waveguide 161a as indicated by arrow 4922, and what percentage will split off and travel via the polysilicon coupler portion 4904 to follow the alternate optical waveguide 161b as indicated by the arrow 4924. In a similar manner as illustrated in FIGS. 42A and 42B, one embodiment of the polysilicon coupler portion 4904 can be provided that couples light from virtually any active optical waveguide device or passive optical waveguide device, as described herein, to an alternate active or passive optical waveguide device.

IV. Light Coupling and Methods of Manufacture of Optical Waveguide Devices

Electronic devices 5101, active optical waveguide devices 150, and passive optical waveguide devices 800 can each be fabricated with FET, HEMT, and other known semiconductor optical waveguide devices 100 using CMOS, SOI, and VLSI technologies. VLSI and CMOS masks are used to simultaneously deposit and/or etch on a single SOI wafer 152 one or more passive optical waveguide devices 800, one or more active optical waveguide devices 150, and/or one or more electronic devices 5101.

This section describes a variety of embodiments of light couplers 112 that may be used to apply light into, or receive light from, the optical waveguide 161 included in an integrated optical/electronic circuit 103 as shown in FIGS. 43 to 54, and 55A to 55G. Coupling efficiency of the light couplers 112 is important to consider for passive optical waveguide devices 800 and active optical waveguide devices 150. Regardless of how effective the design of the various optical waveguide devices 100, each optical waveguide device 100 depends on coupling efficiency of light into, or out of, one or more optical waveguides 161 using the light couplers 112. The term "integrated optical circuit" as used in this disclosure (certain embodiments shown in FIGS. 43 and 44) is considered an "integrated optical/electronic circuit" 103 that lacks any active electronics components. In this disclosure, the term "integrated optical/electronic circuit" generically includes integrated optical circuits as well as integrated optical/electronic circuits.

There are a number of aspects described herein which are associated with the concept of combining electronic concepts and optical concepts into an integrated optical/electronic circuit 103, certain embodiments of which are shown in FIGS. 43 to 54, and 55A to 55G. The optical functions may incorporate "footprints" on the integrated optical/electronic circuit 103 for electronic functions that would otherwise represent wasted space on the SOI wafer 152. The integrated optical/electronic circuit 103 provides a common fabrication/manufacturing platform for passive optical waveguide devices 800, active optical waveguide devices 150, and electronic devices 5101. As such, the integrated optical/electronic circuit 103 permits common design techniques for building complex optical (and electronic) functions on a single chip.

Figure 43:
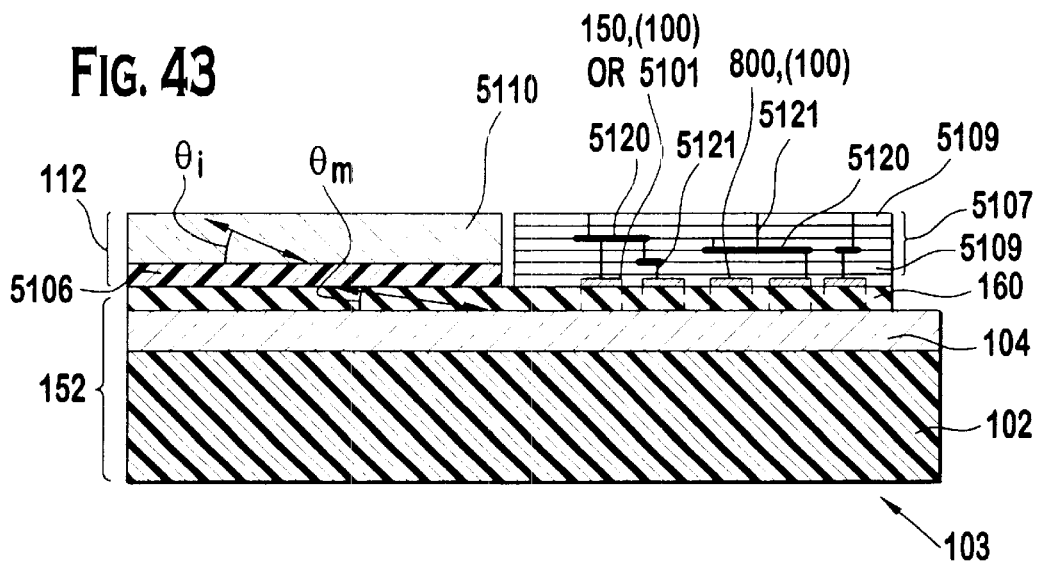
FIG. 43 shows a cross-sectional view of one embodiment of an integrated optical/electronic circuit.
Figure 44:
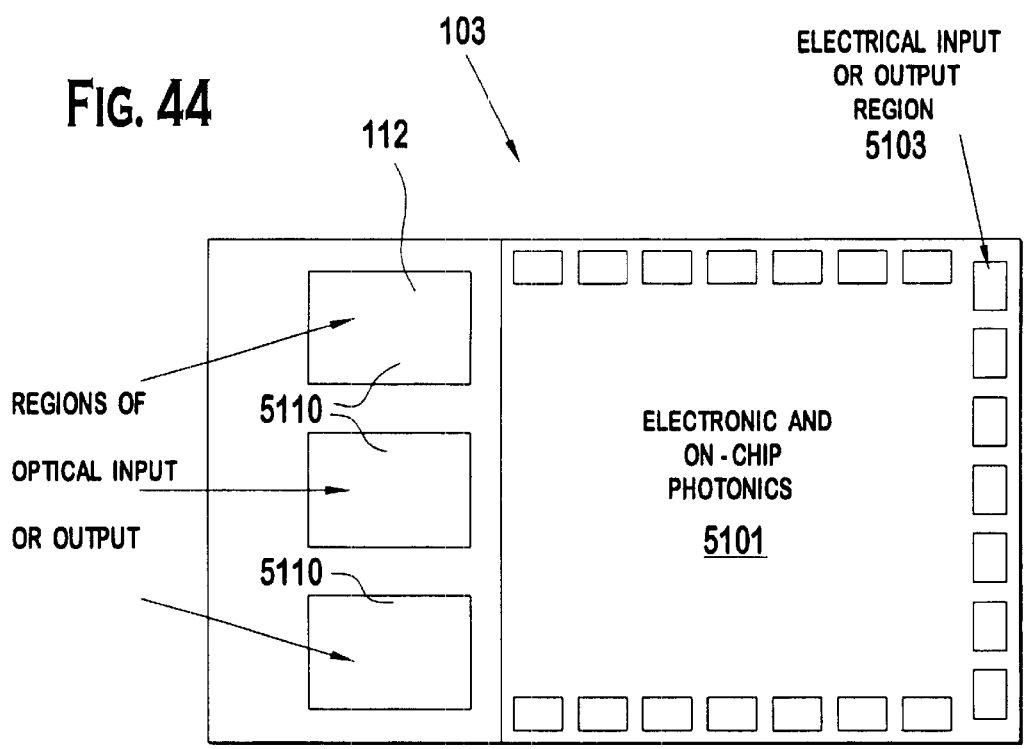
FIG. 44 shows a top view of the embodiment of the integrated optical/electronic circuit shown in FIG. 43.

FIG. 43 shows a side cross sectional view, and FIG. 44 shows a top view, of one embodiment of an integrated optical/electronic circuit 103 including a plurality of light couplers 112 and the on-chip electronic device 5101. The on-chip electronic device 5101 is formed on the silicon-on-insulator (SOI) wafer 152, as shown in FIGS. 43 to 54.

Figure 47:
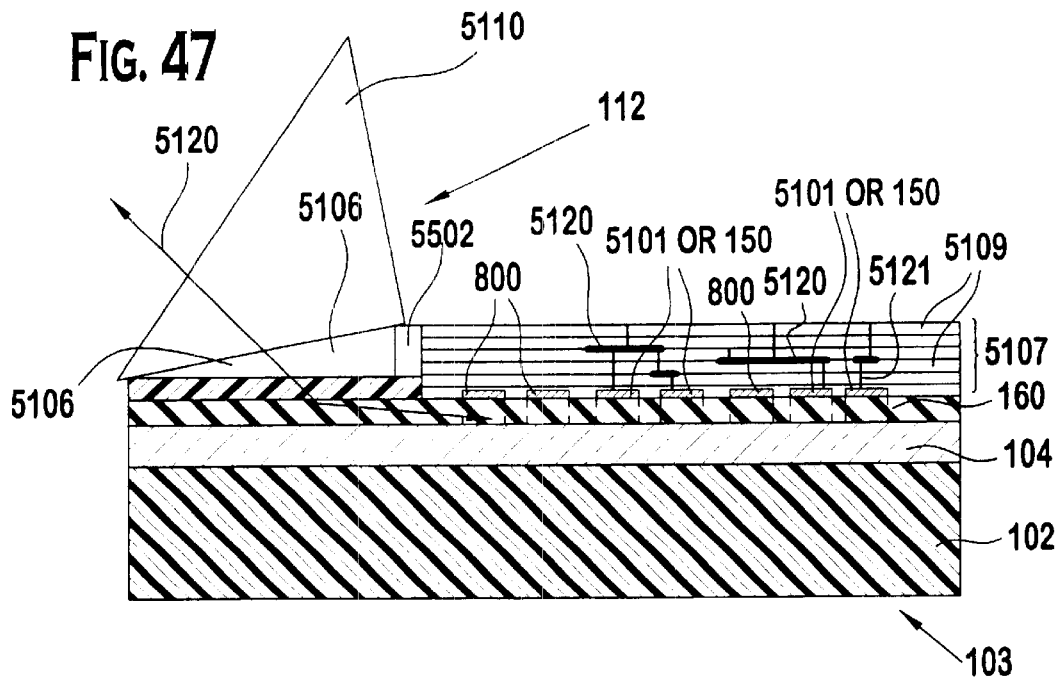
FIG. 47 shows yet another cross-sectional view of an alternate embodiment of the integrated optical/electronic circuit.
Figure 48:
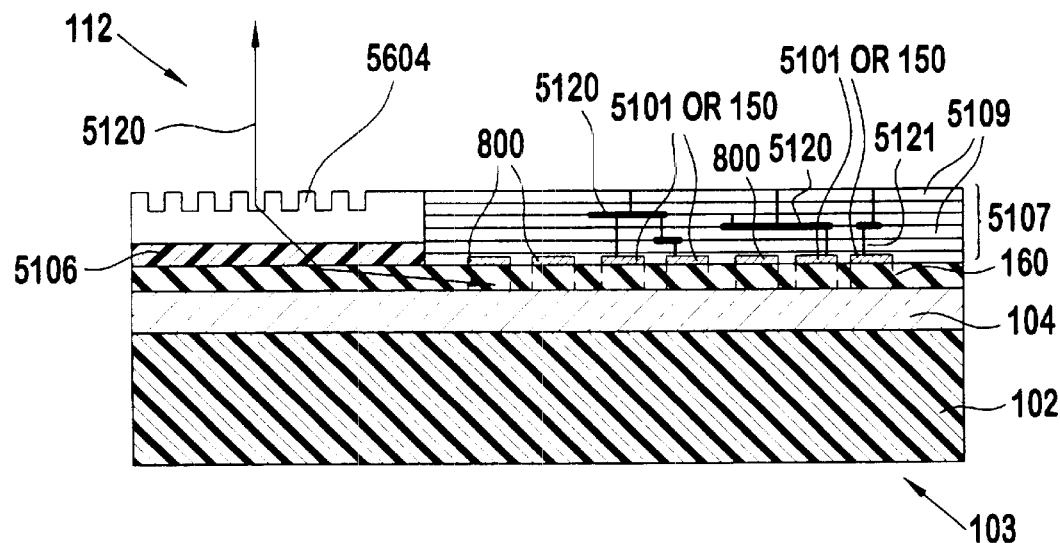
FIG. 48 shows a cross-sectional view of yet another alternate embodiment of the integrated optical/electronic circuit.
Figure 49:
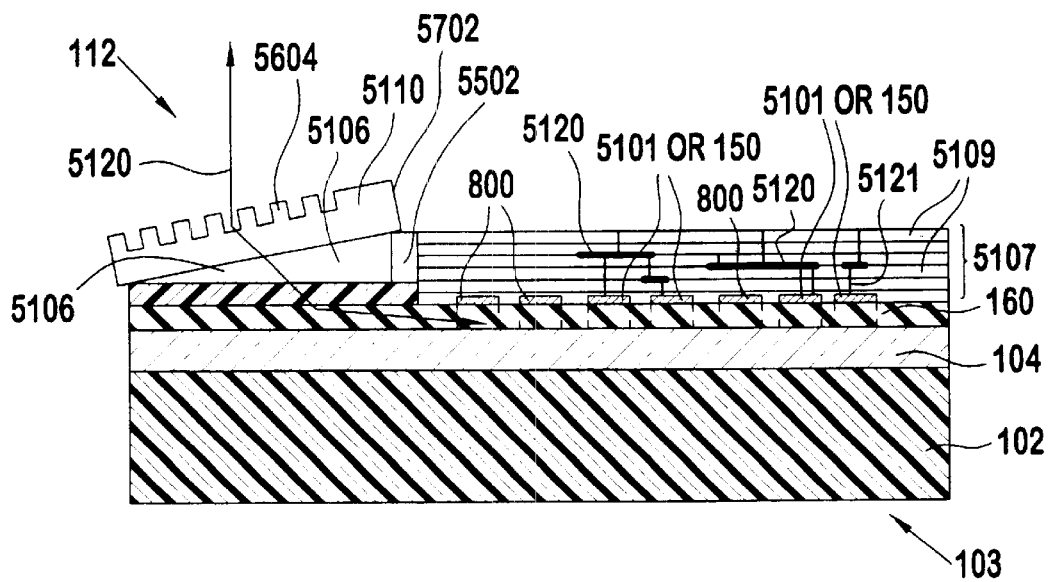
FIG. 49 shows a cross-sectional view of another alternate embodiment of the integrated optical/electronic circuit.

Each light coupler 112 includes an evanescent coupling region 5106 and a light coupling portion 5110. The evanescent coupling region 5106 is associated with the upper surface of the silicon layer 160 and the lower surface of the light coupling portion 5110. For example, the evanescent coupling region 5106 configured as a tapered gap portion as shown in FIGS. 47 and 49 is adjacent an angled lower surface of the light coupling portion 5110. A constant gap evanescent coupling region 5106 as shown in FIGS. 46 and 48 is adjacent a level lower surface of the light coupling portion 5110. Each light coupler 112 may at any point in time act as either an input coupler, an output coupler, or both an input and output coupler simultaneously. For those light couplers 112 that are acting as an input coupler, the light passes through the light coupling portion 5110 to enter the silicon layer 160 through the evanescent coupling region 5106. For those light couplers 112 that are acting as an output coupler, the light passes from the silicon layer 160 to the evanescent coupling region 5106, and exits the light coupling portion 5110.

FIG. 43 illustrates certain optical principles of concern to an integrated optical/electronic circuit 103 design. The silicon layer 160 has a refractive index of $n_{Si}$, while the light coupling portion 5110 is formed from silica or silicon that has a refractive index of $n_i$. The angle at which light in the light coupling portion 5110 enters/exits the gap evanescent coupling region 5106 is $\theta_i$. By comparison, the angle at which the light enters/exits the silicon layer 160 is the mode angle, $\theta_m$. The mode angle $\theta_m$ differs for each mode of light flowing within the silicon layer 160. Therefore, if the optical waveguide 161 can support one or more waveguide modes, there will be a plurality of mode angles $\theta_{m1}$ to $\theta_{mx}$ depending on the number of modes. For example, the silicon layer 160 may have a height of $0.2\mu$. The silicon layer 160 is surrounded by the evanescent coupling region 5106 and the first optical insulator layer 104 (both of which are formed from glass). In one embodiment, the silicon layer 160 supports only a single TE mode angle $\theta_m$ of approximately 56 degrees, and the incident light angle $\theta_1$ satisfies equation 6:

$$n_i \sin \theta_i = n_{Si} \sin \theta_m \quad \text{(equation 6)}$$

where $\theta_m$ is the mode angle of any particular mode of light.

There are specific requirements for the refractive index of the evanescent coupling region 5106, (also known as the gap region). The refractive index of the evanescent coupling region 5106 has to be very close to that of the silicon layer 160. In general, the upper cladding of the silicon layer 160 will be one of the often-used materials such as glass, polyamide, gate oxides, or other insulators used in construction of electronic devices 5101 and active optical waveguide devices 150. The evanescent coupling region 5106 may be made from the same material, air, or filled with a polymer-based adhesive that has a similar refractive index as the silicon layer 160. It is desired that the silicon layer 160 have quite similar effective mode index in the regions adjacent to the evanescent coupling region 5106 as in regions remote from the evanescent coupling region 5106.

The purpose of the on-chip electronic device 5101 is to supply electricity to any of the desired components adjacent to the optical waveguide 161 that require electricity, such as the active optical waveguide device 150. The electronic device 5101 can also perform other electrical signal processing on or off the SOI wafer 152. This on-chip electronic device 5101 uses CMOS fabrication techniques that provide, for example, for metal deposition, etching, metalization, masking, ion implantation, and application of photoresist. The electrical conductors of the on-chip electronic device 5101 form a complex multi-level array of generally horizontally extending metallic interconnects 5120 and generally vertically extending vias 5121 as shown in FIG. 43. The vias 5121 extend between multiple metallic interconnect layers at different vertical levels. The metallic vias 5121 that extend to the lower surface of the on-chip electronic device 5101 typically contact a metallization portion (e.g., a contact for the gate electrode) on the upper surface of the silicon layer 160 to controllably apply electrical signals thereto. For instance, in the embodiment of active optical waveguide device 150 shown in FIG. 7B, the voltage source 202 and the substantially constant potential conductor 204 selectively applies the electricity via the electrical connections. A particular configuration of vertically extending metallic vias 5121 and horizontally extending metallic interconnect layers 5120 is located within the on-chip electronic device 5101 as shown in FIG. 43. The electronic device 5101 may generate electronic signals to control the operation of the active optical waveguide devices 150, as shown, e.g., in FIGS. 4, 6C, 7A, 7B, and 7C etc. The electronic device 5101 may also apply electrical signals to other electronic devices. The electronic device 5101 is not associated with, and does not interface with, the passive optical waveguide device 800.

Both optical and electronic functions can be provided by devices located within the integrated optical/electronic circuit 103 fabricated on a single chip, such as the SOI wafer 152. As such, planar lithography and/or projection lithography techniques can fabricate optical components (e.g., passive optical waveguide devices 150, active optical waveguide devices 800, passive prisms, and lenses) on a single substrate 102 simultaneously with electronic devices 5101 (e.g., transistors, diodes, conductors, contacts, etc.). Such planar lithography and projection lithography uses deposition and etching of silicon, polysilicon, gate oxide, metal, and other known semiconductor processing materials. The electronic device 5101 can be used to control the function of the electrical devices, or the function of the active optical waveguide devices 150 that can transfer optical signals on or from the SOI wafer 152.

Each silicon layer, polysilicon layer, metal layer, etc. of the on-chip electronic device 5101 can be formed simultaneously with the one or more layers of the evanescent coupling region (or the gap portion) 5106, the passive optical waveguide device 800, the active optical waveguide device 150, and/or the light coupling portion 5110 of the light coupler 112. Planar lithography or projection lithography techniques may be used to fabricate pairs of horizontally separated layers on the on-chip electronic device 5101 simultaneously with any portion of the optical elements 5106, 5108, 5110 at substantially the same vertical level. Therefore, two or more layers of the evanescent coupling region 5106 and/or the light coupling portion 5110 that are at generally the same vertical height as the layers on the electronic device 5101, the active optical waveguide device 150, and/or the passive optical waveguide device 800 can be fabricated simultaneously. Different portions will undergo different doping, masking, ion implantation, or other processes to provide the desired optical and/or electronic characteristics. As such, technology, know how, processing time, and equipment that has been developed relative to the fabrication of electronic devices 5101 can be used to construct passive optical waveguide devices 800 and active optical waveguide devices 150 simultaneously on the same substrate 102.

Different embodiments and configurations of the evanescent coupling region 5106 include a raised evanescent coupling region, a lowered evanescent coupling region, a lack of an evanescent coupling region, or an angled or tapered evanescent coupling region. In one embodiment the evanescent coupling region 5106 is formed with a tapered gap portion as shown in FIGS. 47 and 49, and as such is provided the same reference number. Different embodiments of the evanescent coupling region 5106 include air, an optically clean polymer (that can be configured to act as an adhesive to secure the light coupler 112), or glass. Certain embodiments of evanescent coupling region 5106 have a thickness in the order of $0.1\mu$ to $0.5\ \mu$. The evanescent coupling region 5106 is deposited to its desired thickness simultaneously to the electronic device 5101 fabricated on the SOI wafer 152.

Figure 50:
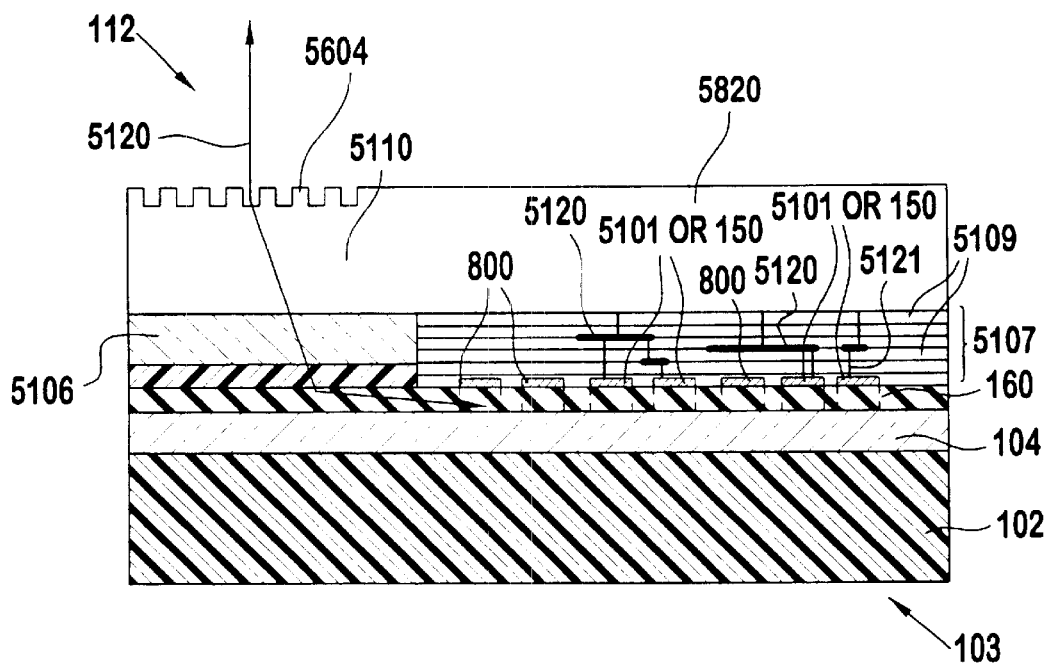
FIG. 50 shows a cross-sectional view of yet another alternate embodiment of the integrated optical/electronic circuit.

In one embodiment, the tapering of the evanescent coupling region 5106 is configured to support one edge of the light coupling portion 5110 at a height that is typically only a few microns above the other edge of the light coupling portion. Certain embodiments of the evanescent coupling region 5106 include an optically transparent material that can secure the light coupling portion 5110 to the silicon layer 160. In certain embodiments of the evanescent coupling region 5106, there is no actual gap portion. Certain embodiments of the evanescent coupling region 5106 act to support the light coupling portion 5110. Other embodiments of the gap portion forming the evanescent coupling region 5106, as shown in FIGS. 47 and 49, have a distinct ledge 5502 formed during fabrication. The ledge 5502 supports the light coupling portion 5110 in a position to suitably direct the light beam at a desired mode angle to enter the silicon layer 160. In certain embodiments, the height of one edge of the ledge 5502 above another edge is in the range of under fifty microns, and may actually be in the range of one or a couple of microns. In one embodiment, the evanescent coupling region 5106 has optically clear polymer or glass material to provide the desired optical characteristics to the light entering into, or exiting from, the silicon layer 160. Different embodiments of the light coupling portion 5110 include a prism coupling as shown in FIGS. 45 and 46, or a grating portion as shown in FIGS. 48 to 50. Certain embodiments of the light coupling portion 5110 are formed either with silicon or polysilicon.

FIGS. 43 to 54 illustrate an exemplary variety of embodiments of the light coupler 112. In the embodiments of light coupler 112 shown in FIGS. 43 to 54, the light coupling portion 5110 is formed as a separate portion from the element that forms the gap portion or evanescent coupling region 5106. Additional material may be built-up to allow for some or all of the built-up material to act as sacrificial material that may be partially removed to form, for example, portions of the light coupling portion 5110. In a light coupler 112 embodiment as described relative to FIGS. 50, 55C, and 55D, at least some of the components that form the light coupling portion 5110 are formed simultaneously with the elements that form the combined gap portion or evanescent coupling region 5106.

In this disclosure, the term "sacrificial material" generally relates to material that is applied during the processing of the integrated optical/electronic circuit 103, but is not intended to remain in the final integrated optical/electronic circuit 103. The sacrificial material, and certain portions of the integrated optical/electronic circuit, can be formed from materials well known in the CMOS, VLSI, and SOI technologies using such materials as polysilicon, polyamide, metal, gate oxides, or glass. Certain portions of the integrated optical/electronic circuit may be planarized using such polishing and etching techniques as Chemical Mechanical Polishing (CMP). Doped polysilicon can form the gate electrode 120 in the embodiments of active optical waveguide devices 150 shown in FIGS. 4, 6C, 7A to 7C, and 8 to 15. Additionally, doped, substantially undoped, or completely undoped polysilicon can form the polysilicon layer 191 in the embodiments of passive optical waveguide device 800 shown in FIGS. 16 to 29. The term "substantially undoped" is inclusive of the term "completely undoped". The term "completely undoped" refers to a doping level of zero percent. The term "substantially undoped" refers to any doping level that is insufficient when applied as a gate electrode 120 in an active optical waveguide device 150 as shown in FIGS. 4, 6C, 7A to 7C, and 8 to 15 (or an active electronic device 5101) to transition the active optical waveguide device 150 or the active electronic device 5101 between their respective functional states based on an application of an electric current to the gate electrode 120. The term functional states refers, e.g., to providing or not providing normal transistor action for such active electronic devices 5101 as electronic transistors; or providing or not providing varied optical actions (phase modulation, diffraction, focusing, etc.) for active optical waveguide devices 800.

In the embodiment of light couplers 112 shown in FIG. 43, the gap portion formed in the evanescent coupling region 5106 has a substantially constant thickness. The light coupling portion 5110 mounts to the evanescent coupling region (or the gap portion) 5106. The gap portion, also numbered 5106, has a constant thickness, and a base that is substantially aligned with the silicon layer 160. The thickness of the evanescent coupling region 5106 is selected to position the base of the light coupling portion 5110 relative to the on-chip electronic device 5101 such as, e.g., at the same level.

The light rays 5420 in each of the embodiments of light couplers 112 shown in FIGS. 43 to 54 follow considerably different paths through the different elements to or from the silicon layer 160. The illustrated paths of the light rays 5420 in each of these embodiments of light coupler 112 are intended to be illustrative of possible light paths determined as described relative to the integrated optical/electronic circuit of FIG. 43, and are not limiting in scope.

The embodiment of light coupler 112 shown in FIG. 46 is similar to the embodiment shown in FIG. 45, except that the evanescent coupling region (gap portion) 5106 can be formed considerably thinner, etched away, or even entirely removed. In certain embodiments of light coupler 112, the light coupler 112 mounts directly using an optically clear adhesive to the silicon layer 160. Light passing through any embodiment of light coupler 112 shown in FIGS. 43 to 54 must satisfy the basic optical principles described relative to FIG. 43 (e.g., equation 6).

The embodiment of light coupler 112 shown in FIG. 49 includes a grating 5604 formed on an upper surface of the evanescent coupling region 5106 that may include a tapered or constant thickness gap portion provided by the evanescent coupling region 5106. The grating 5604 may be, e.g., a surface grating formed using known etching techniques. The grating can be replaced in general by a diffraction optical element (DOE—not shown) changing both the direction and the spatial extent (e.g., for focusing) of the light. The DOE matches the expected spatial profile at the base of the light coupling region 5110. The embodiment of light coupler 112 shown in FIG. 49 includes the ledge 5502 that forms a base for one edge of the light coupling portion 5110. The light coupling portion 5110, in this embodiment, includes a wafer 5702 having a grating 5604 formed on an upper surface of the wafer. The ledge 5502 is the desired thickness for providing the desired angle of the light coupling portion, such as in the range of under ten microns in certain embodiments.

The embodiment of integrated optical/electronic circuit 103 shown in FIG. 50 further includes a wafer 5820 layered above the electronic device 5101 and the evanescent coupling region 5106. The wafer 5820 may be fabricated as a distinct component that is later combined with the portion of the integrated optical/electronic circuit 103 including the evanescent coupling region 5106 and the electronic device 5101. Alternatively, the wafer 5820 is deposited as an additional layer on top of the portion of the integrated optical/electronic circuit 103 including the evanescent coupling region 5106 and the electronic device 5101. The wafer 5820 is formed with semiconductor materials such as silicon or silica.

The region of the wafer 5820 that is located physically adjacent and above the evanescent coupling region 5106 acts as the light coupler 112. Light that is applied to the grating will be diffracted within the light coupling portion 5110 to the incidence angle since the grating 5604 is formed on the upper surface of the light coupling portion 5110. The light beam then continues to the gap portion 5106. Light applied to the grating 5604 is diffracted at a controllable angle so the coupling efficiency of the light input into the light coupler 112 is improved considerably. This improvement results from the configurations of the light coupling portion 5110, the evanescent coupling region 5106, and the silicon layer 160.

The embodiments of light coupling portion 5110 of the light couplers 112 shown in FIGS. 43 to 54 may be applied as a distinct component positioned relative to the remainder of the integrated optical/electronic circuit 103. Alignment is necessary between the light coupling portion 5110 relative to the remainder of the integrated optical/electronic circuit 103 where discrete light coupling portions 5110 are used, except in the most simple integrated optical/electronic circuits 103. In some embodiments, the light coupling portion 5110 is fabricated simultaneously with the remainder of the integrated optical/electronic circuit 103 in which all of the materials forming the light coupler 112 are deposited using known processes as physical vapor deposition (PVD) or chemical vapor deposition (CVD). The different processes may deposit different layers of the integrated optical/electronic circuit. Processes such as CMP may be used planarize the wafer 5820. Various photoresists are used in combination with etchants to etch patterns.

The application of deposition and etching processes is well known to circuits such as SOI circuits including, e.g., the electronic device 5101 as shown in FIG. 43. The deposition and layering of the material of the light coupler 112 may use similar techniques, in which the optical characteristics of the silicon layer 160 and the coupling region are fabricated simultaneously with their neighboring opto-electronic components. As a part of a sequence to build the opto-electronic circuit, the location of openings in masks used during photolithographic techniques define the location of the etching and deposition process.

Alignment of any light coupler 112 relative to the remainder of the integrated optical/electronic circuit 103 is important to achieve desired coupling efficiencies. A lateral displacement of the light coupler 112 relative to the remainder of the integrated optical/electronic circuit 103 by a distance as small as one micron may significantly reduce the percentage of light that can be coupled via the light coupler 112 to (or from) the optical waveguide 161. Light beams applied to the light coupler 112 can be modeled as a Gaussian-intensity curve in cross section. For example, the center of the light beams have a stronger intensity than the periphery of the light beams, and this intensity variation across the width of the light beam approaches a Gaussian function.

The optical beam characteristics required for best coupling efficiency depend on the nature of the gap portion formed in the evanescent coupling region 5106. Furthermore, the tolerance on the required beam position, beam diameter, and its intensity distribution also depend on the dimensions and material of the tapered (or non-tapered) gap or evanescent coupling region 5106. Evanescent coupling regions 5106 having tapered gaps generally have superior coupling efficiency and are more tolerant to variations in beam position, diameter, etc. when compared to those having constant gaps. Tapered gaps in evanescent coupling regions 5106 are also more suitable to Gaussian beams since the expected optimum beam profile for optimum efficiency is close to Gaussian.

As light follows the optical waveguide 161, the optical waveguide is carrying substantially uniform intensity of light across the cross-sectional area of the optical waveguide 161. Light exiting the silicon layer 160 via the evanescent coupling region 5106 having a uniform thickness gap is substantially uniform as the light exits the light coupler 112. It is desired to convert the light beam exiting the output coupler into a substantially Gaussian intensity profile to more accurately model the light entering the light coupler 112 into the silicon layer 160. Evanescent coupling regions 5106 configured as a tapered gap portion as illustrated particularly in FIGS. 47 and 49, result in a closer fit to a Gaussian profile than evanescent coupling regions 5106 without the taper gap portion.

While it is easy enough to align one or a few light couplers 112 relative to their respective integrated optical/electronic circuit 103, it is to be understood that in dealing with extremely large and complex optical and/or electronic circuits 103, the alignment is a non-trivial task. Even if it takes a matter of a few seconds to align any given light coupler 112, considering the large number of light couplers 112 on any given circuit, manually aligning accurately the needed number of light couplers to any one integrated optical/electronic circuit 103 may translate into many hours of work. As such, to practically align a large number of light couplers 112 relative to a relatively complex integrated optical/electronic circuit 103, very large scale integrated circuits (VLSI) or ultra-large scale integrated circuits (ULSI), which are proven and efficient processing techniques in electronic chip circuit production, are preferred.

Figure 53:
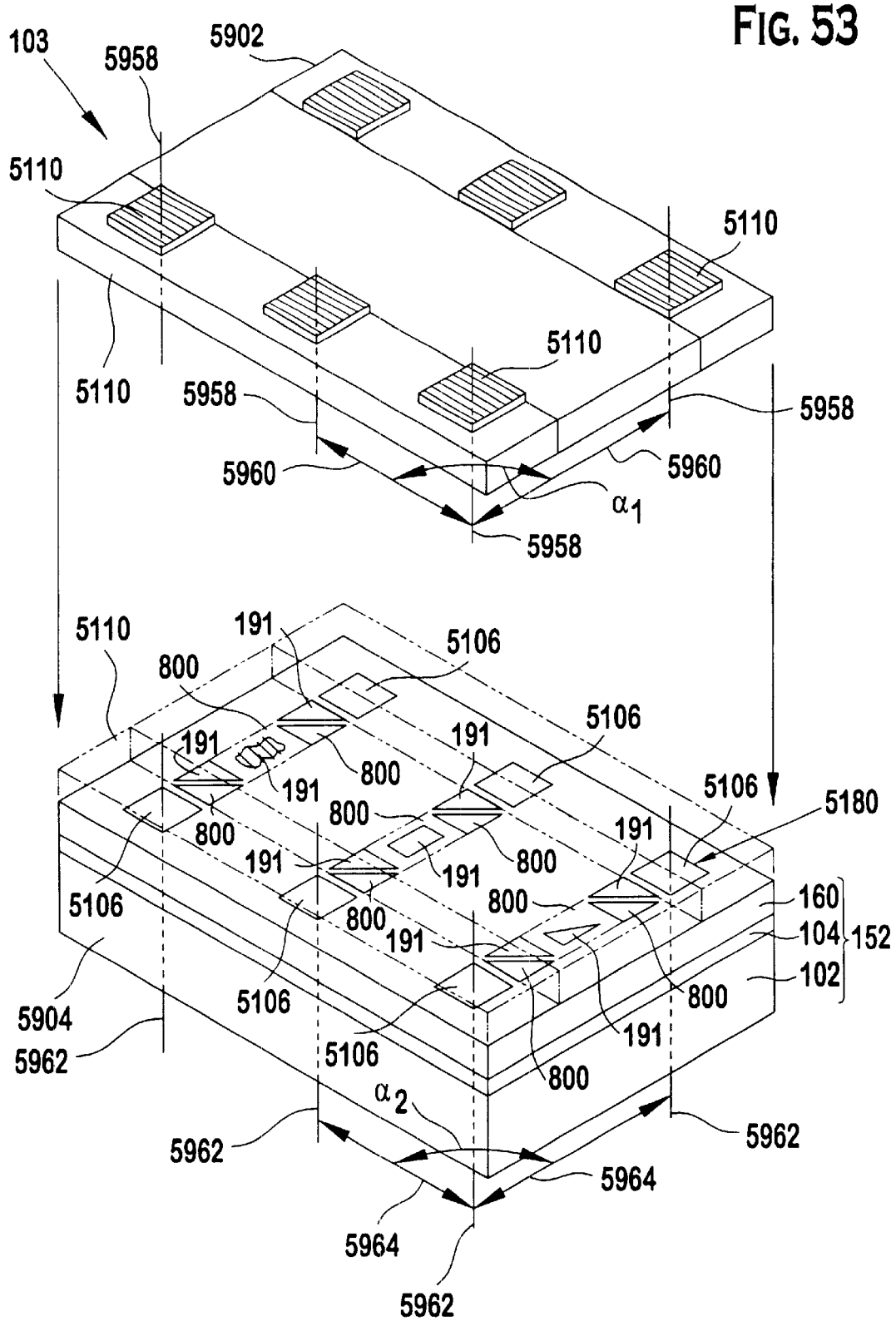
FIG. 53 shows a partially exploded perspective view of one embodiment of an integrated optical circuit using flip chips.

FIGS. 53 and 54 show expanded views of two embodiments of integrated optical/electronic circuits 103 that each include silicon insulator (SOI) flip chip portion 5904 and an optical/electronic I/O flip chip portion 5902. The integrated optical/electronic circuit may include a plurality of active optical waveguide devices 150, passive optical waveguide devices 800, and electronic devices 5101. The SOI flip chip portion 5904 is formed, preferably using flip chip technology, in which the silicon layer 160 is preferably thin (e.g., thin SOI). Any substrate 102, using either SOI technology or traditional substrates, is within the scope of the present invention. Both of the embodiments of optical electronic I/O flip chip portions 5902 as shown in FIGS. 53 and 54 include the electronic device 5101, as described relative to FIG. 43. Additionally, each embodiment of optical/electronic I/O flip chip portions 5902 includes a light coupling portion 5110 and an evanescent coupling region 5106 that may be configured as a tapered gap portion or a constant thickness gap portion. In the embodiment of optical/electronic I/O flip chip portion 5902 shown in FIG. 53, however, the light coupling portion 5110 is configured as a grating 5604.

In the embodiment of optical/electronic I/O flip chip portion 5902 shown in FIG. 54, the light coupling portion 5110 includes a prism. The gratings shown in the integrated optical/electronic circuit of FIG. 53 are formed using known etching techniques, in which gratings or DOE are formed by etching away thin strips of material. The prisms formed in the optical/electronic I/O flip chip portion 5902 in FIG. 54 may be formed using anisotrophic etching. Anisotrophic etching is a known technology by which crystalline materials etch at different rate based on the crystalline orientation of the crystalline material. The alignment of the crystalline material determines the etch rate. For instance, in an anisotrophic material, the silicon etches at a different rate along the 001 crystalline plane compared to the 010 atomic plane. Configurations such as V-groves and/or angled surfaces can be formed in different regions within the optical/electronic I/O flip chip portion 5902 using anisotrophic etching.

Both the SOI flip chip portion 5904 and the optical/electronic I/O flip chip portion 5902 may be formed in either orientation shown in FIGS. 53 and 54. Alternately, the optical/electronic I/O flip chip portion 5902 can have a different orientation such as inverted from that shown in FIGS. 53 and 54. Regions within the embodiments of optical/electronic I/O flip chip portions can be etched away to form the respective etchings or prisms, may be controllably formed using masking technology. Mask openings dictate where photoresist is applied on the flip chip portion. Both the portions of the active optical waveguide device 150 and a portion of the passive optical waveguide device 800 that are formed on the SOI flip chip portion 5904 can be fabricated simultaneously using photolithographic techniques. More particularly, polysilicon forms the gate electrode 120 in the embodiments of active optical waveguide device 150 shown in FIGS. 4, 6C, 7A to 7C, and 8 to 15. Additionally, polysilicon (e.g., undoped polysilicon) forms the polysilicon layer 191 in the embodiments of passive optical waveguide device 800 as shown in FIGS. 16 to 29. Therefore, the substrate 102, the optical insulator 104, and the silicon layer 160 are fabricated using known VLSI and CMOS techniques. The gate oxide layer 110 (not shown in FIG. 53 or 54) is deposited on an upper surface of the SOI flip chip portion 5904. The configuration of the respective polysilicon layers 191 and the gate electrodes 120 provides the desired optical functionality. Simultaneous deposition of the polysilicon layer 191 and the gate electrode 120 results in one embodiment of integrated optical/electronic circuit 103. Following the deposition, the integrated optical/electronic circuit 103 can be structurally similar to that shown in the FIG. 4 embodiment of active optical waveguide devices 150 and/or the FIG. 3 embodiment of passive optical waveguide devices 800.

Proper spacing of the devices provides alignment of the various components of the integrated optical/electronic circuits 103. To provide one embodiment of spacing, each one of the plurality of light coupling portions 5110 in the optical/electronic I/O flip chip portion 5902 is aligned with the evanescent coupling region 5106 in the SOI flip chip portion 5904. Spacing of the devices, as provided by the coordinated lithography masking technique between the optical/electronic I/O flip chip portion 5902 and the SOI flip chip portion 5904, is a significant advantage of integrated optical/electronic circuits 103. There is no need to align discrete active optical waveguide devices 150 and passive optical waveguide devices 800 to both their associated electronic device 5101 and their portions in the integrated optical/electronic circuits 103.

In the embodiments of integrated optical/electronic circuits 103 shown in FIGS. 53 and 54, a plurality of light coupling portions 5110 are arranged in a pattern within the optical/electronic I/O flip chip portions 5902. A vertical axis 5958 passes through each light coupling portion 5110. The patterning of the light coupling portions 5110, within the optical/electronic I/O flip chip portions 5902, is partially defined by the horizontal distance (indicated by arrow 5960) between each pair of the plurality of vertical axes 5958 on the optical/electronic I/O flip chip portion 5902. The pattern of the light coupling portions 5110 within the optical/electronic I/O flip chip portions 5902 is also partially defined by the angle $\alpha_1$ between all of the arrows 5960 that extend from any given vertical axis 5958 and all other vertical axes 5958 located on the optical/electronic I/O flip chip portion 5902.

The FIGS. 53 and 54 embodiments of integrated optical/electronic circuits 103 have a patterning of the evanescent coupling regions 5106 on the SOI flip chip portion 5904. To achieve such patterning on the SOI flip chip portion 5904, consider that a distinct vertical axis 5962 may be considered as passing through each one of the evanescent coupling regions 5106. The patterning of the evanescent coupling regions 5106 within the SOI flip chip portion 5904 is partially defined by the horizontal distance (indicated by arrow 5964) between each pair of the plurality of vertical axes 5962 in the SOI flip chip portion 5904. The patterning of the evanescent coupling regions 5106 within the SOI flip chip portion 5904 is also partially defined by the angle $\alpha_2$ between all of the arrows 5964 that extend from any given vertical axis 5962 and all other vertical axes 5962 located on the SOI flip chip portion 5904.

The patterning (of light coupling portions 5110) on the SOI flip chip portion 5904 matches the patterning (of evanescent coupling regions 5106) on the optical/electronic I/O flip chip portions 5902. This matching of patterning allows for alignment in the optical/electronic I/O flip chip portion 5902. If the patterning of the I/O flip chip portion 5902 matches the patterning of the optical/electronic I/O flip chip portions 5902, then alignment is achieved by aligning any two light coupling portions 5110 with any two respective evanescent coupling regions 5106. Using this type of alignment provided by coordinated planar lithography, all light coupling portions 5110 on the SOI flip chip portion 5904 will be aligned with all evanescent coupling regions 5106 on the optical/electronic I/O flip chip portions 5902.

The desired configuration and operation of the integrated optical/electronic circuit 103 depends partially on a variety of interconnects and vias patterned on, or through, the silicon layers of the electronic device 5101. The uppermost layer of the electronic device 5101 is in electrical communication with solder balls 5930. The solder balls 5930 are used, when inverted, to solder the integrated optical/electronic circuit 103 to, e.g., a motherboard or some other printed circuit board to which the integrated optical/electronic circuit 103 is being operationally secured. The solder balls 5930 also provide the electrical connection between the electrical circuits on the printed circuit board and the electrical circuits in the electronic device 5101 of the integrated optical/electric circuit 103.

Active optical waveguide devices 150 as described relative to FIGS. 4, 6C, 7A to 7C, and 8 to 15; passive optical waveguide devices 800 such as shown in FIGS. 16 to 29; and electronic devices 5101 may be combined as a hybrid active integrated optical/electronic circuit. In one embodiment, the etching and deposition processing described herein is simultaneously performed for the passive optical waveguide devices 800, the active optical waveguide devices 150, and the electronic devices 5101. To provide a circuit layout for the integrated optical/electronic circuit 103, a radius can initially be drawn around the active optical waveguide devices 150, the passive optical waveguide devices 800, and the light coupling portion 5110 to indicate where the electronic devices 5101 are not to be located. The electronic devices 5101 can be located everywhere else on the optical/electronic flip chip portion 5902 that does not conflict with the light coupling portion 5110.

Figure 51:
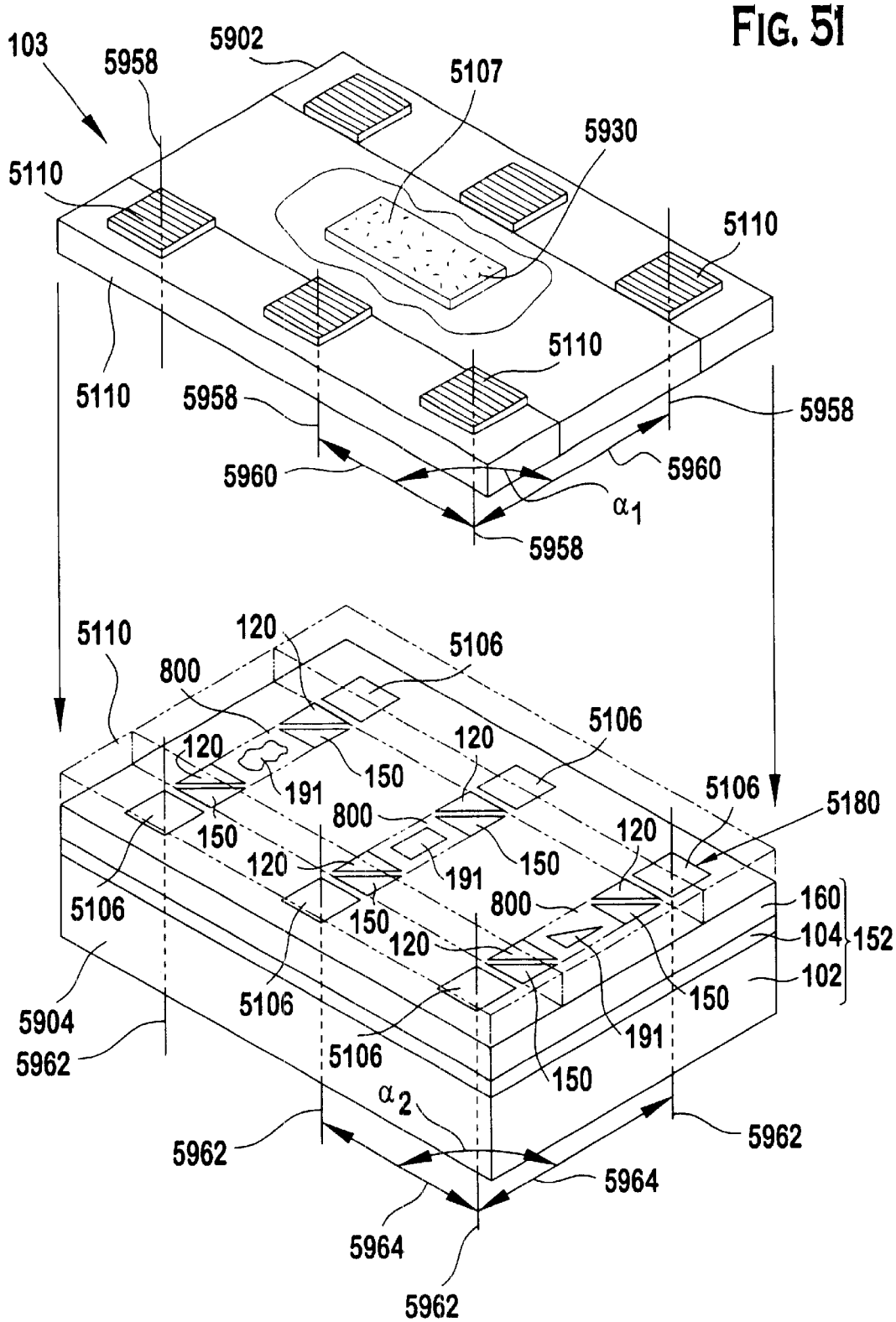
FIG. 51 shows a partially exploded perspective view of an embodiment of the integrated optical/electronic circuit using flip chips.
Figure 52:
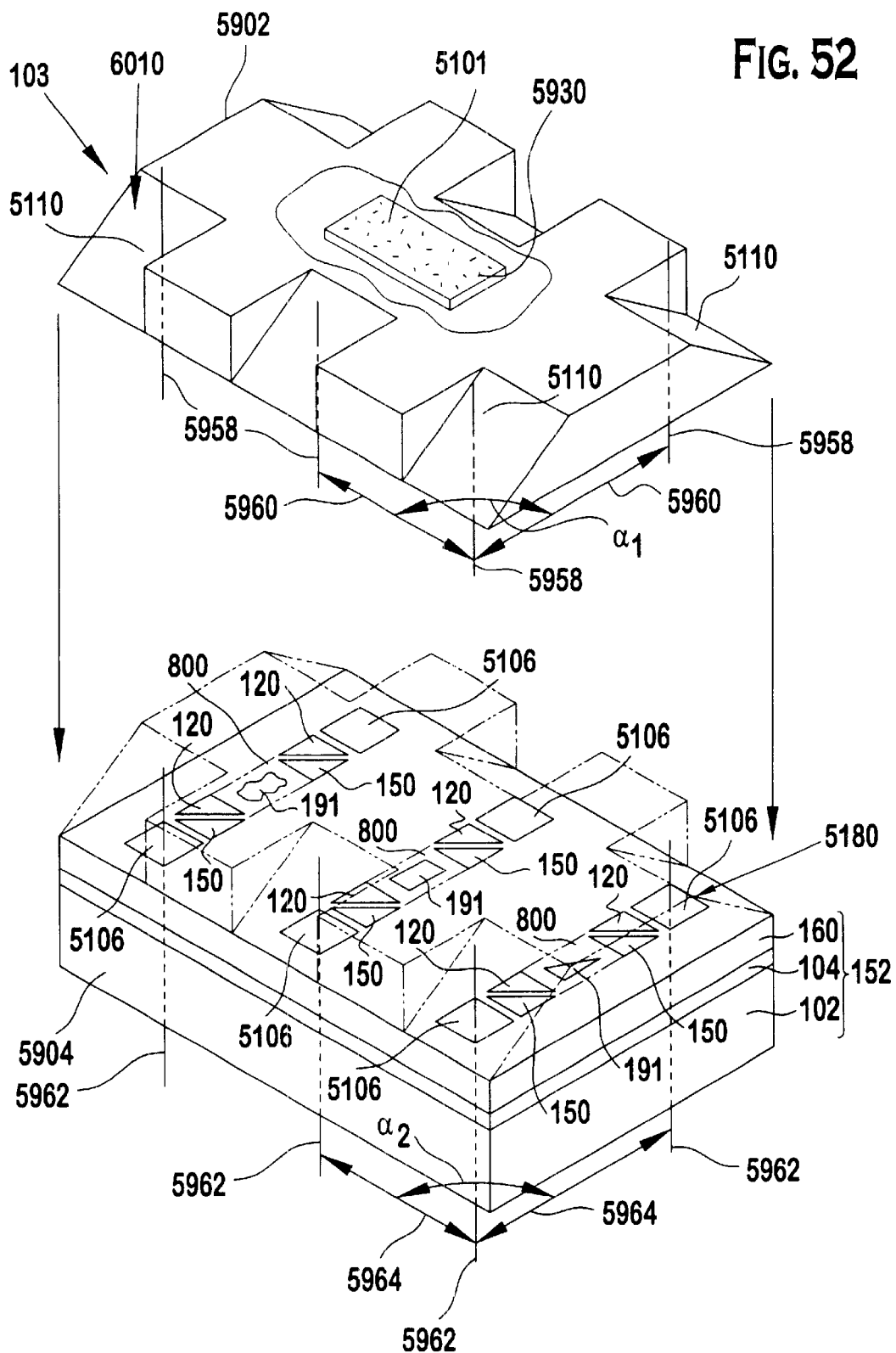
FIG. 52 shows a partially exploded perspective view of an alternate embodiment of the integrated optical/electronic circuit using flip chips.

FIGS. 53 and 54, respectively, illustrate two embodiments of integrated optical circuit 103 using flip-chip technology that is similar to the embodiment of integrated optical/electronic circuit 103 illustrated respectively in FIGS. 51 and 52, except that the electronic device 5101 is not included in the FIGS. 53 and 54 embodiments. In this disclosure, the terms "integrated optical/electronic device" and "integrated optical device" are each provided with the reference character 103 due to their similarities. The embodiments of integrated optical circuit 103 shown in FIGS. 53 and 54 include a similar silicon insulator (SOI) flip chip portion 5904 and an optical/electronic I/O flip chip portion 5902 as described herein relative to FIGS. 51 and 52. The integrated optical circuit 103 shown in FIGS. 53 and 54 has no active optical waveguide devices or electronic devices inserted therein (while the active optical waveguide devices and electronic devices do exist in the embodiments of integrated optical circuit 103 shown in FIGS. 51 and 52).

The lack of application, removal, or deactuation of the electronic device 5101 in the integrated optical circuit 103a also limits the application of electric current to the active optical waveguide devices 150. This lack of application of the electric current to the gate electrode 120 of the existing active optical waveguide devices 150 in FIGS. 51 and 52 may cause many embodiments of the active optical waveguide devices 150 to optically function as a passive optical waveguide device 800, in which the effective mode index in the region of static effective mode index remains at a constant level over time. The polysilicon that forms the gate electrodes 120 in the active optical waveguide devices 150 shown in FIGS. 51 and 52 would instead form the polysilicon layer 191 of the passive optical waveguide devices 800 shown in FIGS. 53 and 54. Although gate electrodes 120 in active optical waveguide devices 150 and electronic devices 5101 are typically doped, the polysilicon layer 191 in a passive optical waveguide device 800 is typically undoped to limit attractiveness to light, although many embodiments can also be doped with certain dopants and still perform the optical functionality as described herein.

In one embodiment, a unitary mask is used to define the polysilicon layer 191, a unitary mask is used to define the gate oxide layer 110, a unitary mask is used to define the doping, and a unitary mask is used to define the metalization cone mask for all of the active optical waveguide devices 150, the passive optical waveguide devices 800, and the electronic devices 5101. Without close examination, it is not evident whether a feature in a mask provides an electronic function in an electronic device or an optical function in an active optical waveguide device within that integrated optical/electric circuit. There may be no clear-cut delineation between a mask for forming the active optical waveguide devices 150, the passive optical waveguide device 800, and the electronic devices 5101 on the substrate 102.

An electric supply portion 5107 is used to supply electrical currents and/or voltages to the gate electrodes 120 of the active optical waveguide devices 150 and electronic devices 5101. The electric supply portion 5107 includes a plurality of interlayer dielectrics 5109 on which a series of metallic interconnects 510 are deposited, and through which a series of vias 5121 vertically extend. The interlayer dielectrics 5109 are typically formed from an oxide, such as silicon dioxide (glass), that provide for an electrical insulation between adjacent metallic interconnects 5120 and vias 5121. The electric supply portion has to be fabricated with the design of the passive optical waveguide devices 800, the active electronic waveguide devices 150, and the electronic devices 5101 in mind.

In planar lithography, to fabricate the desired ones of the electric supply portion 5107, the passive optical waveguide device 800, the active optical waveguide device 150, the electronic device 5101, and the other devices on the SOI wafer 152, a lens projects the shape of a mask onto the photoresist to define the shapes formed on the substrate 102 during each processing step. The depth of focus (DOF) is an important consideration in projecting the features of the mask. All the features in a mask have to lie within the depth of focus of the lens used in the lithography process or they do not print well during the lithographic process since the feature will be out of focus. Chemical Mechanical Polishing (CMP) has become an important process in association with planar lithography because the topography of the upper surface of the substrate 102 has minute waves following etching or deposition of silicon. In depositing metallic interconnects 5120 on the electric supply portion 5107, for example, a second level of metal (to define one of the metallic interconnects 5120 or the vias 5121) cannot be imaged on such a wavy surface of the interlayer dielectrics 5109 (see FIG. 42) and thus cannot be deposited. CMP can planarize the surface waves formed in polysilicon, silicon, other semiconductor materials, metals, and oxides. Since electronic-based microprocessors have six to seven layers of metal associated with an electric supply portion, the time necessary to process such a device is considerable.

One embodiment of the integrated optical/electronic circuit 103 on thin SOI uses planar lithography manufacturing techniques. The electronic devices 5101 are integrated in the optical waveguides 161 in the silicon level of the integrated optical/electronic circuit. The metallic interconnects 5120 are deposited in alternating layers with the interlayer dielectrics 5109 to form the electric supply portion 5107 (using such technologies as CVD, PVD, and electrochemical deposition) interspersed with material such as glass or polyamide to fill in the surface irregularities. The interspersed material forming the interlayer dielectric 5109 is leveled before depositing the next metal layer forming the metallic interconnects 5120. This process is repeated for each layer. With planar lithography, each imaging photoresist exposure requires a very flat wafer consistent with minimum feature size and DOF requirements.

Projection lithography projects an image on photoresist that determines the pattern on a wafer such as a SOI wafer. In a typical lithography, the best results occur when the aspect ratio (horizontal to vertical feature dimensions) is close to 1 to 1. The uneven, etched portions of a layer is filled with glass/polyamide, then planarized before the next photoresist/exposure step. The wafer is absolutely plate-like with a very uniform layer of the photoresist which, when exposed to light, etches certain selective regions during planar lithography. The mask is used to develop a pattern on the wafer once a substantially uniform photoresist layer is deposited. The projection lithography process is repeated for multiple photolithography cycles to deposit and/or etch silicon, metalization, silicon, or polysilicon to form the desired electronic device 5101 and optical portion (including the active optical waveguide devices 150 and the passive optical waveguide devices 800).

Equation 7 provides the general rule of the thumb that the minimum feature size (MFS) is:

$$MFS = (0.6 \text{ times } \lambda)/NA \qquad \text{(equation 7)}$$

The 0.6 constant generally replaces the semiconductor constant k1 that depends on the quality of the lens and other such factors. The 0.6 constant is an approximation for a very strong lens, and is not exact. NA is the numerical aperture of the lens, which is a function of the speed of the lens. A popular wavelength for such a lens is 248 nm. The minimum feature size is the smallest size that traditional lithography can print. Once the minimum feature size for a given NA is determined, the depth of focus can be determined as $DOF = \lambda/(NA)^2$. The minimum feature size and the depth of focus are therefore fundamentally related.

Accepted curves indicate the relationship between the depth of focus and the minimum feature size. Optical scientists have attempted many techniques to overcome this relationship. As a result, when a chip is brought into focus for planar lithography, the entire image is in focus on the chip.

Building the integrated optical/electrical circuit 103 necessitates multiple steps of exposure on a photoresist layer 6304 (FIG. 55B) layered on the uppermost layer of the substrate 102. To expose the photoresist layer 6304, the photoresist initially is evenly applied. Spinning the whole wafer produces a substantially uniform depth of the photoresist layer using centrifugal force. If there are a variety of big structures on the silicon layer, each structure acts like a little dam that limit the radially outward flow of the photoresist. Even a rise in topography by 50 nm in the photoresist layer 6304 causes photoresist build-up problems in the lithography process.

FIGS. 55A to 55G show a process for simultaneously depositing a suitable silica, dielectric, silicon, polysilicon, metal, etc. on any one of the light coupling portion 5110, the passive optical waveguide device 800, the active optical waveguide device 150, and the electronic device 5101. This process of simultaneous deposition of polysilicon, silicon, silica, dielectric, etc. using planar lithography techniques follows a similar process of base material deposition, applying a photoresist on the deposited base material, hardening portions of the photoresist, and then etching the portions of the deposited base material that is under the non-hardened portion of the photoresist. Such planar lithography techniques follow the basic techniques of CMOS processing.

Figure 55A:
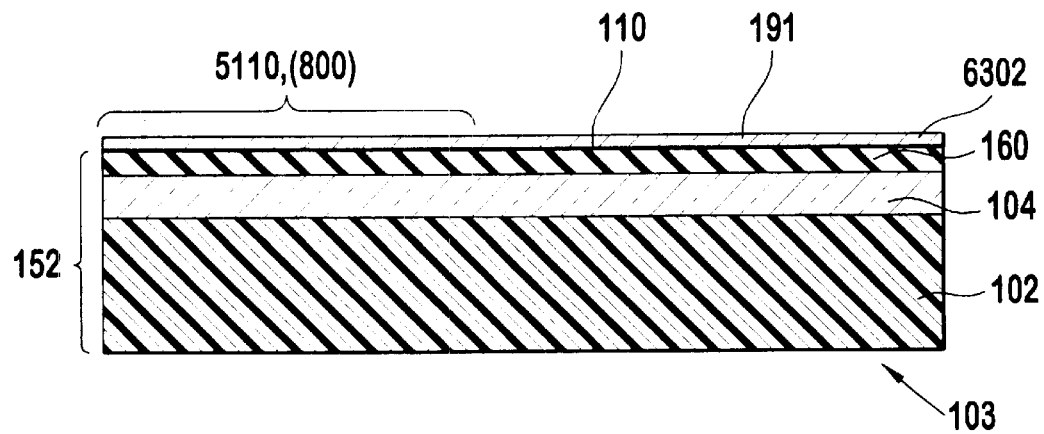

As shown in FIG. 55A, initially a deposited material 6302 (in this case, polysilicon to form the polysilicon layer 191) is deposited somewhat uniformly across the entire SOI substrate 152. Although not illustrated in FIG. 55A, if the deposited material 6302 being deposited is the polysilicon layer 191, then the gate oxide layer is initially deposited on the silicon layer 160, and then the polysilicon layer 191 is deposited as the deposited material 6302 on the gate oxide layer. As such, the term "deposited material" 6302 in the disclosure relates to a variety of materials such as silicon layers, polysilicon layers, silicon layers that include such additional chemicals as germanium (Ge), such as is used to form a semiconductor compound such as SiGe, and any suitable deposited chemical. The deposited material 6302 as illustrated in FIGS. 55A to 55F is used to define, using CMOS techniques, both portions of the passive optical waveguide device 800, active optical waveguide devices 150, electronic devices 5101 and the light coupling portions 5110. The light coupling portion 5110 may include prisms or gratings that rely upon homogenous build up of silica or silicon (or etching of existing silicon in the silicon layer 160 in the SOI wafer 152). In FIG. 55A, one or more layers of silicon or polysilicon 6302 is deposited on the upper surface of the integrated optical/electrical circuit 103 using known silicon deposition techniques (such as CVD, PVD, and sputtering). Whether polysilicon, silica, oxide or silicon is deposited in a particular processing step depends on the desired layout of the SOI wafer.

The polysilicon layers 191 associated with the active optical waveguide devices 150, the passive optical waveguide devices 800, and the electronic devices 5101 also rely on the deposition of, and etching of, polysilicon or other suitable semiconductors. Since the light coupling portion 5101 is typically formed from a homogenous material, as described below, relatively little processing will occur between the various silica deposition steps.

Figure 55B:
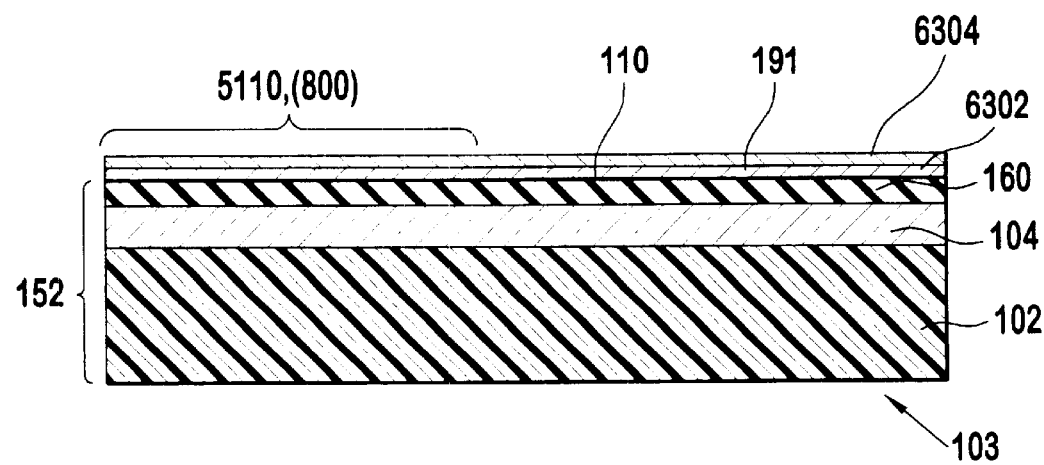
Figure 55C:
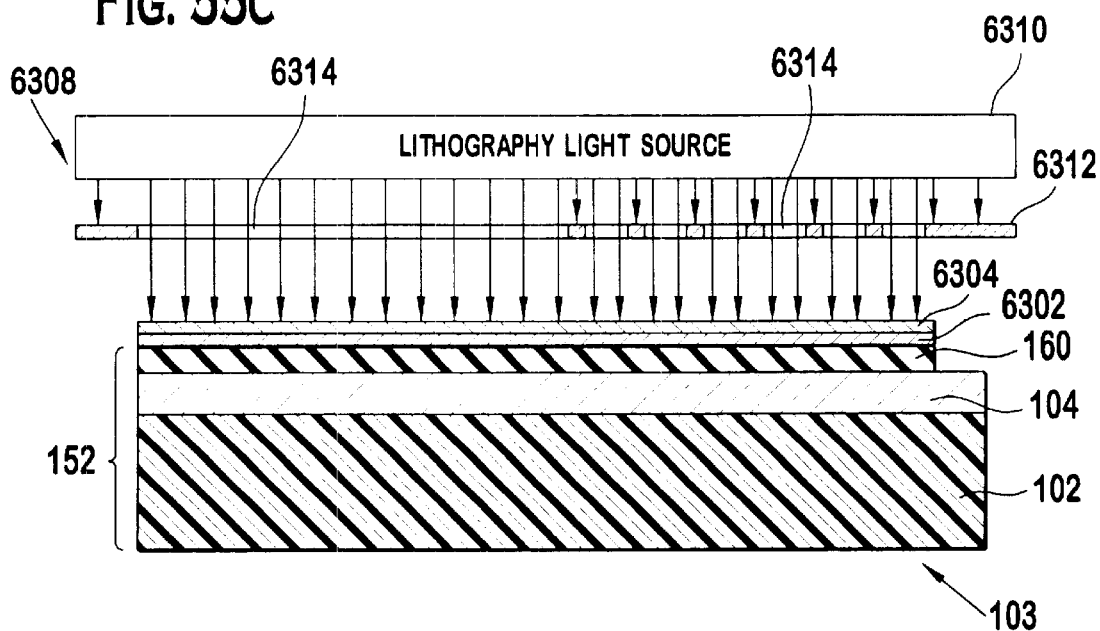

The planar lithography method continues in FIG. 55B in which a photoresist layer 6304 is deposited on the upper surface of the deposited material 6302 (e.g., that includes polysilicon or silicon). The substrate 102 is spun after the photoresist is deposited so the photoresist layer 6304 forms under the influence of centrifugal force to a substantially uniform thickness. In FIG. 55C, the lithography portion 6308 selectively applies light to the upper surface of the photoresist layer 6304, thereby acting to develop certain regions of the photoresist layer. Depending upon the type of photoresist in the photoresist layer 6304, the photoresist will harden if light is applied to it and will not harden if light is not applied to it. Alternatively the photoresist in the photoresist layer 6304 will harden if light is not applied to it and will not harden if light is applied to it. The lithography portion 6308 includes a lithography light source 6310 that directs light through openings in a lithography mask 6312 toward the photoresist layer 6304.

The embodiment of lithography mask 6312 shown in FIG. 55C includes openings 6314 that define, and are aligned with, those areas of the photoresist layer 6304 layered on the deposited material 6302 at which it is desired to apply light, and subsequently etch. The lithography light source 6310 generates the light in a downwardly, substantially parallel, direction through the lithography mask 6312 and toward the photoresist layers 6304. Those portions of the lithography mask 6312 that have an opening allow the light to extend to the photoresist layer 6304 as shown in FIG. 55C. Applying light from the lithography portion 6308 acts to develop certain portions of the photoresist layer 6304. When the deposited material 6302 deposited in step 55A is the polysilicon used to form the polysilicon layers 191 and the gate electrodes 120, the openings in the lithographic mask 6312 are configured to project light onto the photoresist layer 6304 at those locations that correspond to the locations of each one of the gate electrodes 120 (in the active optical waveguide devices 150 and the electronic devices 5101 as shown in FIG. 5) and the polysilicon layer 191 (in the passive optical waveguide devices 800 as shown in FIG. 5). The patterning of all of the gate electrodes 120 and the polysilicon layers 191, as described herein, can therefore be simultaneously fabricated in a desired pattern on the SOI wafer, based on the location of the openings in the lithographic mask 6312.

Figure 55D:
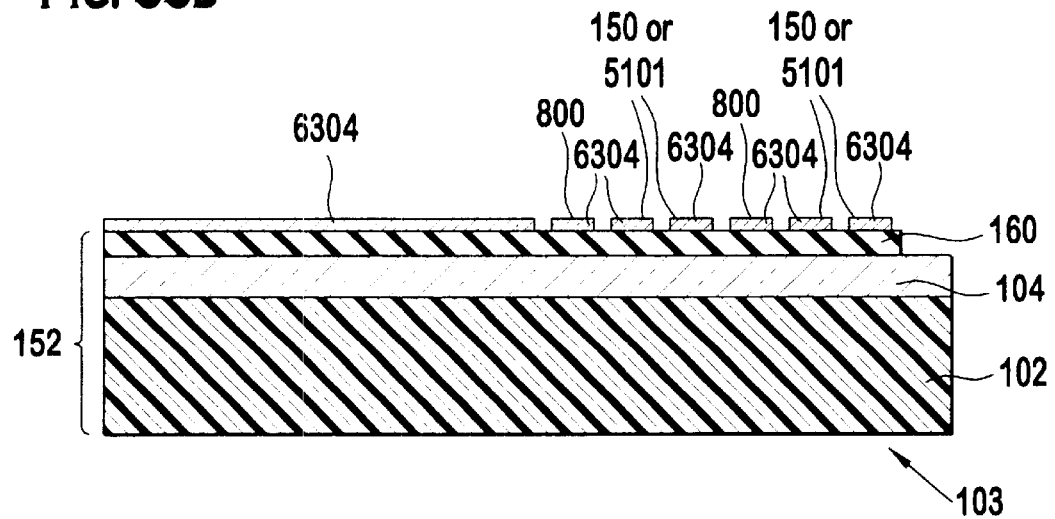

The photoresist layer 6304 is then washed from the layer of the deposited material 6302, in which the undeveloped portions of the photoresist are substantially washed away while the developed portions of the photoresist layer remain as deposited as shown in FIG. 55D. The developed (and therefore remaining) portions of the photoresist layer 6304 represents the only material that covers the deposited material 6302. The wafer 152 is thereupon etched. The developed portions of the photoresist layer 6304 thereby protect the covered portions of the deposited material 6302 from the etchant. The etchant in the etching process acts selectively on those uncovered portions of the deposited material 6302 that correspond to the undeveloped regions of the photoresist layer. In one embodiment during etching, the developed portions of the photoresist layer 6304 cover, and protect, the covered portions of the silicon or polysilicon layer 6302 from the etchant. Following the etching, respective structures 6450 and 6452 remain that are ultimately used to form portions of the respective optical portions (e.g., the light coupler 112, the active optical waveguide device 150, and the passive optical waveguide device 800) as well as the electronic device 5101.

The active optical waveguide devices 150, the passive optical waveguide devices 800, and the electronic device 5101 also rely on the deposition of, and etching of, polysilicon to form the polysilicon layer 191. When the polysilicon used in the polysilicon layer 191 and the gate electrode 120 is the deposited material, the openings in the lithography mask 6312 can simultaneously determine the patterning of the gate electrodes 120 in the active optical waveguide device 190 and the electronic device 5101, as well as the polysilicon layer 191 in the passive optical waveguide device 800.

Subsequent fabrication of the electric supply portion 5107 (as illustrated in FIGS. 55E to 55G) largely determines whether deposited polysilicon will be associated with a passive optical waveguide device 800, an active optical waveguide device 150, or an electronic device 5101. For instance, gate electrodes 120 (which are integrated in active optical waveguide devices 150 and electronic devices 5101, but not passive optical waveguide devices) must be in electrical contact with the vias 5121 illustrated in FIGS. 55F and 55G. As such, any deposited polysilicon material 6304 that is in electrical contact with a via 5121 (as shown in FIGS. 55F and 55G) will be used to form either the active optical waveguide device 150 or the electronic device 5101, but not the passive optical waveguide device 800. By comparison, any deposited polysilicon material 6304 that is not in electrical contact with a via 5121 (as shown in FIGS. 55F and 55G) may be used to form the passive optical waveguide device 800, but not the active optical waveguide device 150 or the electronic device 5101.

Structurally (including such material considerations as doping), many embodiments of the active optical waveguide device 150 are identical to the electronic device 5101. For example, the device in FIG. 5 could either be configured as the active optical waveguide device 150 that controls the transmission of light, or alternatively as the electronic device 5101 that controls the transmission of electricity. The dimensions and configurations of the gate electrode 120 may differ as a matter of design between the active optical waveguide device 150 and the electronic device 5101. Following the deposition, masking, and etching of the polysilicon deposited material 6302 as shown in FIGS. 55A to 55C, the resulting gate electrodes 120 can be doped (to become n or p type) using, for example, ion implantor source 6370 as illustrated in FIG. 55E. As such, the portions of the polysilicon that eventually are etched to form the gate 120 will not be covered by an opening formed in an ion implanting mask 6372 that allows ions to be applied to selected portions of the polysilicon. The portions of the polysilicon that eventually are etched to form the polysilicon layers 101 will not be doped, and will be covered by (i.e., will not include an opening formed in) the ion implanting mask 6372. The specific configuration of the ion implanting mask 6372 and the ion implantor source 6370 is intended to be illustrative, and not limiting in scope.

The well known process of metal deposition, doping, and selective etching is used in the semiconductor processing of electronic devices 5101 and circuits. This disclosure, however, applies integrated circuit processing techniques, involving etching and deposition, to active optical waveguide devices 150, passive optical waveguide devices 800, and electronic devices 5101. As such, all of the active optical waveguide device 150, the passive optical waveguide device 800, as well as the electronic devices 5101 can be simultaneously fabricated on the same SOI substrate 102 (or other substrate) using VLSI, CMOS, planar lithography or other semiconductor processing techniques.

As shown in FIGS. 55E and 55F, the electric supply portion 5107 is formed using a series of layers of interlayer dielectric 5109 (an oxide), interspersed with metallic interconnects 5120, through which metallic vias 5121 vertically extend. A series of metalization and other steps are necessary between successive depositions of the interlayer dielectric 5109 to form the electric supply portion 5107.

The fabrication of the SOI wafer 152 including the passive optical waveguide device 800 and the light coupler 112, 114 is now described. The passive optical waveguide device 800 may be formed primarily from polysilicon forming the layer 191. By comparison, the light couplers 112, 114 as shown in FIGS. 42 to 52 may be formed primarily from silicon. The polysilicon and silicon may both be deposited using known VLSI and CMOS deposition techniques. The specific processing steps used to deposit and/or etch the silicon likely differ from the specific processing steps to deposit and/or etch the polysilicon (which would also differ from the processing steps to deposit and/or etch metal in other embodiments). In the embodiment of photolithographic process shown in FIGS. 55A to 55F, the polysilicon 3902 that forms the polysilicon layer 191 in the SOI wafer 152 is deposited, and then etched. In FIGS. 56E to 56I, the silicon 3960 that forms the light coupler 112, 114 is deposited, and then etched, on the SOI wafer 152. Whether the polysilicon 3902 is deposited/etched prior to, or following, when the silicon 3960 is deposited/etched is a design choice. One embodiment of photolithographic process described relative to FIGS. 55A to 55F as applied to the integrated optical/electronic circuit 103 can also be applied to a pure passive optical waveguide device 800, and now described.

Figure 56G:
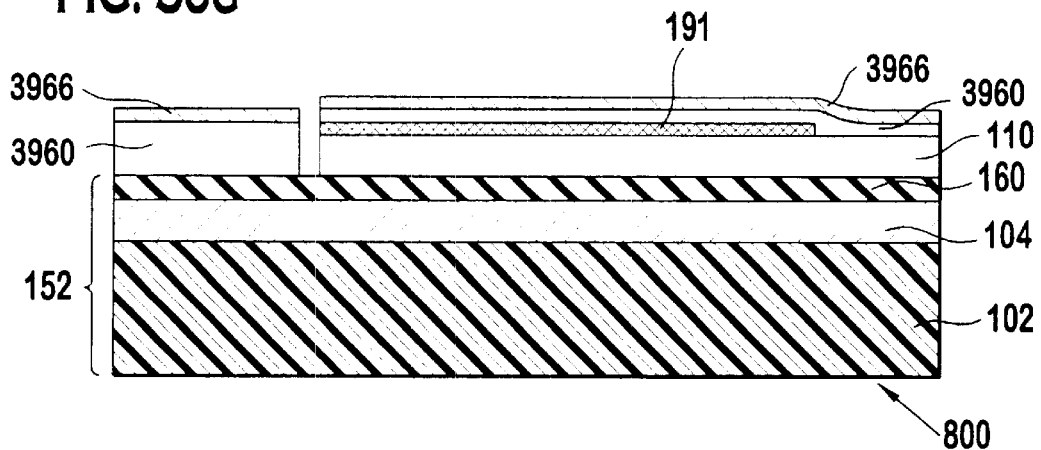

The passive optical waveguide devices 800 fabricated in the embodiment of silicon insulator (SOI) flip chip portion 5904 as shown in the FIGS. 51 to 54 can be fabricated using the deposition and etching techniques as illustrated in FIGS. 56A to 56I. In FIG. 56A, a layer of polysilicon 3902 is deposited on the upper surface of the SOI wafer 152 using known semiconductor deposition techniques (such as CVD, PVD, and sputtering). Prior to the deposition of the polysilicon, the gate oxide layer 110 is deposited on the waveguide. The gate oxide layer 110 may be formed of silicon dioxide (oxidized silicon). The silicon dioxide that is eventually fabricated into the gate oxide layer 110 is deposited across the entire exposed upper surface of the SOI wafer 152, and those portions of the gate oxide layer 110 that are to be removed are then etched using planar lithography techniques.

The planar lithography continues in FIG. 56B in which a photoresist layer 3904 is deposited on the upper surface of the layer of the polysilicon material 3902. The substrate 102 is spun after the photoresist is deposited to form the even photoresist layer under the influence of centrifugal force to a substantially uniform thickness. In FIG. 56C, the lithography portion 6308 selectively applies light to the upper surface of the photoresist 3904, thereby acting to develop (and harden) certain regions of the photoresist layer 3904. Depending upon the type of photoresist, the photoresist will harden if light is applied to it and will not harden if light is not applied to it. Alternatively the photoresist will harden if light is not applied to it and will not harden if light is applied to it. The lithography portion 6308 directs light through openings in the lithography mask 6312 toward the photoresist layer 3904.

The photoresist layer 3904 is then washed from the polysilicon layer 3902, in which the undeveloped (unhardened) portions of the photoresist are substantially washed away while the developed (hardened) portions of the photoresist layer remain as deposited as shown in FIG. 56D. The developed (and therefore remaining) portions of the photoresist layer 6304 cover portions of the SOI wafer 152. The developed portions of the photoresist layer 6304 thereby allow for selected portions of the silicon layer to be etched. The etching process is applied selectively on those uncovered portions of the layer of deposited material 3902 that correspond to the undeveloped (washed away) regions of the photoresist layer. In one embodiment during etching, the developed portions of the photoresist layer 6304 cover, and protect, the covered portions of the layer of deposited material 3902 from the etchant. Following the etching, respective structures 3950 remain, certain ones of the polysilicon layer 3950 are ultimately used either to form part of the polysilicon layer 191 included on the passive optical waveguide device 800, such as the polyloaded waveguide shown in FIG. 18, the interferometers shown in FIGS. 20 to 23, the arrayed waveguide gratings (AWG) shown in FIGS. 24 to 26, the Echelle gratings as shown in FIGS. 30 to 35, the beamsplitter shown in FIG. 27, and the lens shown in FIGS. 28 and 29. Alternatively, if the polysilicon layer is doped, the polysilicon layer 3950 shown in FIG. 56D may be used to form the gate electrode 116 or body contact electrode in the embodiments of active optical waveguide device 150 shown in FIGS. 7A to 7C, and 8–11. Finally, with proper doping, the polysilicon layer 3950 shown in FIG. 56D may be used to form the gate electrode or the body contact electrode as shown in certain embodiments of active electronic device 5101.

The light couplers 112, 114 that are deposited and etched in the SOI wafer 152 as illustrated in FIGS. 56E to 56I can be any of the embodiments of light couplers illustrated in FIGS. 7A, and 42 to 54. Alternatively, the light couplers can be fabricated separately, and affixed to the silicon layer in a desired location following fabrication. To fabricate two different components of two different materials (e.g., silicon and polysilicon) on a single wafer may require the use of different masks and multiple processing steps. A sequence of processing steps is often defined by the masks associated with each step, the final desired configuration of each component formed by the mask, and the material that is being deposited or etched during the step. Different masks, such as a mask used to deposit a polysilicon layer(s) and a mask used to deposit a silicon layer(s) are often used during the same series of processing steps, such as is known in VLSI and CMOS processing.

Figure 56H:
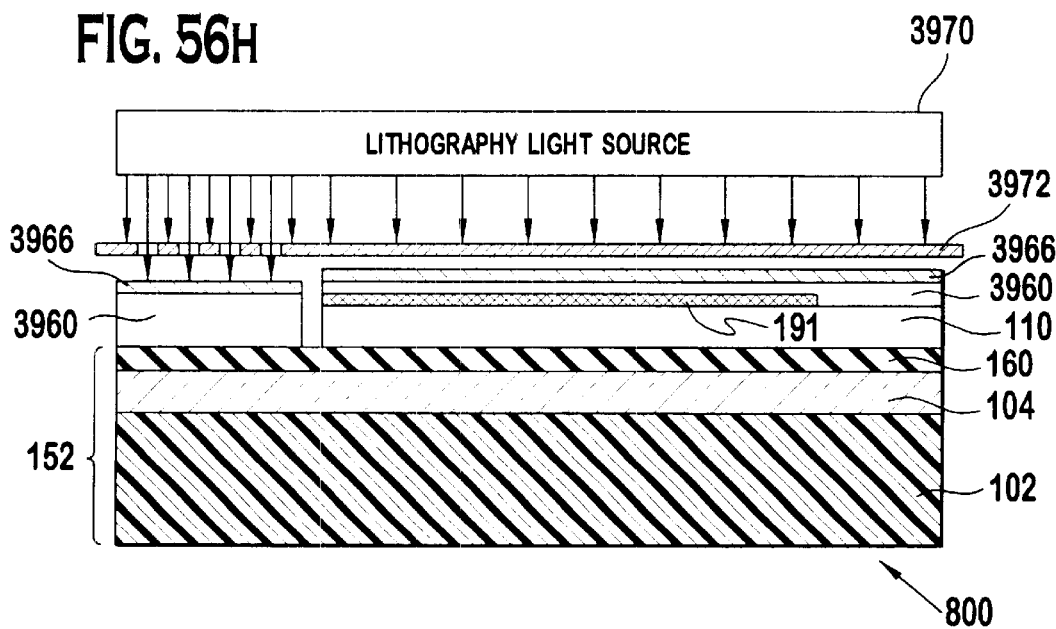
Figure 56I:
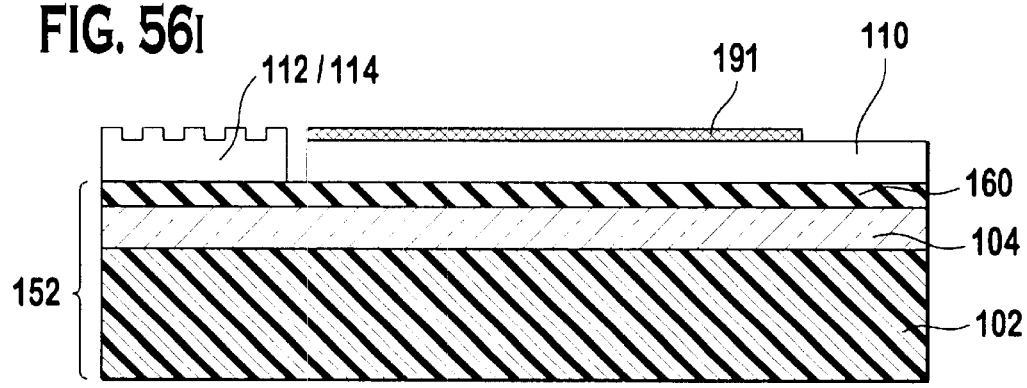

In FIG. 56E, the gate oxide layer 110 above the silicon layer 160 may be removed to provide a suitable surface to deposit the silicon 3960 that will form the light coupler 112 or 114 as shown in FIG. 56I. Optionally, the gate oxide layer may be left while the passive optical waveguide device is undergoing operation. The etching of the gate oxide layer 110 may be performed shortly following the deposition of the gate oxide layer, which occurs prior to the deposition of the polysilicon 3902 on the SOI wafer 152 as shown in FIG. 56A. In FIG. 56F, silicon 3960 is deposited on the silicon layer 160. The deposition of the silicon 3960 may be repeated for a considerable number of steps, depending on the desired height of the light coupler 112 or 114. A deposition source 3964 is used to deposit the silicon 3960 over the entire face of the SOI wafer. Though FIG. 56F illustrates the silicon 3960 being built up by the deposition source 3964, it is envisioned that the silicon 3960 may actually be part of the material of the original SOI wafer 152, wherein the portions of the SOI wafer 152 that surround the silicon are etched at some time prior to FIG. 56F to form the desired silicon configuration on the SOI wafer 152.

The FIG. 56G, the silicon layer 3960 is shown deposited on the upper surface of all of the components of the SOI wafer (including that region that will become the light coupler 112/114 in FIG. 56I) and the upper surface of the polysilicon layer 191. The silicon layer 3960 shown to the left in the figure of FIG. 56F is thicker than the silicon layer 3960 to the right. The series of deposition and etching processes (and the location of the openings in the masks in the photolithography process) provides for this difference in depth. For example, the silicon 3960 in the left in FIG. 56F will eventually become the light coupler 112 or 114 as shown in FIG. 56I, and so a considerable amount of deposition occurs to build up the depth of the silicon light coupler prior to any etching. By comparison, the silicon 3960 to the right in FIG. 56F covers the polysilicon layer 191, and so during each deposition/etching cycle as shown in FIGS. 56F to 56I, the silicon will be etched away to keep the polysilicon layer exposed. The etchants that are used to etch the silicon 3960 typically are selected to not etch the polysilicon 3902 used in the polysilicon layer 191 (see FIGS. 56A to 56D), and vice versa.

The substrate 102 is spun after the photoresist 3966 is deposited to form an even layer of photoresist under the influence of centrifugal force to a substantially uniform thickness. In FIG. 56H, the lithography portion 3970 selectively applies light through a mask 3972 to the upper surface of the photoresist 3966, thereby acting to develop certain regions of the photoresist layer 3966. Depending upon the type of photoresist 3966, the photoresist will harden if light is applied to it and will not harden if light is not applied to it. Alternatively the photoresist 3966 will harden if light is not applied to it and will not harden if light is applied to it. The lithography portion 3970 directs light through openings in the lithography mask 3972 toward the photoresist 3966.

After the photoresist is developed, portions of the photoresist 3966 are then washed from the polysilicon layer 3902, in which the undeveloped portions of the photoresist are substantially washed away while the developed portions of the photoresist layer remain as deposited. The photoresist 3966 that covers the silicon 3960 over the polysilicon layer 191 in FIG. 56H is not exposed, and as such is washed away following each silicon deposition. The developed (and therefore remaining) portions of the photoresist layer 6304 cover portions of the SOI wafer 152. The developed portions of the photoresist layer 6304 thereby allow for selected portions of the silicon to be etched. The etching acts selectively on those uncovered portions of the layer of deposited material 3902 that correspond to the undeveloped (washed away) regions of the photoresist layer. In one embodiment during etching, the developed portions of the photoresist layer 6304 cover, and protect, the covered portions of the layer of silicon 3960 from the etchant.

Following the etching, respective light couplers 112 or 114 as shown in FIG. 56I remain. A grating is shown as being etched in the embodiment of light coupler 112, 114 in FIG. 56I. It is envisioned that a prism, or any of the other light couplers described in the present disclosure may be used. Anisotropic etching may also be used, as appropriate, to etch the silicon at a desired angle as described herein to form, for example, a prism. Alternatively, the light coupler 112 or 114 may be formed separately, and laid proximate the upper surface of the silicon layer. FIGS. 56A to 56I describe the deposition and etching process by which multiple passive optical waveguide devices 800 and multiple light couplers 112, 114 (arranged according to a series of masks) can be fabricated using known SOI and CMOS fabrication techniques. These deposition and etching techniques can be applied to the embodiments of integrated optical circuits 103 that include the light coupler 112, 114 and the passive optical waveguide device 800 as shown in FIGS. 8, 9, 36 and 37. Alternatively, these deposition and etching techniques can be applied to those embodiments of integrated optical/electronic circuits 103 that include the light coupler 112, 114, the active optical waveguide devices 150, the passive optical waveguide devices 800, and the active electronic device 5101 as shown in FIGS. 26 to 35. The deposition of the gate electrodes 120 of the active optical waveguide devices 150 and the active electronic device 5101 also require doping of the polysilicon by ion implantation.

Figure 57:
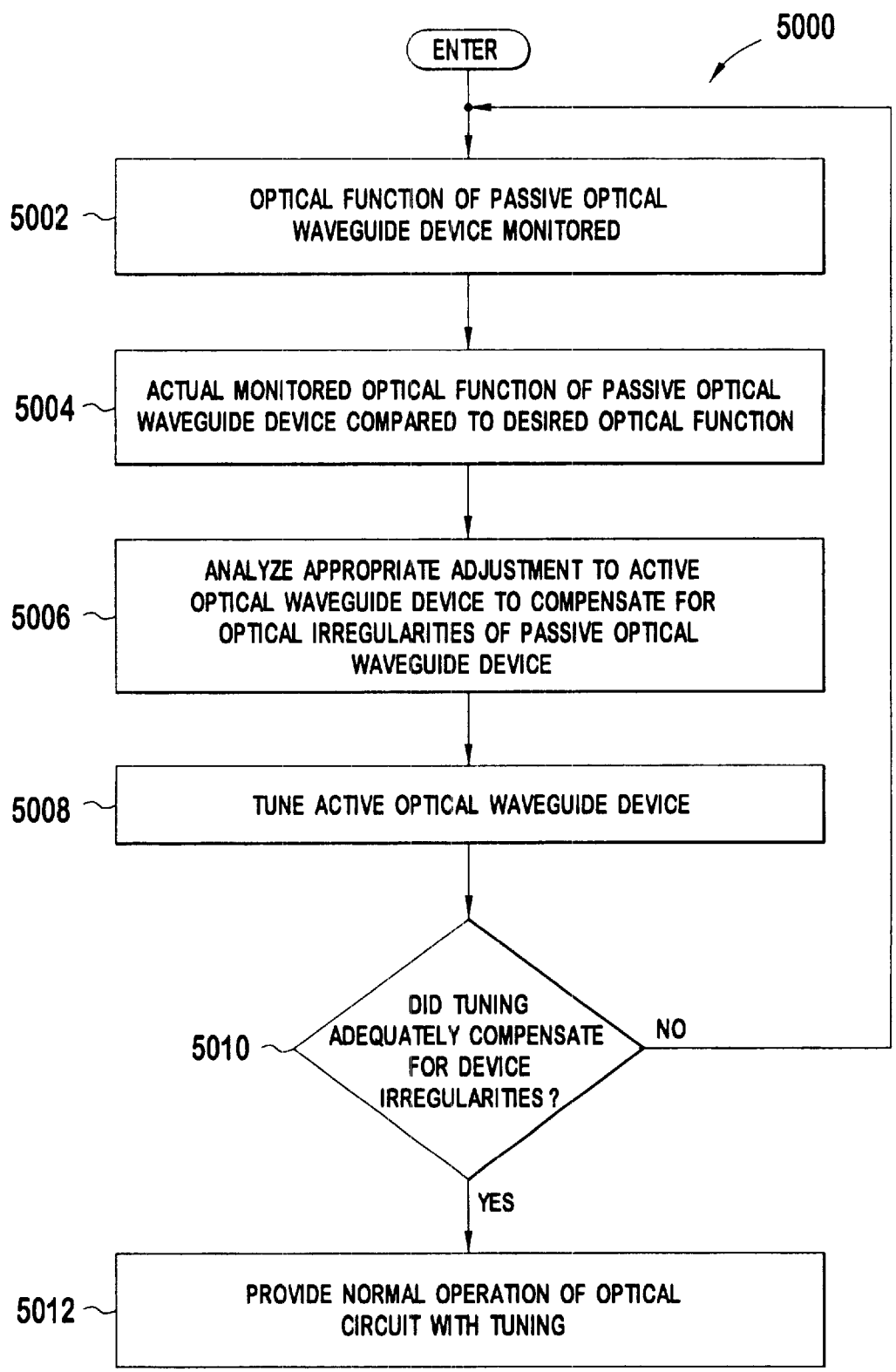
FIG. 57 shows one embodiment of a tuning method in which an active optical waveguide device tunes light output from a passive optical waveguide device.

FIG. 57 discloses one embodiment of method that is performed by the controller 201 associated with the active optical waveguide device 150 (as shown in FIG. 7B), during normal operation of an optical circuit in which an active optical waveguide device 150 tunes an optical function of a passive optical waveguide device 800 within an optical circuit. FIGS. 51 and 52 illustrate one embodiment of optical circuit 5180 in which one or more active optical waveguide devices 150 are arranged relative to one or more passive optical waveguide devices 800 to provide some desired optical function. Though the concepts described herein provide for fabrication of active and passive optical waveguide devices that act precisely, slight production and design irregularities may exist that cause the passive optical waveguide device to deviate from the desired optical function. Additionally, as passive optical waveguide devices age and/or degrade, their optical functions or characteristics often change slightly. The active optical waveguide device 150 can compensate for the degradation, fabrication errors, and other optical function irregularities to improve the optical operation of the optical circuit 5180 including the passive optical waveguide 800, as well as maintain the precise optical functionality of the optical circuit including the passive optical waveguide device for an extended period. The active optical waveguide device 150, whose optical function is associated with the optical function of the passive optical waveguide device 800, may therefore "tune" the optical function of the passive optical waveguide device.

While this description describes the tuning of the optical function of a single passive optical waveguide device 800 by a single active optical waveguide device 150, it is to be understood that one or a plurality of active optical waveguide devices can be used to tune the optical function of one or a plurality of passive optical waveguide devices 800 in a similar manner to as described herein. Such tuning may be used, for example, to compensate for degradation of device performance due to aging. An active optical waveguide device that tunes the optical function of the passive optical waveguide device 800 may be located optically upstream or optically downstream of the passive optical waveguide device. Additionally, the active optical waveguide device 150 can be adjacent to, or have other devices located between it and, the passive optical waveguide device 800.

The tuning method 5000 of the active optical waveguide device 150 that tunes the optical function of the passive optical waveguide device 800 starts with step 5002, in which the optical operation of the passive optical waveguide device is precisely measured. This optical measurement may be provided by using a separate testing device that is temporarily attached to the passive optical waveguide device that measures input versus output of the passive optical waveguide device. Alternatively, the optical function of the passive optical waveguide device may be tested by monitoring the optical circuit including the passive optical waveguide device when the optical circuit is connected with a functioning optical input providing valid optical signals, and considering the output optical operation of the passive optical waveguide device.

The tuning method 5000 continues to step 5004 where the controller 201, or the human tester, compares the actual monitored optical function results to the desired optical function results. There are a wide variety of optical functions that may be monitored including, but not limited to, average light intensity, frequency, maximum or minimum light intensity, optical step drop-off rates, etc. The tuning method 5000 continues to step 5006 in which the controller 201, or the human tester, analyzes the compared optical function results from step 5004, and determines what adjustment should be performed by that active optical waveguide device 150 (or another active optical waveguide device) to effectively tune the optical function of the passive optical waveguide device 150.

The tuning method 5000 continues to step 5008 in which the appropriate active optical waveguide device is adjusted, during normal operation, to tune the optical function of the passive optical waveguide device within the complete optical circuit 5180 as shown in FIGS. 51 and 52. Many optical functions or parameters may be tuned in a large variety of passive optical waveguide devices 800. However, to provide an example of tuning an optical function, consider if the optical signal strength of the passive optical waveguide device 800 is consistently too weak by a constant percentage of optical intensity. An associated active optical waveguide device 150 (either upstream or downstream of the passive optical waveguide device) that is under the control of the controller 201, may perform the necessary optical function, such as optical amplification, and uniformly "boost" the optical signal intensity output by a prescribed amount during normal operation of the passive optical waveguide device. The output signal from the active optical waveguide device is therefore biased to be different from the normal output signal from the active optical waveguide device to compensate for device irregularities of the passive optical waveguide device.

The tuning method 5000 then continues to decision step 5010 in which the controller 201, or the human tester, determines whether the tuning provided in step 5008 adequately compensated for the optical function irregularities of the passive optical waveguide device analyzed in step 5006. If the answer to decision step 5010 is no, then the method continues loops to step 5002 as described above. If the answer to decision step 5010 is yes, then the controller 201, or human operator, provides normal operation of the optical circuit in the tuned configuration.

The tuning method 5000 may be repeated as frequently as desired to tune the optical signal of the passive optical waveguide device 800 to provide the desired optical functions within the complete optical circuit 5180 as shown in FIGS. 51 and 52. The disclosure therefore provides a description not only of how to simultaneously fabricate active optical waveguide devices 150 and passive optical waveguide devices 800 on a single wafer 152 to form a variety of optical circuits 5180, but also how to tune the optical output of passive optical waveguide devices 800 using optically associated active optical waveguide devices 150.

While the principles of the invention have been described above in connection with the specific apparatus and associated method, it is to be clearly understood that this description is made only by way of example and not as a limitation on the scope of the invention.

What is claimed is:

1. A device that provides for the transmission of light through a first optical waveguide and a second optical waveguide, comprising:

a semiconductor layer including at least one etched portion between first and second unetched portions;

the first optical waveguide including the first unetched portion and a first total internal reflection (TIR) boundary between the first unetched portion and the at least one etched portion;

the second optical waveguide including the second unetched portion and a second TIR boundary between the at least one unetched portion and the second etched portion; and a polysilicon coupler formed at least in part from polysilicon and that at least partially overlaps the etched portion of the semiconductor layer, wherein the polysilicon coupler optically couples the first optical waveguide and the second optical waveguide, wherein light can flow from the first optical waveguide via the polysilicon coupler portion to the second optical waveguide.

2. The device of claim 1, wherein a first portion of a gate oxide layer is deposited above a portion of the first optical waveguide, and a second portion of the gate oxide layer is deposited above a portion of the second optical waveguide, wherein the polysilicon coupler portion is deposited on the first portion of the gate oxide and the second portion of the gate oxide.

3. The device of claim 1, wherein the semiconductor layer is an upper silicon layer of a single Silicon-On-Insulator (SOI) wafer, wherein the SOI wafer further includes an optical insulator and a substrate, wherein the optical insulator is located between the upper silicon layer and the substrate.

4. The device of claim 3, wherein the substrate includes one or more materials from the group of silicon, diamond, glass, or sapphire.

5. The device of claim 1, wherein the polysilicon coupler includes only pure polysilicon.

6. The device of claim 1, wherein the polysilicon coupler includes polySiGe.

7. A method for transmitting light between a first optical waveguide and a second optical waveguide, comprising:

providing a semiconductor layer including at least one etched portion between first and second unetched portions, wherein the first optical waveguide including the first unetched portion and the second optical waveguide including the second unetched portion;

establishing a first total internal reflection (TIR) boundary between the first unetched portion and the at least one etched portion;

establishing a second TIR boundary between the at least one unetched portion and the second etched portion;

optically coupling the first optical waveguide and the second optical waveguide with a polysilicon coupler formed at least in part from polysilicon, wherein the polysilicon coupler at least partially overlaps the etched portion of the semiconductor layer; and flowing light from the first optical waveguide, via the polysilicon coupler portion, to the second optical waveguide.

* * * * *